(12) United States Patent
Yoon et al.

(10) Patent No.: US 12,356,565 B2
(45) Date of Patent: Jul. 8, 2025

(54) DISPLAY DEVICE INCLUDING FLEXIBLE DISPLAY AND REAR COVER

(71) Applicant: LG ELECTRONICS INC., Seoul (KR)

(72) Inventors: Jihyo Yoon, Seoul (KR); Insu Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 230 days.

(21) Appl. No.: 18/323,104

(22) Filed: May 24, 2023

(65) Prior Publication Data

US 2023/0397350 A1 Dec. 7, 2023

(30) Foreign Application Priority Data

Jun. 3, 2022 (KR) .................. 10-2022-0067926
Aug. 29, 2022 (KR) .................. 10-2022-0108351

(51) Int. Cl.
*H05K 5/02* (2006.01)
*H10K 77/10* (2023.01)
*H10K 102/00* (2023.01)

(52) U.S. Cl.
CPC ......... *H05K 5/0217* (2013.01); *H10K 77/111* (2023.02); *H10K 2102/311* (2023.02)

(58) Field of Classification Search
CPC .... G06F 1/1601; G06F 1/1652; G06F 1/1612; G06F 1/1605; G06F 1/1641; G06F 1/1681; G06F 1/181; G06F 1/20; G06F 1/16; G06F 1/1607; G06F 1/1624; G06F 1/1656; H05K 5/02; H05K 5/0017; H05K 5/0217; H05K 5/0226; H05K 5/03
See application file for complete search history.

(56) References Cited

U.S. PATENT DOCUMENTS 10,310,311 B2 * 6/2019 Jung .................. G06F 1/1601
10,383,238 B2 * 8/2019 Yun .......................... H04N 5/64
(Continued)

FOREIGN PATENT DOCUMENTS

EP           3058561        6/2018
KR    10-2015-0092428       8/2015
(Continued)

OTHER PUBLICATIONS

Korean Intellectual Property Office Application No. 10-2022-0067926, Notice of Allowance dated Nov. 30, 2024, 2 pages.
(Continued)

*Primary Examiner* — Abhishek M Rathod
(74) *Attorney, Agent, or Firm* — LEE, HONG, DEGERMAN, KANG & WAIMEY

(57) ABSTRACT

A display device is provided. The display device includes: a flexible display panel; a bottom cover disposed at a rear of the display panel and coupled to the display panel; a driving module disposed at a rear of the bottom cover and including a moving block that makes a reciprocal movement; a wing bracket fixed to the rear of the bottom cover at a position adjacent to the driving module; and a wing elongated with a first end fixed to the moving block and a second end coupled to the bottom cover, the wing pivotally connected to the wing bracket at a position between the first end and the second end.

13 Claims, 52 Drawing Sheets

(56) References Cited

U.S. PATENT DOCUMENTS

| 12,019,323 | B2* | 6/2024 | Kang | G02F 1/133314 |
|---|---|---|---|---|
| 2015/0145837 | A1* | 5/2015 | Park | H04N 21/41265 |
| | | | | 345/184 |
| 2015/0192952 | A1* | 7/2015 | Jung | G06F 1/1652 |
| | | | | 361/747 |
| 2017/0124937 | A1* | 5/2017 | Kim | G09G 3/2096 |
| 2017/0295655 | A1* | 10/2017 | Jung | G06F 1/20 |
| 2020/0333846 | A1* | 10/2020 | Jan | G06F 1/1652 |

FOREIGN PATENT DOCUMENTS

| KR | 10-2015-0122511 | 11/2015 |
|---|---|---|
| KR | 10-2015-0136429 | 12/2015 |
| KR | 10-2187746 | 12/2020 |

OTHER PUBLICATIONS

European Patent Office Application Serial No. 23176066.1, Search Report dated Oct. 31, 2023, 7 pages.
Korean Intellectual Property Office Application No. 10-2022-0067926, Office Action dated May 27, 2024, 4 pages.

* cited by examiner

DISPLAY DEVICE INCLUDING FLEXIBLE DISPLAY AND REAR COVER

CROSS-REFERENCE TO RELATED APPLICATIONS

Pursuant to 35 U.S.C. § 119(a), this application claims the benefit of earlier filing date and right of priority to Korean Patent Application Nos. 10-2022-0067926, filed on Jun. 3, 2022, and 10-2022-0108351, filed on Aug. 29, 2022, the contents of which are all hereby incorporated by reference herein in their entireties.

BACKGROUND OF THE INVENTION

1. Field of the Invention

The following description relates to a display device, and more particularly to a display device capable of changing a curvature of a display panel.

2. Description of the Related Art

With the development of the information society, there have been growing demands for various types of display devices, and in order to meet these demands, various display devices, such as a liquid crystal display (LCD), an electroluminescent display (ELD), a vacuum fluorescent display (VFD), an organic light emitting diode (OLED) panel, etc., have been studied and used recently.

Among these display devices, the OLED panel may display images by depositing a self light-emitting organic layer on a substrate on which transparent electrodes are formed. The OLED panel is thin and flexible, and active research has been conducted on the structural characteristics of a display device having the OLED panel.

SUMMARY OF THE INVENTION

It is an objective of the present disclosure to solve the above and other problems.

It is another objective of the present disclosure to provide a structure in which a curvature of a display panel may be freely changed.

It is yet another objective of the present disclosure to provide a mechanism in which a curvature of a display panel may be freely changed.

It is yet another objective of the present disclosure to provide a structure in which a display panel may be curved with a constant curvature.

In accordance with an aspect of the present disclosure, the above and other objectives can be accomplished by providing a display device including: a flexible display panel; a flexible rear cover disposed at a rear of the display panel and coupled to the display panel; a driving module disposed at a rear of the rear cover and including a moving block that makes a reciprocal movement; a wing bracket fixed to the rear of the rear cover at a position adjacent to the driving module; and a wing elongated with a first end fixed to the moving block and a second end coupled to the rear cover, the wing pivotally connected to the wing bracket at a position between the first end and the second end.

Effects of the Invention

According to at least one of the embodiments of the present disclosure, a structure may be provided in which a curvature of a display panel may be freely changed.

According to at least one of the embodiments of the present disclosure, a mechanism may be provided in which a curvature of a display panel may be freely changed.

According to at least one of the embodiments of the present disclosure, a structure may be provided in which a display panel may be curved with a constant curvature.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

DETAILED DESCRIPTION OF THE PREFERRED EMBODIMENTS

Figure 1:
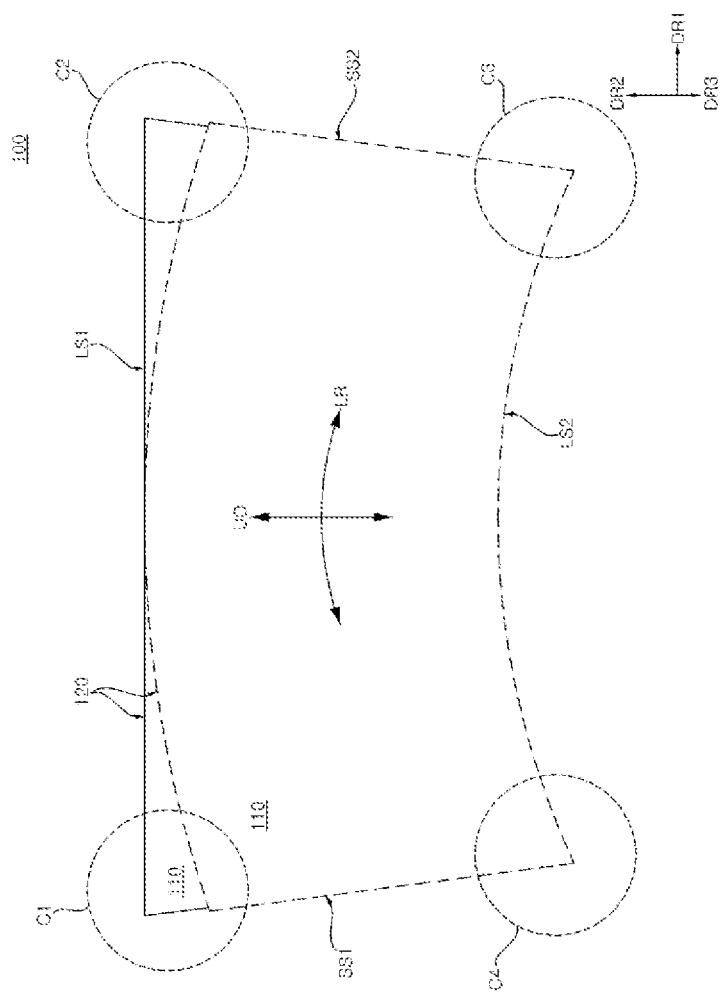
FIGS. 1 to 52 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The terms "module" and "unit" for elements used in the following description are given simply in view of the ease of the description, and do not have a distinguishing meaning or role. It will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

It should be understood that the terms "comprise", 'include", "have", etc. when used in this specification, specify the presence of stated features, integers, steps, operations, elements, components, or combinations of them but do not preclude the presence or addition of one or more other features, integers, steps, operations, elements, components, or combinations thereof.

Hereinafter, a display panel will be described by using an Organic Light Emitting Diode (OLED) as an example, but a display panel applicable to the present disclosure is not limited to the OLED panel.

In addition, in the following description, the display device may include a first long side LS1, a second long side LS2 opposite the first long side LS1, a first short side SS1 adjacent to one end of each of the first long side LS1 and the second long side LS2, and a second short side SS2 opposite the first short side SS1.

Here, an area of the first short side SS1 may be referred to as a first side area; an area of the second short side SS2 may be referred to as a second side area opposite to the first side area; an area of the first long side LS1 may be referred to as a third side area adjacent to the first side area and the second side area and disposed between the first side area and the second side area; and an area of the second long side LS2 may be referred to as a fourth side area adjacent to the first side area and the second side area, disposed between the first side area and the second side area, and opposite to the third side area.

For convenience of explanation, it is illustrated and described that the first and second long sides LS1 and LS2 are longer than the first and second short sides SS1 and SS2, but it is also possible that the lengths of the first and second long sides LS1 and LS2 may be approximately equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. Further, the third direction DR3 may be referred to as a vertical direction.

A side or a surface, on which the display device displays an image, may be referred to as a front side or a front surface. When the display device displays an image, a side or a surface, at which the image cannot be observed, may be referred to as a rear side or a rear surface. When the display device is viewed from the front side or the front surface, the first long side LS1 may be referred to as an upper side or an upper surface, and the second long side LS2 may be referred to as a lower side or a lower surface. Likewise, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

Referring to FIG. 1, a display panel 110 may be coupled to a plate 120. The plate 120 may be flexible. The plate 120 may be referred to as a flexible plate 120, a frame 120, or a module cover 120. The display panel 110 may be disposed on a front side or a front surface of the plate 120. The display panel 110 may be flexible. For example, the display panel 110 may be an OLED panel.

The display panel 110 may be provided on a front surface of a display device 100 and may display an image. The display panel 110 may divide the image into a plurality of pixels and may output the image while controlling color, brightness, and chroma of the respective pixels. The display panel 110 may generate light corresponding to red, green, or blue color in response to a control signal.

The display device 100 may have a variable curvature. The left and right sides of the display device 100 may move forward. For example, when an image is viewed from the front side of the display device 100, the display device 100 may be curved concavely. In this case, the plate 120 may be curved with the same curvature as the display panel 110. Alternatively, the display panel 110 may be curved corresponding to the curvature of the plate 120.

Figure 2:
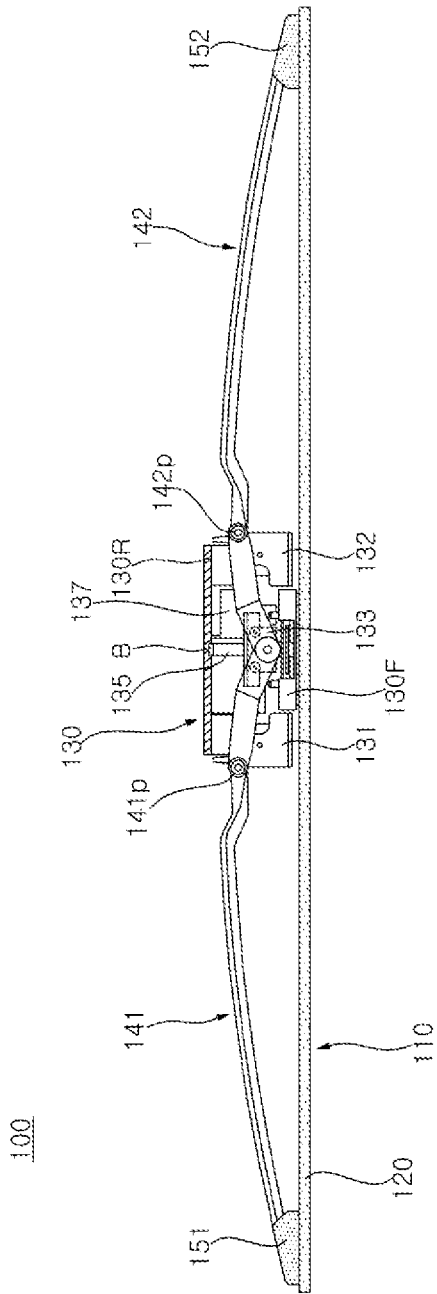
Figure 3:
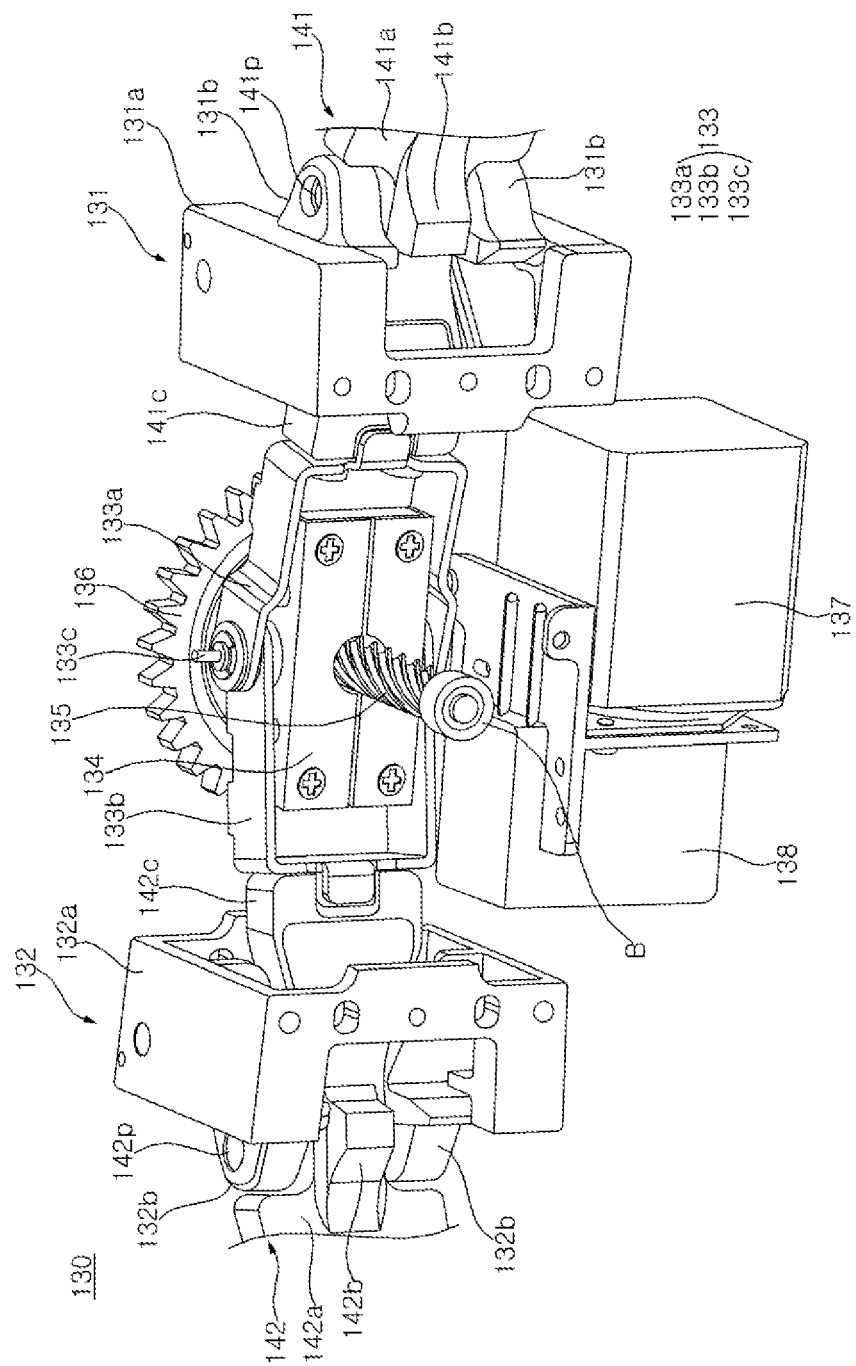

Referring to FIGS. 2 and 3, the plate 120 may be coupled to the rear of the display panel 110. The plate 120 may support the display panel 110 at the rear of the display panel 110. The plate 120 may have a shape corresponding to the display panel 110.

A driving module 130 may be coupled to the rear of the plate 120. A front bracket 130F, a rear bracket 130R, and wing brackets 131 and 132 may be disposed at the rear of the plate 120. The front bracket 130F may be coupled or fixed to a rear surface of the plate 120. The rear bracket 130R may be disposed at the rear of the front bracket 130F, may be spaced apart from the front bracket 130F, and may face the front bracket 130F.

The wing brackets 131 and 132 may include bracket frames 131a and 132a and wing holders 131b and 132b. The bracket frames 131a and 132a may be in the shape of a rectangular box. The wing holders 131b and 132b may be formed on one side of the bracket frames 131a and 132a. The wing holders 131b and 132b may protrude from one surface of the bracket frames 131a and 132a. The wing holders 131b and 132b may form a pair. The pair of wing holders 131b and 132b may be disposed opposite each other.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F and/or the rear bracket 130R and may be disposed opposite the second wing bracket 132 with respect to the front bracket 130F. The second wing bracket 132 may also be coupled or fixed to the front bracket 130F and/or the rear bracket 130R.

Wings 141 and 142 may include blades 141a and 142a, necks 141b and 142b, and levers 141c and 142c. For example, the wings 141 and 142 may be made of metal. In another example, the wings 141 and 142 may be made of an aluminum alloy. The blades 141a and 142a may be elongated plates and may include ribs for providing rigidity. The levers 141c and 142c and the necks 141b and 142b may be formed at one end of the blades 141a and 142a. The necks 141b and 142b, disposed between the levers 141c and 142c and the blades 141*a* and 142*a*, may connect the levers 141*c* and 142*c* and the blades 141*a* and 142*a*. A width of the necks 141*b* and 142*b* may be smaller than a width of the levers 141*c* and 142*c*, and a width of the levers 141*c* and 142*c* may be smaller than a width of the blades 141*a* and 142*a*. Pivot shafts 141*p* and 142*p* may be formed at the necks 141*b* and 142*b*. The pivot shafts 141*p* and 142*p* may be inserted into the wing holders 131*b* and 132*b*. The wings 141 and 142 may pivot about the pivot shafts 141*p* and 142*p* and the wing holders 131*b* and 132*b*.

The first wing 141 may be rotatably or pivotally coupled to the first wing bracket 131, and the second wing 142 may be rotatably or pivotally coupled to the second wing bracket 132. The first wing 141 may be symmetric to the second wing 142 with respect to a driving unit 130.

Sliding mounts 151 and 152 may be coupled or fixed to a rear side or a rear surface of the plate 120. A first sliding mount 151 may be disposed adjacent to a left side of the plate 120, and a second sliding mount 152 may be disposed adjacent to a right side of the plate 120. A distal end of the first wing 141 may be movably coupled to the first sliding mount 151. A distal end of the second wing 142 may be movably coupled to the second sliding mount 152.

A flip frame 133 may be disposed between the lever 141*c* of the first wing 141 and the lever 142*c* of the second wing 142 and may be coupled to the levers 141*c* and 142*c*. For example, the flip frame 133 may be made of metal. The flip frame 133 may include a first frame 133*a* and a second frame 133*b*. For example, the first frame 133*a* may have a U-shape, and the second frame 133*b* may have a U-shape. The first frame 133*a* may be pivotally connected to the second frame 133*b*. A pivot pin 133*c* may pass through the first frame 133*a* and the second frame 133*b* to connect the first frame 133*a* and the second frame 133*b*. The first frame 133*a* may pivot with respect to the second frame 133*b*, and the second frame 133*b* may pivot with respect to the first frame 133*a*. The first frame 133*a* may be fixed or coupled to the lever 141*c* of the first wing 141, and the second frame 133*b* may be fixed or coupled to the lever 142*c* of the second wing 142.

A moving block 134 may be disposed inside the flip frame 133. The moving block 134 may be disposed between the first frame 133*a* and the second frame 133*b* of the flip frame 133.

A lead screw 135 may be inserted into the moving block 134. The moving block 134 may be moved on the lead screw 135 by rotation of the lead screw 135. By rotation and reverse rotation of the lead screw 135, the moving block 134 may make a reciprocal movement along the lead screw 135.

The lead screw 135 may be coupled to the driving gear 136 and may rotate together with the driving gear 136. The driving gear 136 may rotate while facing a rear surface of the plate 120 (see FIG. 2). The lead screw 135 may be a rotating shaft of the driving gear 136. A bearing B may be coupled to one end and/or both ends of the lead screw 135. The lead screw 135 may rotate with the one end being inserted into a front bearing B and the other end being inserted into a rear bearing B. For example, the lead screw 135 may be press-fit into the front bearing B and the rear bearing B.

A motor 137 may be disposed under the moving block 134. The motor 137 may provide torque. A gear box 138 may transmit the torque of the motor 137 to the driving gear 136.

Figure 4:
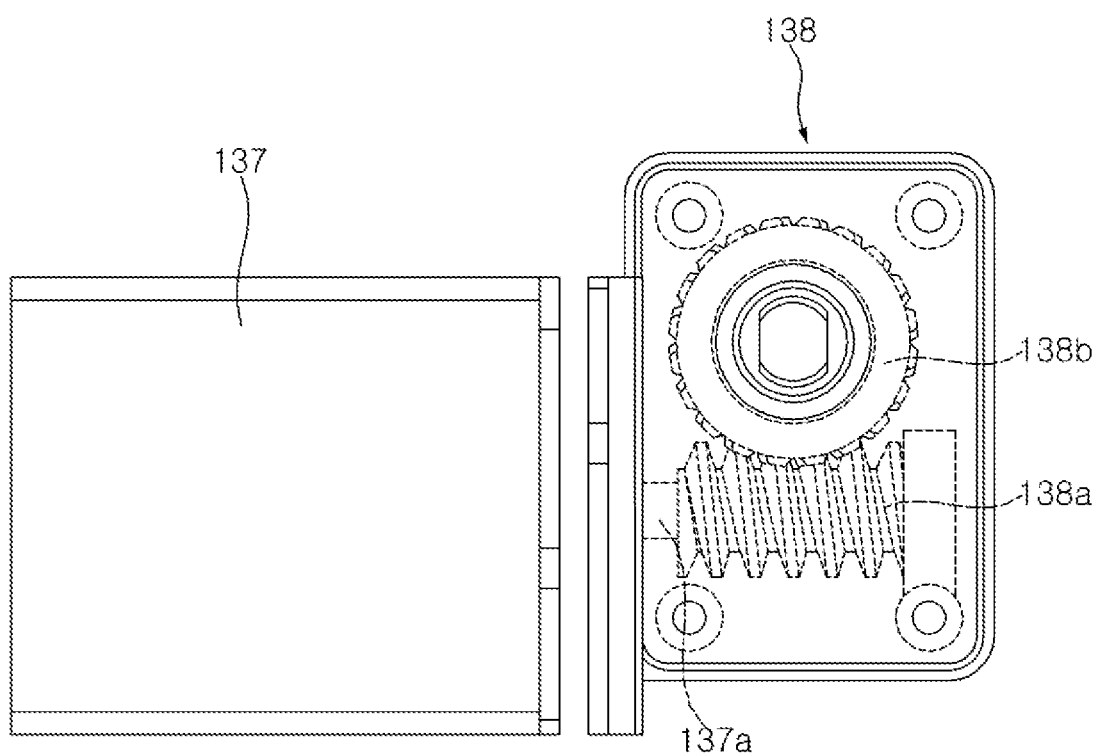
Figure 5:
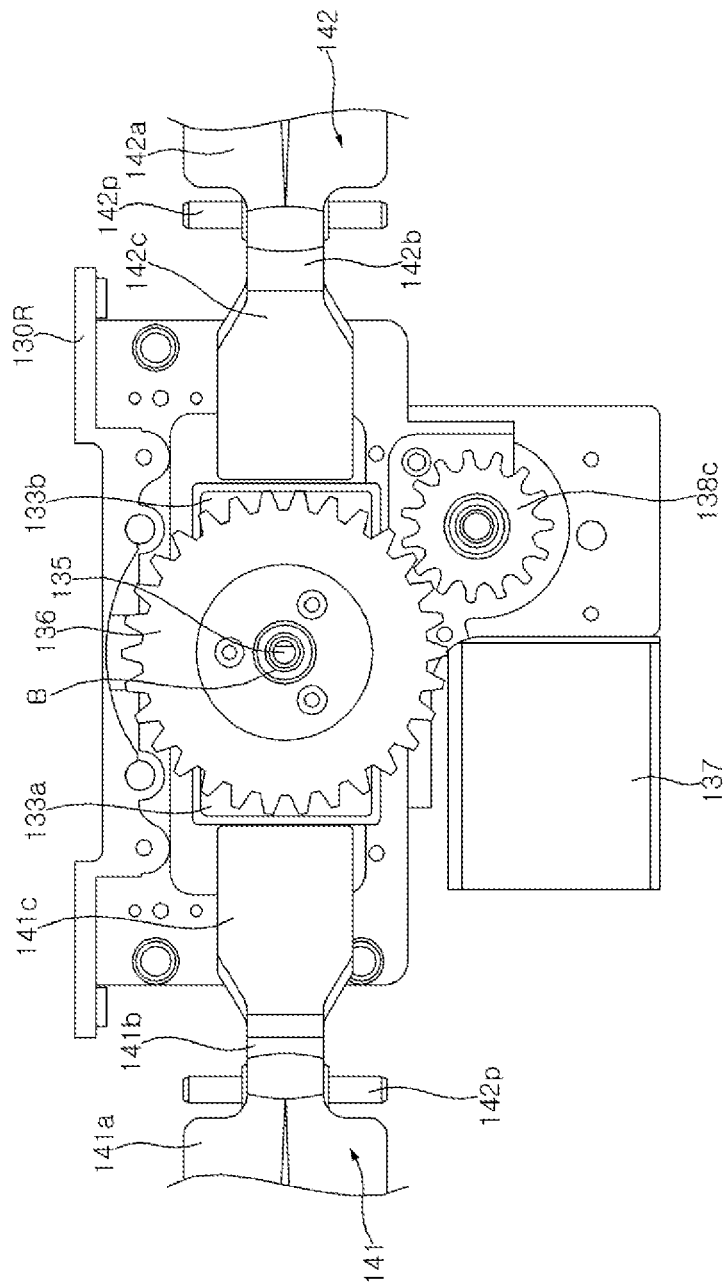

Referring to FIGS. 4 and 5, a first gear 138*a* may be fixed to a rotating shaft 137*a* of the motor 137 to rotate together with the rotating shaft 137*a* of the motor 137. For example, the first gear 138*a* may be a worm. A second gear 138*b* may be engaged with the first gear 138*a*. For example, the second gear 138 may be a worm gear.

The first gear 138*a* and the second gear 138*b* may be disposed in the gear box 138. A transmission gear 138*c* may be disposed outside the gear box 138. The transmission gear 138*c* may be fixed to the rotating shaft 137*a* of the second gear 138*b* and may rotate together with the second gear 138*b*. The transmission gear 138*c* may be engaged with the driving gear 136.

The lead screw 135 may be a rotating shaft of the driving gear 136. The driving gear 136 may be fixed to the lead screw 15. The driving gear 136 may be coupled to the lead screw 135 by a pin.

Figure 6:
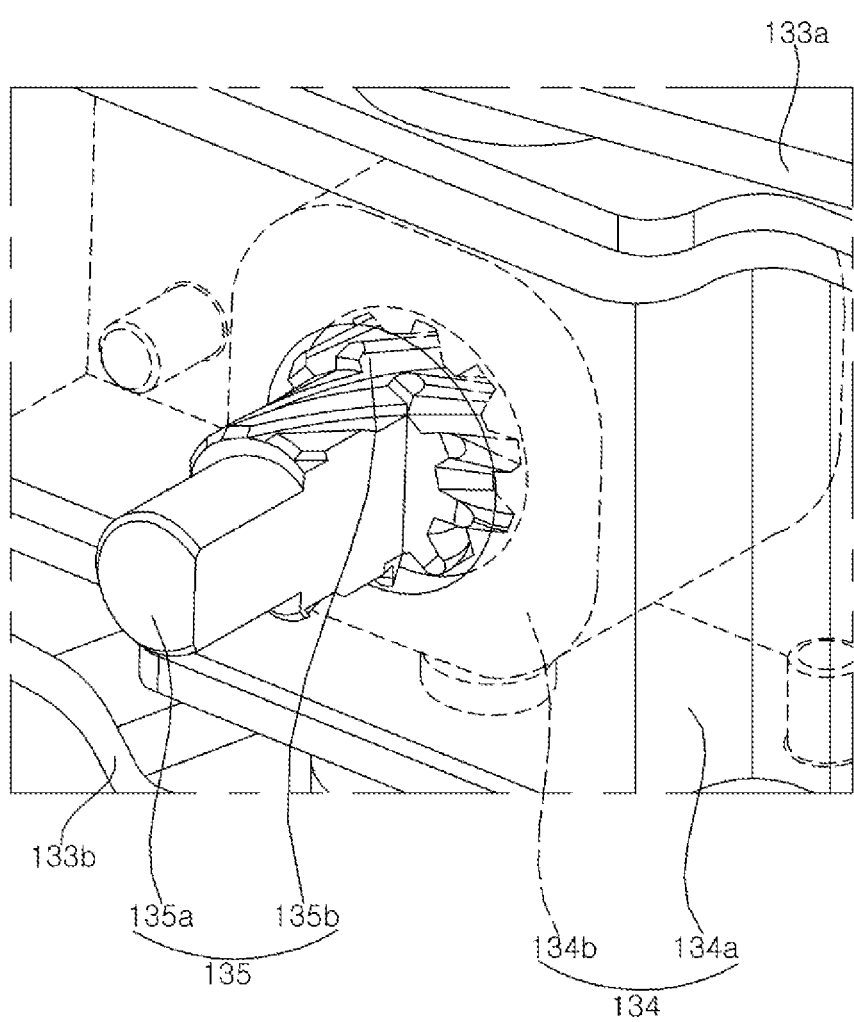

Referring to FIG. 6, the lead screw 135 may include a shaft body 135*a* and a screw 135*b*. The shaft body 135*a* may be in the shape of an elongated cylinder, and the screw 135*b* may be formed on an outer circumferential surface of the shaft body 135*a*. The moving block 134 may include a moving body 134*a* and a sliding block 134*b*. For example, the moving body 134*a* may be made of metal, and the sliding block 134*b* may be made of a synthetic resin. The sliding block 134*b* may be disposed inside the moving body 134*a*. The sliding block 134*b* may be screw-coupled to the lead screw 135.

The lead screw 135 may be inserted into the sliding block 134*b*. The sliding block 134*b* may be moved on the lead screw 135 by the rotation of the lead screw 135. Clearance may be formed between an inner circumferential surface of the sliding block 134*b* and the screw 135*b* of the lead screw 135, thereby preventing the moving block 134 from being caught or locked while moving on the lead screw 135.

Figure 7:
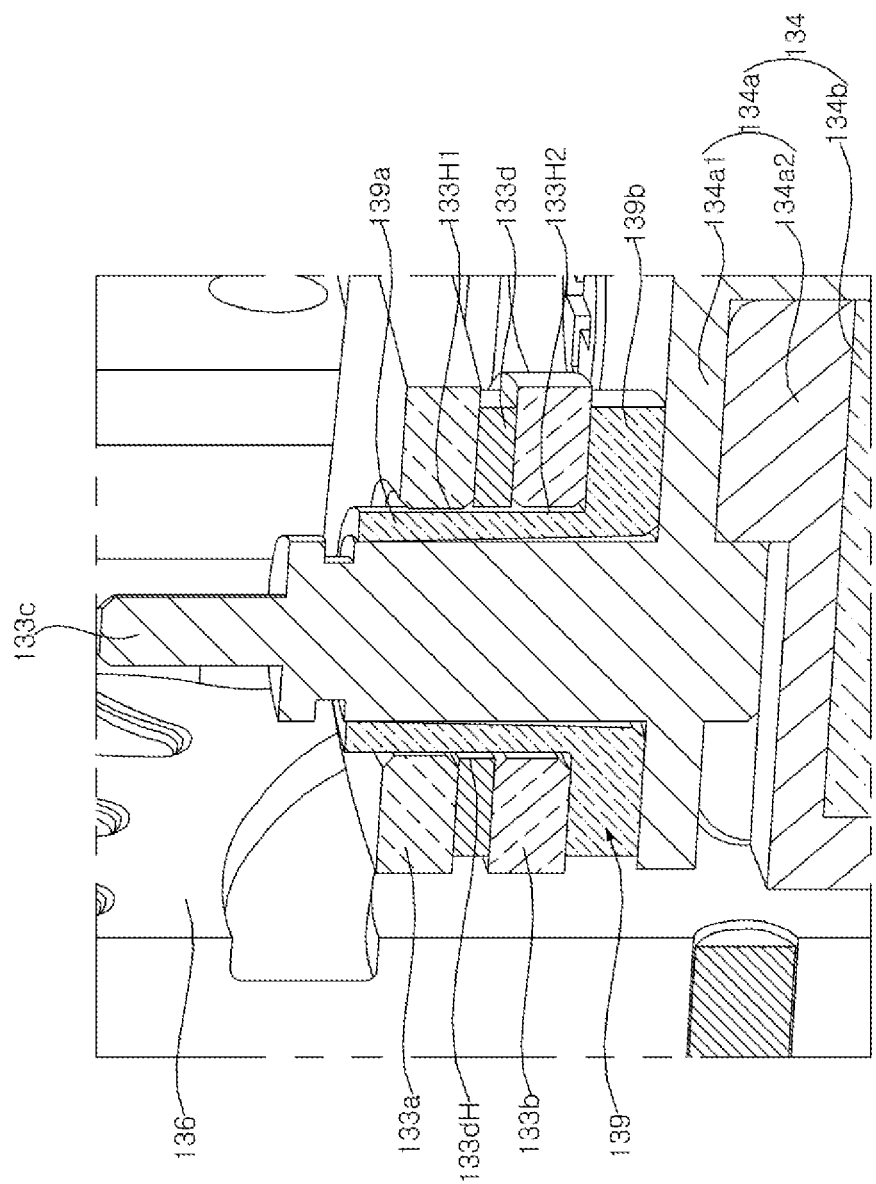

Referring to FIG. 7, the moving body 134*a* may include an outer part 134*a*1 and an inner part 134*a*2. The outer part 134*a*1 may form an outer surface of the moving body 134*a*. The inner part 134*a*2 may be coupled to the inside of the outer part 134*a*1. For example, the outer part 134*a*1 may be a U-shaped metal plate, and the inner part 134*a*2 may be a metal shell having an inner receiving space. The sliding block 134*b* may be coupled to the inside of the inner part 134*a*2.

A pivot pin 133*c* may extend by protruding from the outer part 134*a*1 of the moving body 134*a*. The first frame 133*a* and the second frame 133*b* of the flip frame 133 may include holes 133H1 and 133H2. The pivot pin 133*c* may be inserted into the hole 133H2 of the second frame 133*b* and the hole 133H1 of the first frame 133*a*. A disc 133*d* may be disposed between the first frame 133*a* and the second frame 133*b*, and the pivot pin 133*c* may be inserted into a hole 133*d*H of the disk 133*d*. For example, the disk 133*d* may be made of a material having high durability and low friction characteristics.

An intermediate member 139 may be disposed between the moving body 134*a*, the pivot pin 133*c*, and the flip frame 133. The intermediate member 139 may cover an upper surface of the moving body 134*a* and an outer surface of the pivot pin 133*c*. The intermediate member 139 may be referred to as a low friction member 139 or a lubricating member 139. In addition, the intermediate member 139 may be referred to as a skin member 139.

The intermediate member 139 may include a body part 139*a* and a flange part 139*b*. The body part 139*a* may have a cylindrical shape. The pivot pin 133*c* may be inserted into the body part 139*a*. The body part 139*a* may make contact with the outer surface of the pivot pin 133*c*, and the flange part 139*b* may make contact with the upper surface of the moving body 134*a*. The intermediate member 139 may be made of a synthetic resin having low friction characteristics.

The intermediate member 139 may be made of a low friction material. For example, the intermediate member 139 may be made of polyoxymethylene (POM, acetal homopolymer). The first frame 133a and the second frame 133b of the flip frame 133 may move about the pivot pin 133c while making contact with or rubbing against the intermediate member 139.

The intermediate member 139 may fill a gap between the hole 133H1 of the first frame 133a of the flip frame 133 and the pivot pin 133c. The intermediate member 139 may fill a gap between the hole 133H2 of the second frame 133b of the flip frame 133 and the pivot pin 133c. The second frame 133b of the flip frame 133 may be placed on the intermediate member 139. Accordingly, the pivot pin 133c may transmit force to the flip frame 133 without causing noise or vibrations.

Figure 8:
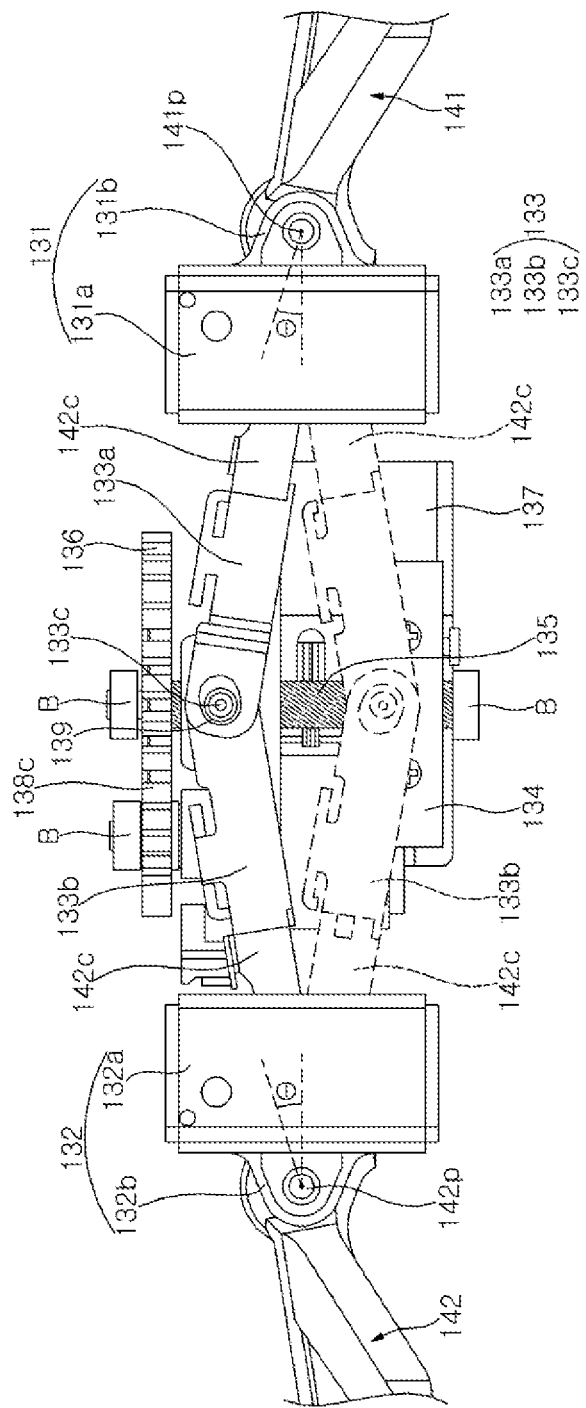
Figure 9:
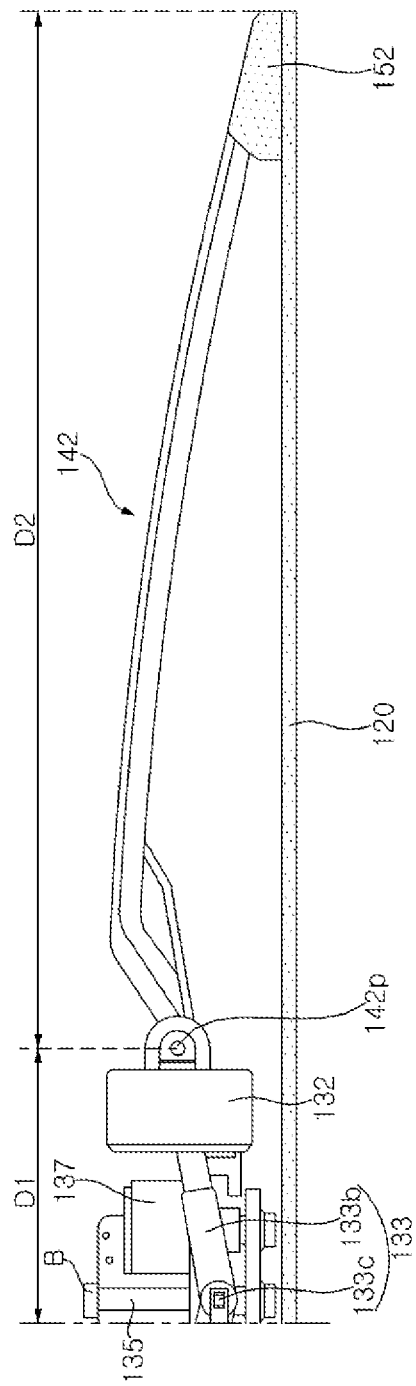

Referring to FIGS. 8 and 9, when the lead screw 135 rotates, the moving block 134 and the flip frame 133 may move on the lead screw 135. The flip frame 133 may make a reciprocal movement in a longitudinal direction of the lead screw 135. The movement of the flip frame 133 allows the first wing 141 and/or the second wing 142 to pivot about the pivot shafts 141P and 142P.

A first distance D1 from the pivot pin 133c to the pivot shafts 141P and 142P may be smaller than a second distance D2 from the pivot shafts 141P and 142P to the sliding mounts 151 and 152. For example, the first distance D1 may be one-fourth of the second distance D2. The levers 141c and 142c of the wings 141 and 142 are fixed to the flip frame 133, and the flip frame 133 moves together with the pivot pin 133c during movement of the pivot pin 133c, such that a driving force of the moving block 134 moving on the lead screw 135 may be transmitted efficiently to the levers 141c and 142c of the wings 141 and 142 via the flip frame 133.

In addition, as the levers 141c and 142c of the wings 141 and 142 are fixed to the flip frame 133 and move together with the flip frame 133, the first distance D1 increases such that less force is required to drive the wings 141 and 142, thereby increasing power transmission efficiency of the driving unit 130 and reducing power consumption of the motor 137.

Figure 10:
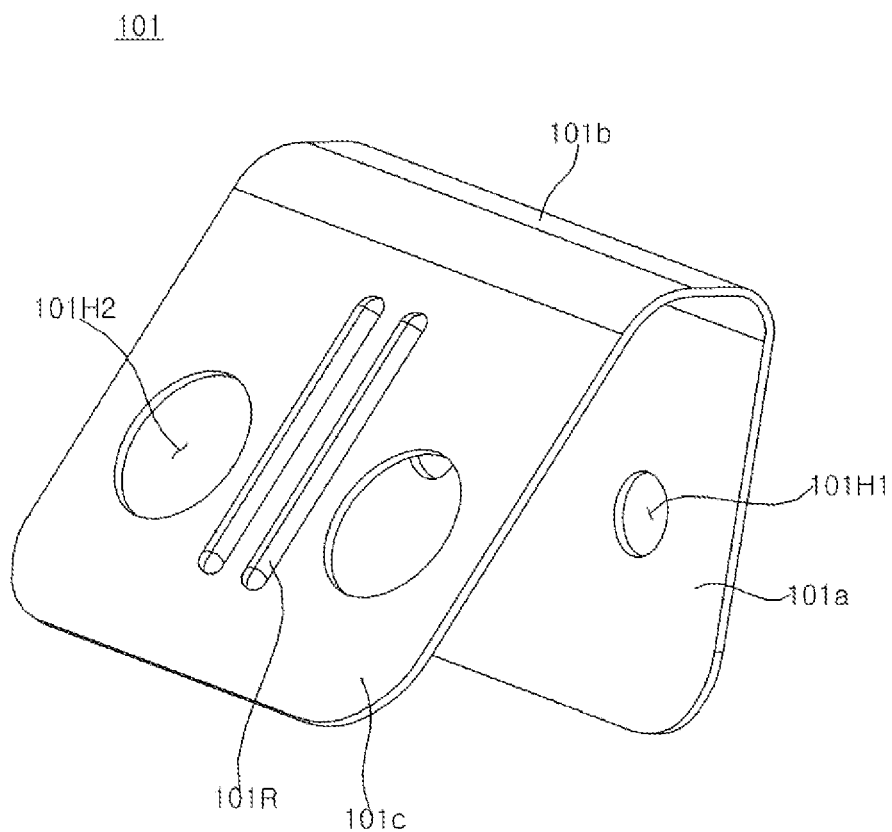
Figure 11:
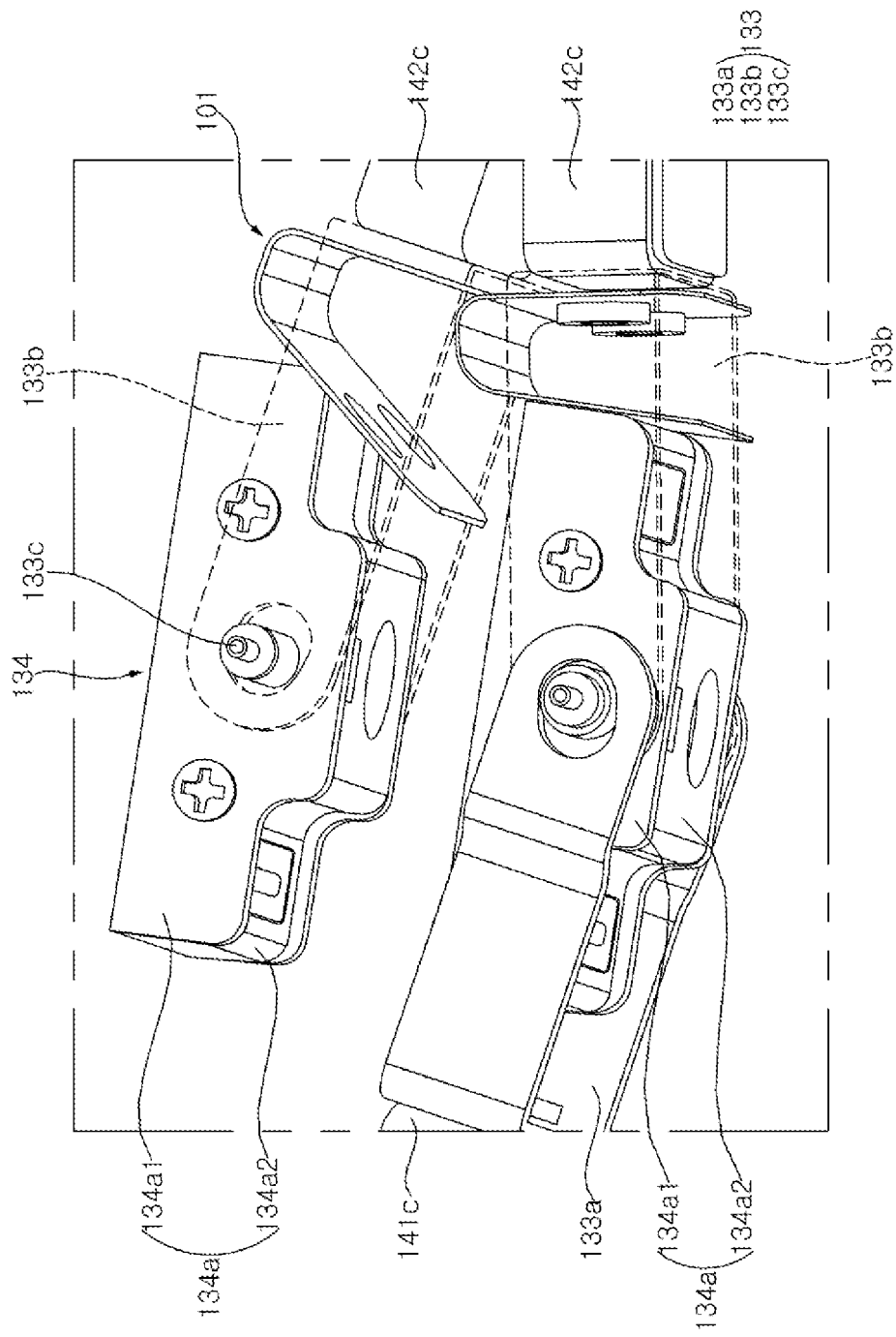

Referring to FIGS. 10 and 11, an elastic member 101 may include a first part 101a, a second part 101b, and a third part 101c. The elastic member 101 may be referred to as a first elastic member 101 or a clip 101. The first part 101a may be a plate. The second part 101b may be bent and extend from the first part 101a. The third part 101c may be bent and extend from the second part 101b. The third part 101c may face the first part 101a. A second angle formed between the second part 101b and the third part 101c may be greater than a first angle formed between the first part 101a and the second part 101b. In the extending direction, the third part 101c may be longer than the first part 101a. The elastic member 101 may be a metal plate and may have elasticity. For example, the elastic member 101 may be a leaf spring.

A coupling hole 101H1 may be formed in the first part 101a. There may be a plurality of coupling holes 101H1. A support rib 101R may be formed on the third part 101c. The support rib 101R may be elongated in the direction in which the third part 101c extends. There may be a plurality of support ribs 101R. The support ribs 101R may protrude from an outer surface of the third part 101c. The plurality of support ribs 101R may be parallel to each other.

The elastic member 101 may be inserted between the moving block 134 and the levers 141c and 142c of the wings 141 and 142. The first part 101a of the elastic member 101 may be fixed to the levers 141c and 142c of the wings 141 and 142. For example, the first part 101a of the elastic member 101 may be screw-coupled to the levers 141c and 142c of the wings 141 and 142. The third part 101c of the elastic member 101 may support the moving block 134. The third part 101c of the elastic member 101 may make contact with a side surface of the moving block 134. The third part 101c of the elastic member 101 may make contact with the outer part 134a1 and/or the inner part 134a2 of the moving body 134a. The outer part 134a1 and/or the inner part 134a2 of the moving body 134a, making contact with the third part 101c of the elastic member 101, may be rounded. The support ribs 101R formed on the third part 101c of the elastic member 101 may make contact with the inner part 134a2 of the moving block 134.

There may be a plurality of elastic members 101. Each of the plurality of elastic members 101 may be inserted between the moving block 134 and the lever 141c of the first wing 141 and between the moving block 134 and the lever 142c of the second wing 142. In a mechanism in which the flip frame 133 flips or pivots about the pivot pin 133c, clearance may be formed between the pivot pin 133c of the moving block 134 and the holes 133H1 and 133H2 (see FIG. 7) of the flip frame 133. The elastic member 101 may push the moving block 134 in one direction. As the elastic member 101 pushes the moving block 134 in one direction, the pivot pin 133c of the moving block 134 may be pressed against one side of the holes 133H1 and 133H2 of the flip frame 133.

Accordingly, in the entire region in which the moving block 134 moves on the lead screw 134, the moving block 134 may transmit force to the flip frame 133. In a mechanism in which the moving block 134 transmits force to the flip frame 133, clearance between the components may cause the display panel 110 to temporarily stop bending. According to the embodiment of the present disclosure, the display panel 110 may be bent continuously.

Figure 12:
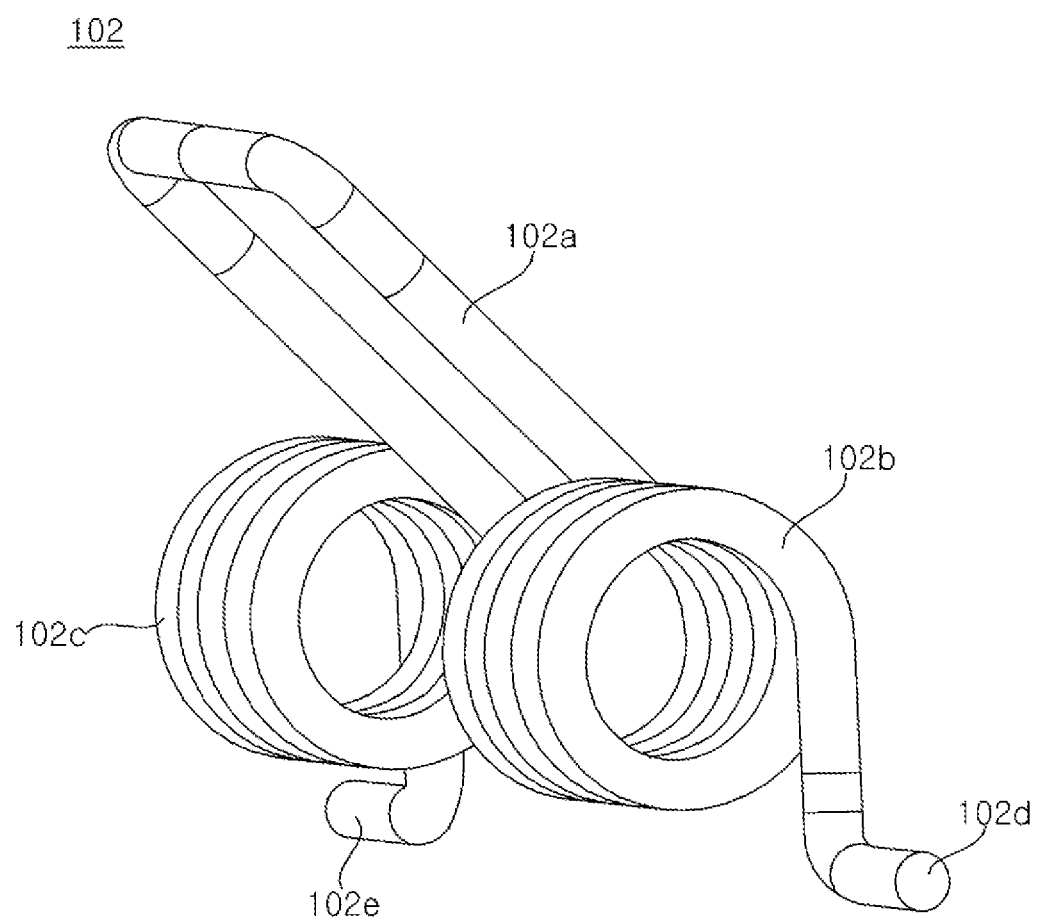
Figure 13:
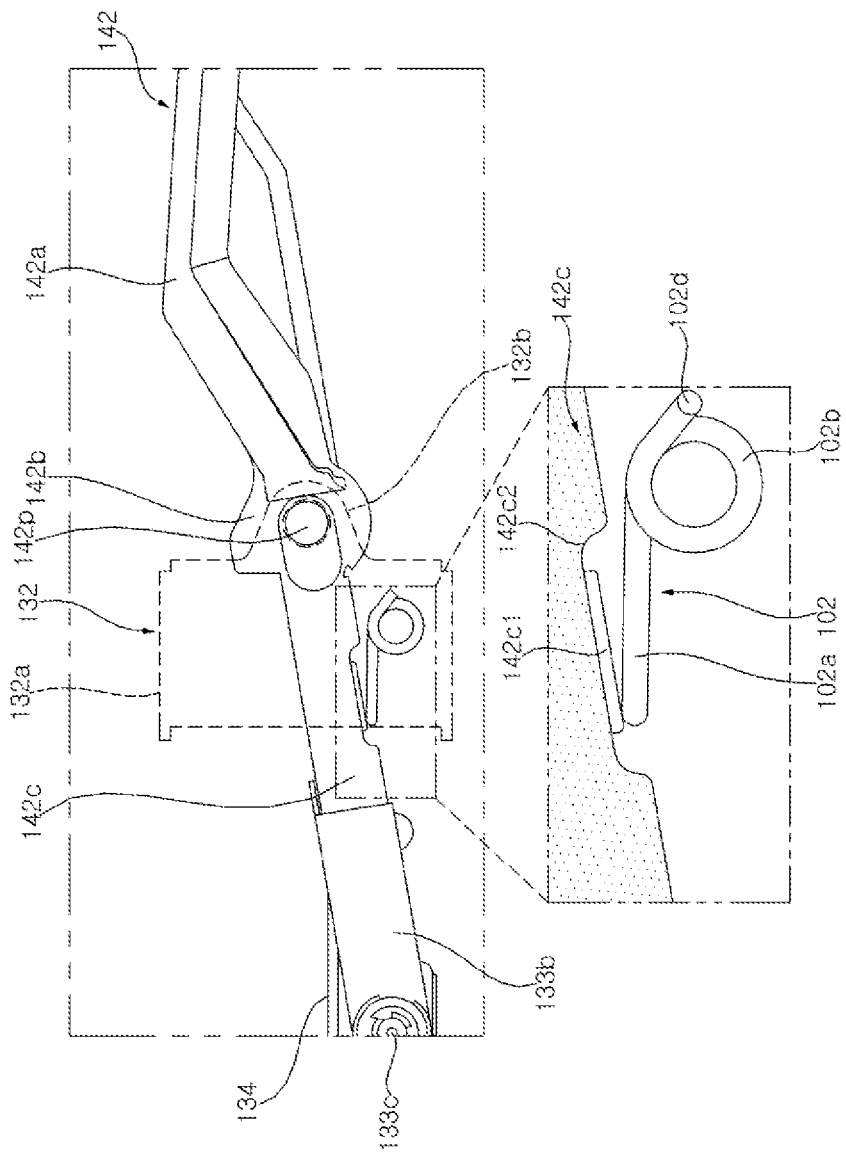

Referring to FIGS. 12 and 13, an elastic member 102 may include a lever part 120a, support parts 102d and 102e, and coil parts 102b and 102c. The elastic member 102 may be formed as a wire. The elastic member 102 may be referred to as a second elastic member 102.

The lever part 102a may be a wire bent in a U-shape. The coil parts 102b and 102c may be connected to the lever part 102a. There may be a plurality of coil parts 102b and 102c. A first coil part 102b may be connected to a first end of the lever part 102a, and the second coil part 102c may be connected to a second end of the lever part 102a. There may be a plurality of support parts 102d and 102e. A first support part 102d may form a distal end of the first coil part 102b, and the second support part 102e may form a distal end of the second coil part 102c.

When the support parts 102d and 102e are fixed, the lever part 102a may rotate or pivot about the coil parts 102b and 102c. The coil parts 102b and 102c may provide elasticity to the lever part 102a.

The elastic member 102 may be disposed on the wing bracket 132. The support parts 102d and 102e of the elastic member 102 may be fixed to the bracket frame 132a of the wing bracket 132. The lever part 102a of the elastic member 102 may be supported by the lever 142c of the wing 142.

The wing 142 may include a support groove 142c2 and a friction pad 142c1. The support groove 142c2 may be formed at a position corresponding to a portion of a length of the lever part 102a of the elastic member 102. The friction pad 142c1 may be formed on the support groove 142c2. The friction pad 142c1 may protrude from the support groove 142c2 and a surface of the friction pad 142c1 may be smoothly polished.

When the wings 141 and 142 are pivotally coupled to the wing brackets 131 and 132, clearance may be formed between the pivot shafts 141p and 142p of the wings 141 and 142 and the wing holders 131b and 132b of the wing brackets 131 and 132. In a mechanism in which the moving block 134 transmits force to the flip frame 133 to allow the wings 141 and 142 to bend the display panel 110, the clearance may cause the display panel 110 to temporarily stop bending. The wings 141 and 142 may receive force from the elastic member 102 in a forward direction of the display device 100. Accordingly, the display panel 110 may be bent continuously. In addition, power consumption of the motor 137 required to bend the display panel 110 may be reduced.

In addition, as the sliding block 134b (see FIG. 6) is screw-coupled to the lead screw 135, clearance may be formed for the sliding block 134b to move on the lead screw 135. As the elastic member 102 pushes the wings 141 and 142 to press the sliding block 134b in one direction of the lead screw 135, the display panel 110 may be bent continuously. Further, when the torque of the motor 137 and the lead screw 135 is released while the display panel 110 is in a flat shape, flatness of the display panel 110 may be changed. In this embodiment, the display panel 110 may remain flat and/or curved with a predetermined curvature.

Figure 14:
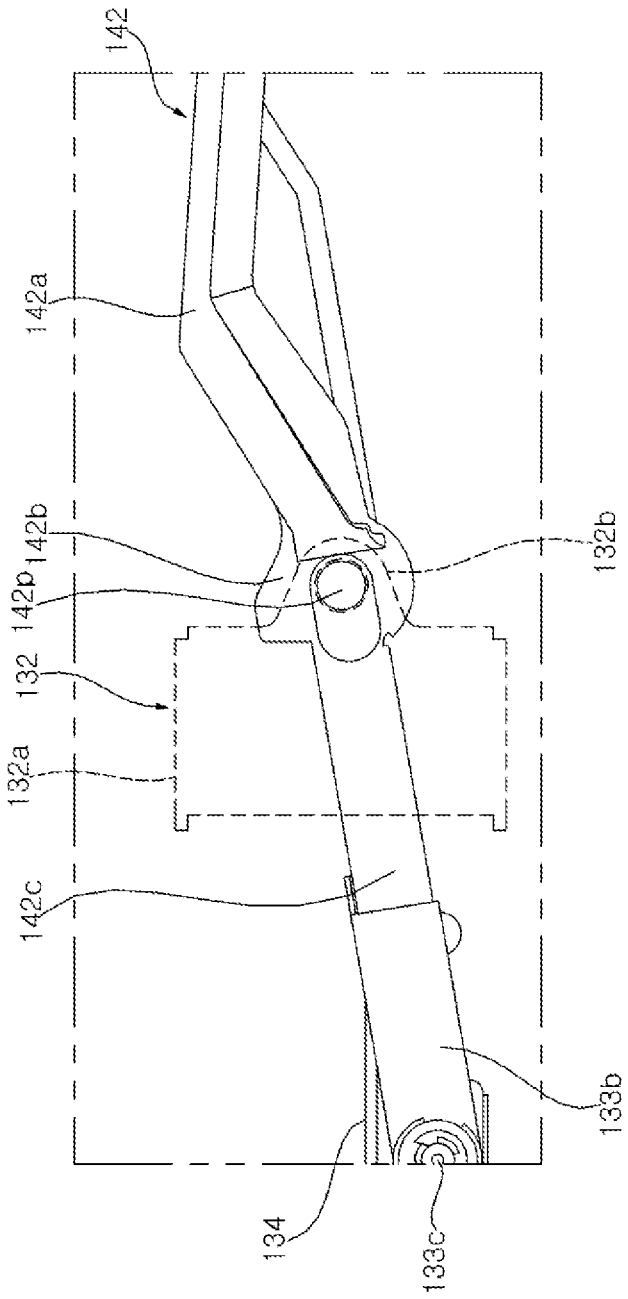
Figure 15:
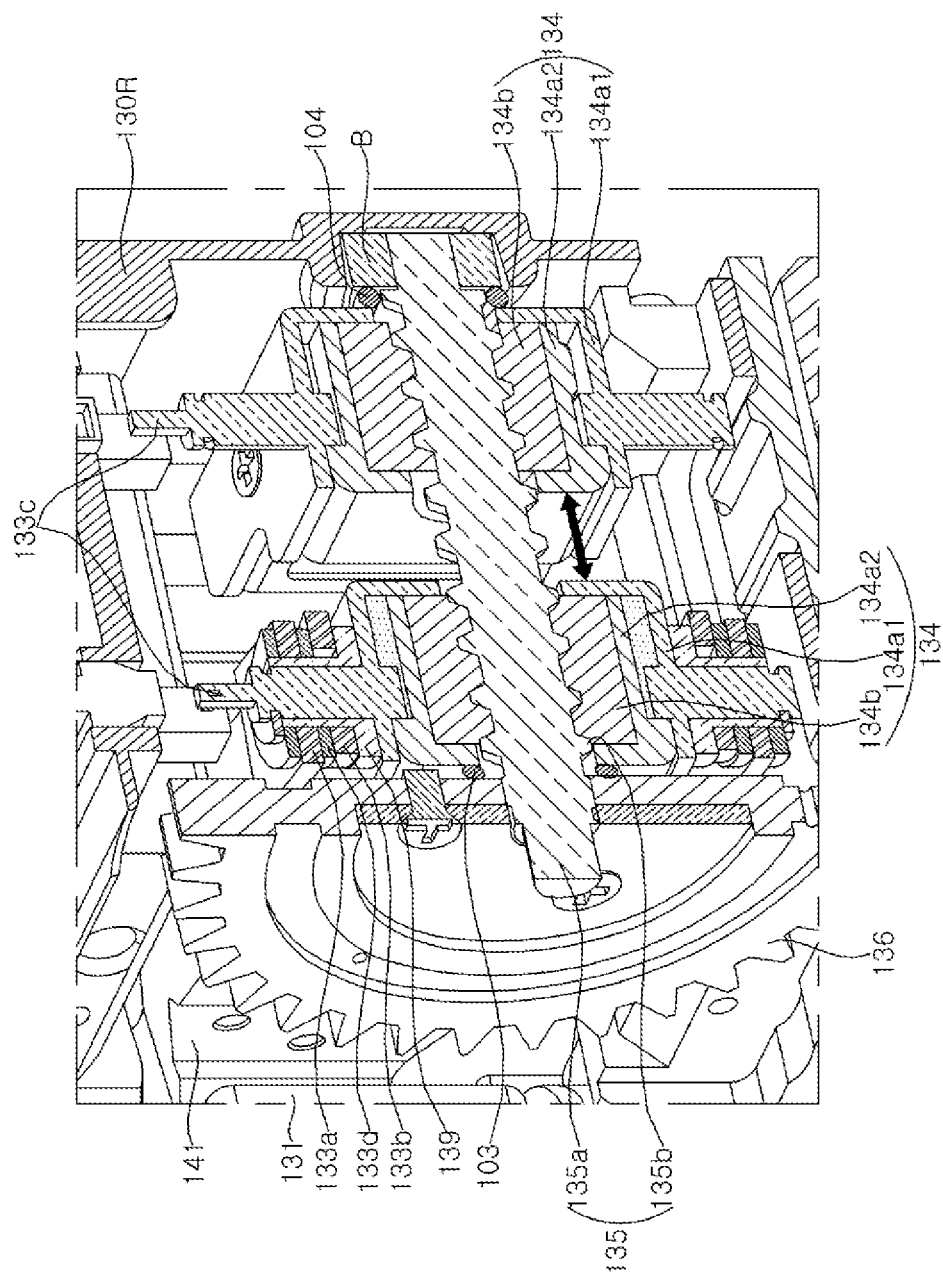

Referring to FIGS. 14 and 15 along with FIG. 8, when the wings 141 and 142 are pivotally coupled to the wing brackets 131 and 132, clearance may be formed between the pivot shafts 141p and 142p of the wings 141 and 142 and the wing holders 131b and 132b of the wing brackets 131 and 132. In a mechanism in which the moving block 134 transmits force to the flip frame 133 to allow the wings 141 and 142 to bend the display panel 110, the clearance between the components may cause the display panel 110 to temporarily stop bending.

Elastic rings 103 and 104 may be disposed around an outer circumference of the lead screw 135. The lead screw 135 may be inserted into the elastic rings 103 and 104. The elastic rings 103 and 104 may be referred to as compression rings 103 and 104 or compression members 103 and 014. For example, the elastic rings 103 and 104 may be highly elastic rubber. A diameter of the elastic rings 103 and 104 may be greater than a diameter of the shaft body 135a of the lead screw 135. For example, an inner diameter of the elastic rings 103 and 104 may be greater than an outer diameter of the shaft body 135a of the lead screw 135. There may be a plurality of elastic rings 103 and 104. The plurality of elastic rings 103 and 104 may include a first elastic ring 103 and a second elastic ring 104. The first elastic ring 103 may be referred to as a front elastic ring 103, and the second elastic ring 104 may be referred to as a rear elastic ring 104.

The front elastic ring 103 may be disposed between the driving gear 136 and the moving block 134. The front elastic ring 103 may make contact with the driving gear 136.

As the moving block 134 moves on the lead screw 135, the front elastic ring 103 may be brought into contact with or separated from the inner part 134a2 of the moving block 134. While moving closer to the driving gear 136, the moving block 134 may compress the front elastic ring 103. In addition, while moving away from the driving gear 136, the front elastic ring 103 may push the moving block 134.

The rear elastic ring 104 may be disposed between the bearing B and the moving block 134. The rear elastic ring 104 may make contact with the bearing B. As the moving block 134 moves on the lead screw 135, the rear elastic ring 104 may be brought into contact with or separated from the outer part 134a1 of the moving block 134. While moving closer to the bearing B, the moving block 134 may compress the rear elastic ring 104. In addition, while moving away from the bearing B, the rear elastic ring 104 may push the moving block 134.

Accordingly, the display panel 110 may be bent continuously. In addition, a large amount of power may be consumed during initial driving to bend or flatten the display panel 110. During the initial driving of the moving block 134, the elastic rings 103 and 104 may push the moving block 134, thereby reducing power consumed by the motor 137 for bending the display panel 110.

In addition, as the sliding block 134b (see FIG. 6) is screw-coupled to the lead screw 135, clearance may be formed for the sliding block 134b to move on the lead screw 135. As the moving block 134 compresses the elastic rings 103 and 104 or as the elastic rings 103 and 104 push the moving block 134, the sliding block 134b may come into close contact with the lead screw 135 in a longitudinal direction of the lead screw 135, such that the display panel 110 may be bent continuously.

Further, when the torque of the motor 137 and the lead screw 135 is released while the display panel 110 is in a flat shape, flatness of the display panel 110 may be changed. In this embodiment, the display panel 110 may remain flat and/or curved with a predetermined curvature.

Figure 16:
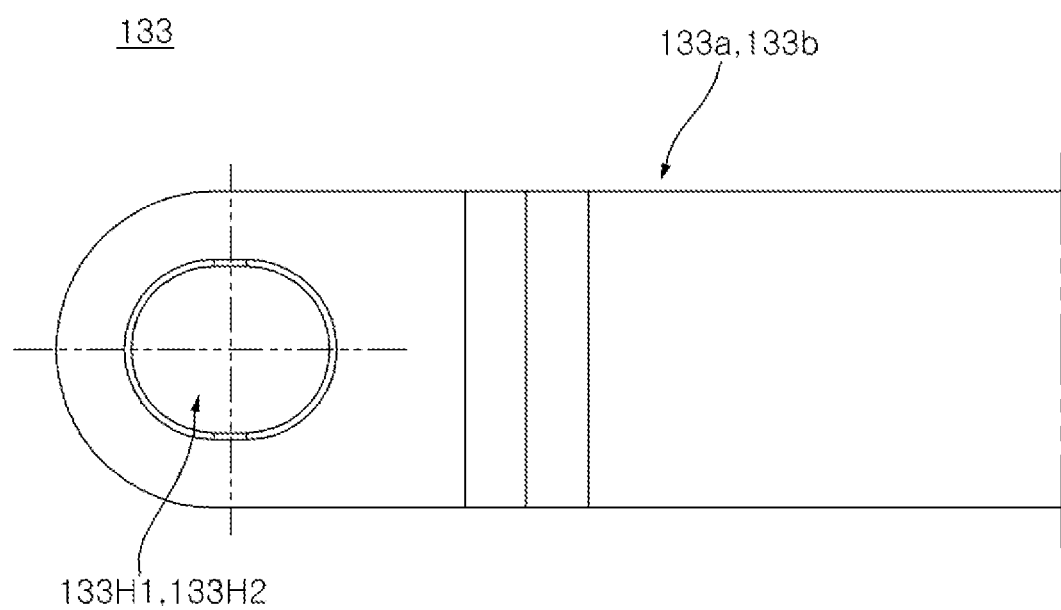

Referring to FIG. 16, the flip frame 133 may have the holes 133H1 and 133H2. The holes 133H1 and 133H2 may be formed adjacent to a distal end of the first frame 133a and/or the second frame 133b of the flip frame 133. The holes 133H1 and 133H2 may be long holes 133H1 and 133H2 having a major axis and a minor axis. The major axis of the holes 133H1 and 133H2 may be parallel to a longitudinal direction of the frame 133. The minor axis of the holes 133H1 and 133H2 may cross the longitudinal direction of the frame 133.

Figure 17:
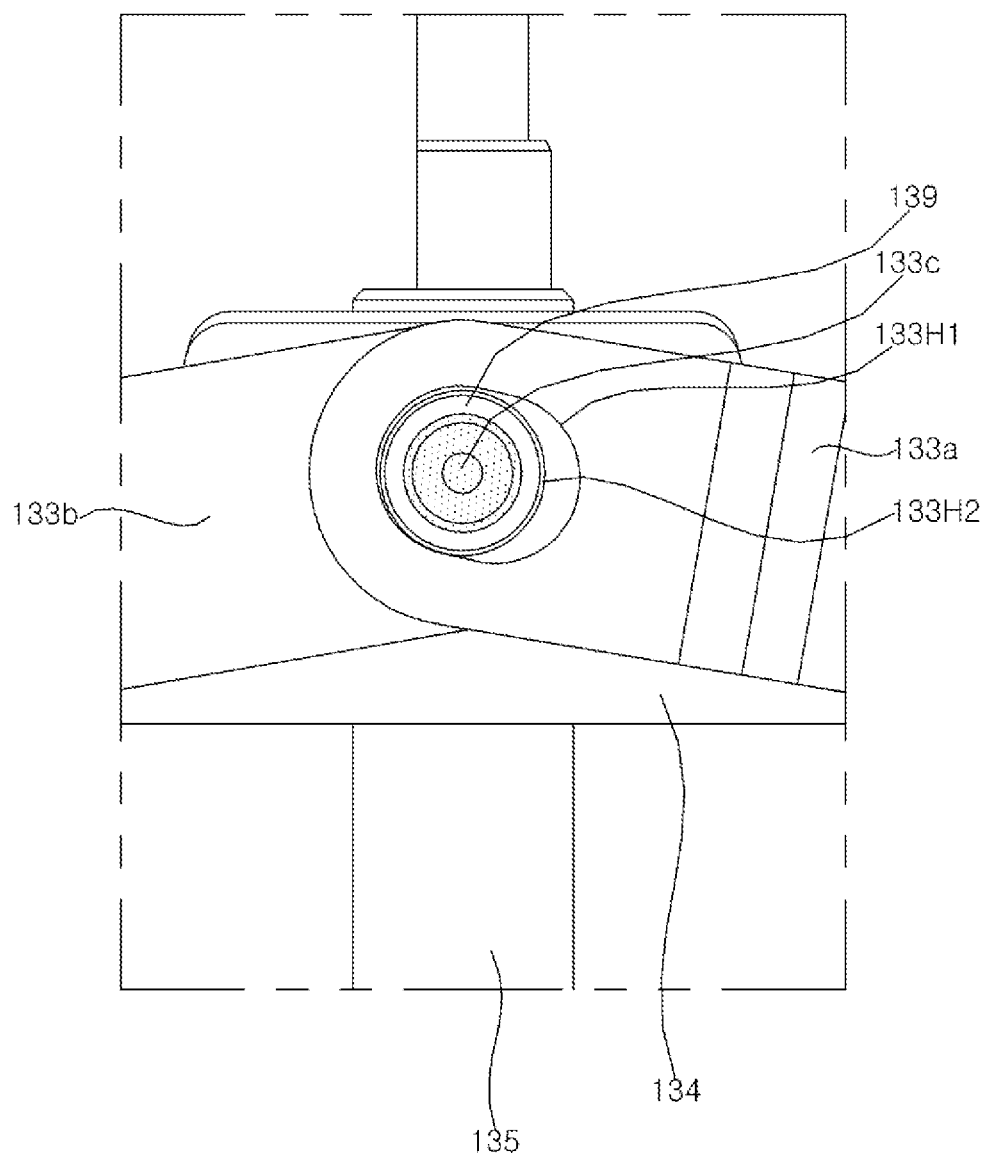
Figure 18:
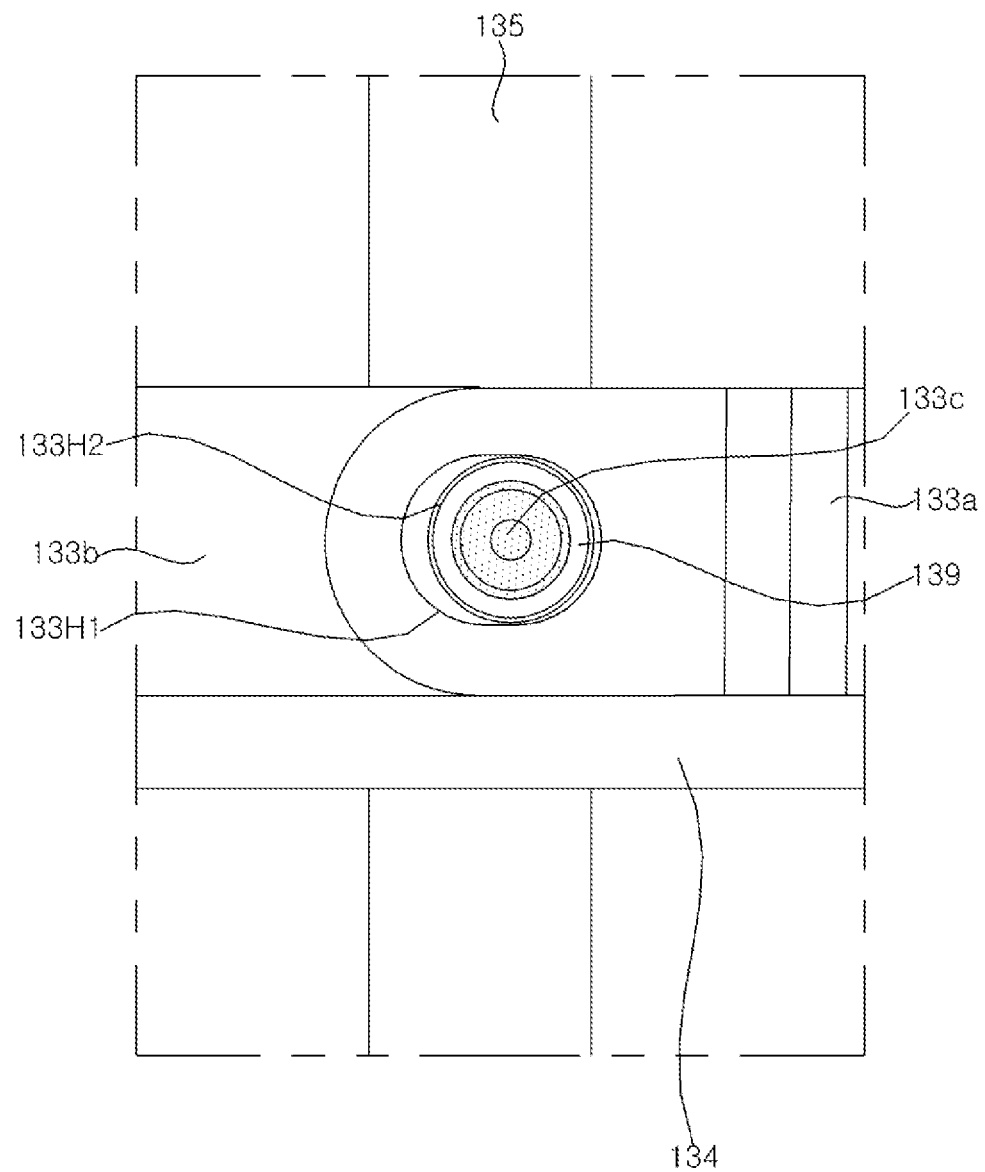
Figure 19:
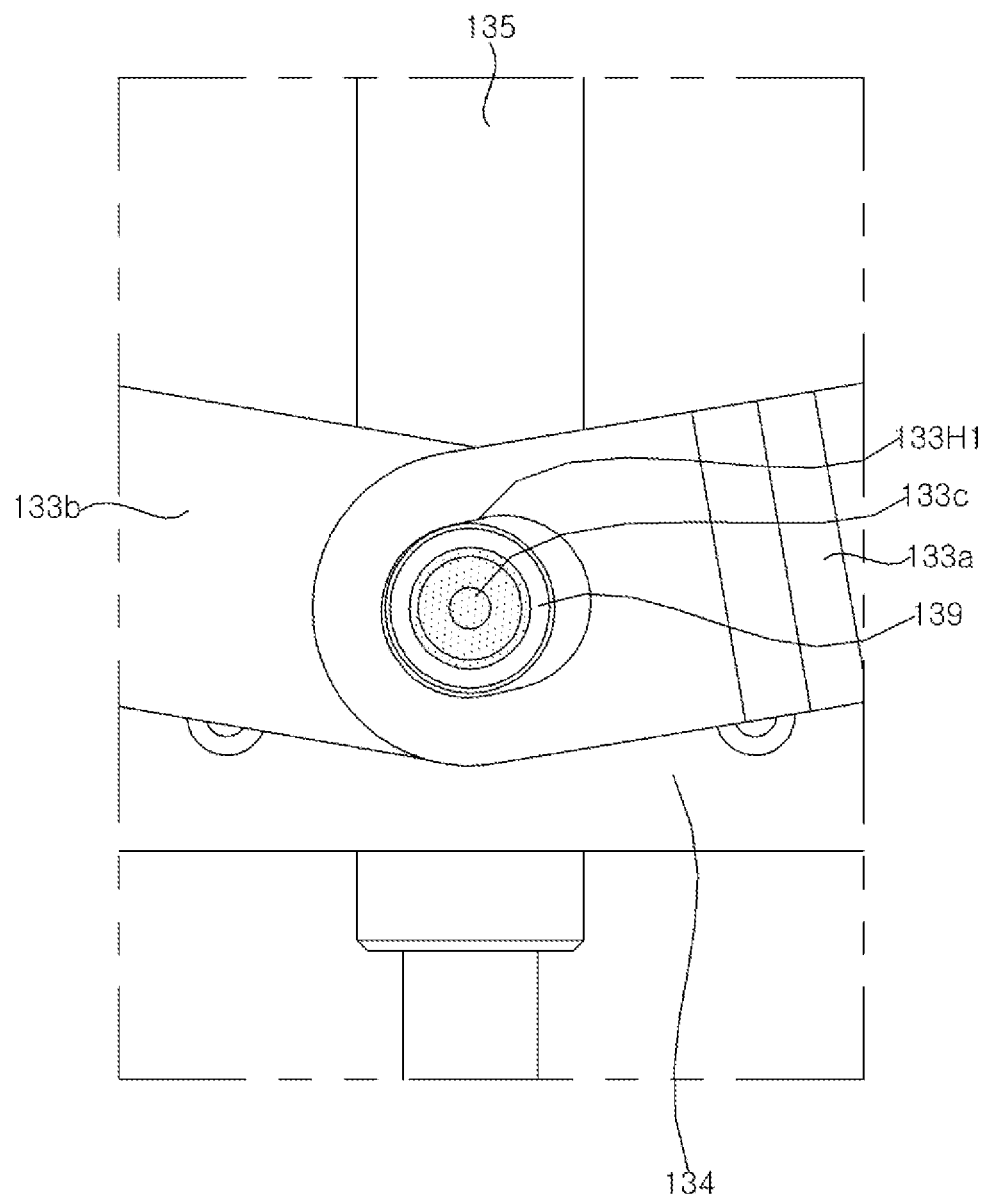

Referring to FIGS. 17 to 19, the pivot pin 133c may be inserted into the holes 133H1 and 133H2 of the flip frame 133, and the moving block 134 may move on the lead screw 135. As the moving block 134 moves on the lead screw 135, the display panel 110 changes from flat (see FIG. 17) to curved (see FIG. 17), in which the display panel 110 may be curved with a constant curvature (see FIG. 19).

When the display panel 110 starts to be curved after being in a flat shape, or when the display panel 110, after being curved with a predetermined curvature, changes to a flat shape as a radius of curvature becomes greater than a predetermined radius of curvature, a moving direction of the moving block 134 may be changed. That is, at a start point and an end point of the moving block 134, the display panel 110 may be flat or may be curved with a predetermined curvature.

When the moving direction of the moving block 134 is changed at the start point and/or the end point, a direction in which the pivot pin 133c applies force to the holes 133H1 and 133H2 of the flip frame 133 may be changed. As the direction in which the pivot pin 133c applies force to the holes 133H1 and 133H2 of the flip frame 133 is changed, clearance formed between the pivot pin 133c and the holes 133H1 and 133H2 of the flip frame 133 may cause a continuous change in curvature of the display panel 110 to stop.

Figure 20:
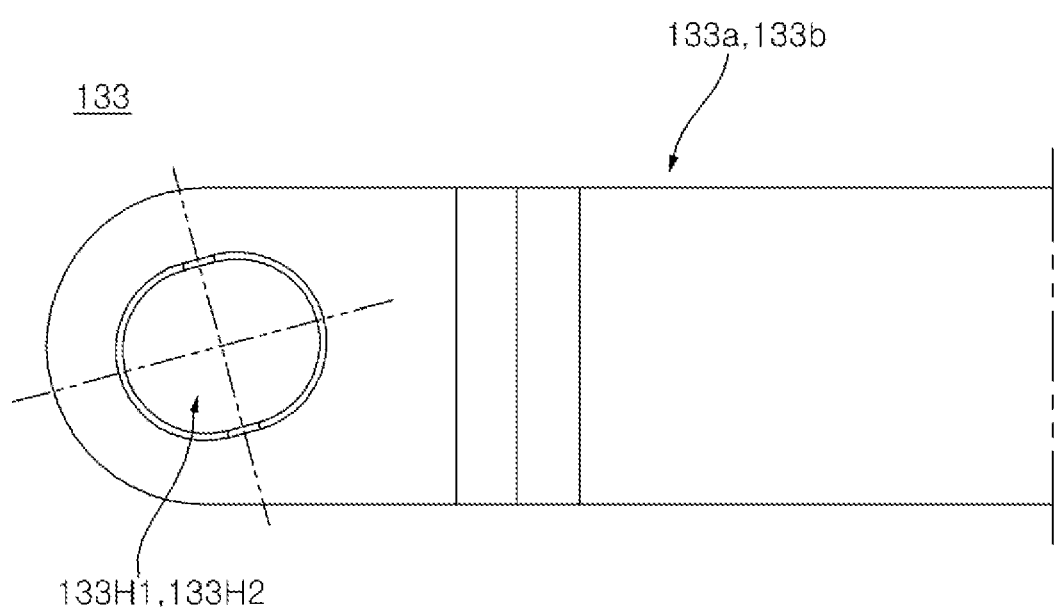
Figure 21:
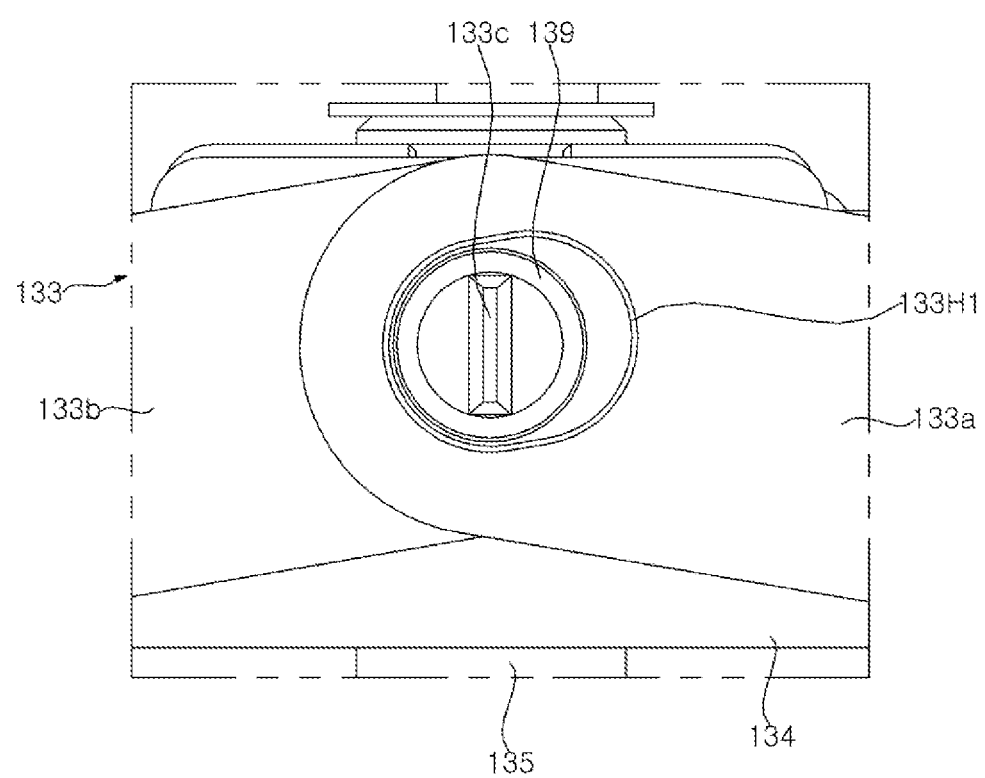

Referring to FIGS. 20 and 21, the major axis of the holes 133H1 and 133H2 of the flip frame 133 may form an angle θ with respect to a longitudinal direction of the flip frame 133. For example, the angle θ may correspond to an angle θ formed between the pivot shafts 141p and 142p of the wings 141 and 142 (see FIG. 8) and the start point or the end point of the moving block 134 with respect to a line connecting the pivot shafts 141p and 142p of the wings 141 and 142.

As the holes 133H1 and 133H2 of the flip frame 133 are moved closer to the start point or the end point of the moving block 134, the major axis of the holes 133H1 and 133H2 may become parallel to a baseline connecting the pivot shafts 141p and 142p of the wings 141 and 142 of the moving block 134. When a moving direction of the pivot pin 133c is changed, the moving direction of the pivot pin 133c may be aligned with a direction of the minor axis of the holes 133H1 and 133H2 of the flip frame 133.

When the moving direction of the pivot pin 133c is changed such that the moving direction of the pivot pin 133c is aligned with the minor axis of the holes 133H1 and 133H2 of the flip frame 133, clearance formed between the pivot pin 133c and the holes 133H1 and 133H2 of the flip frame 133 may be minimized. Accordingly, by the movement and/or direction change of the moving block 134, the pivot pin 133c may continuously transmit power or force to the flip frame 133.

Figure 22:
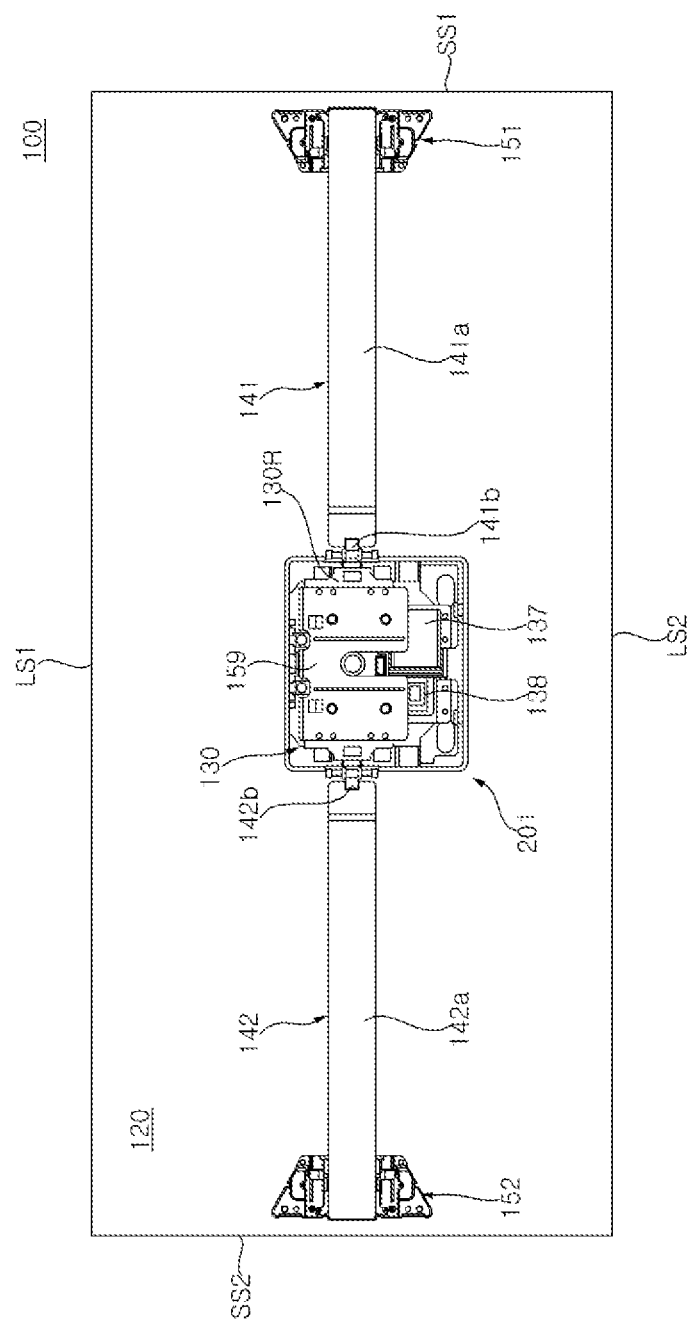
Figure 23:
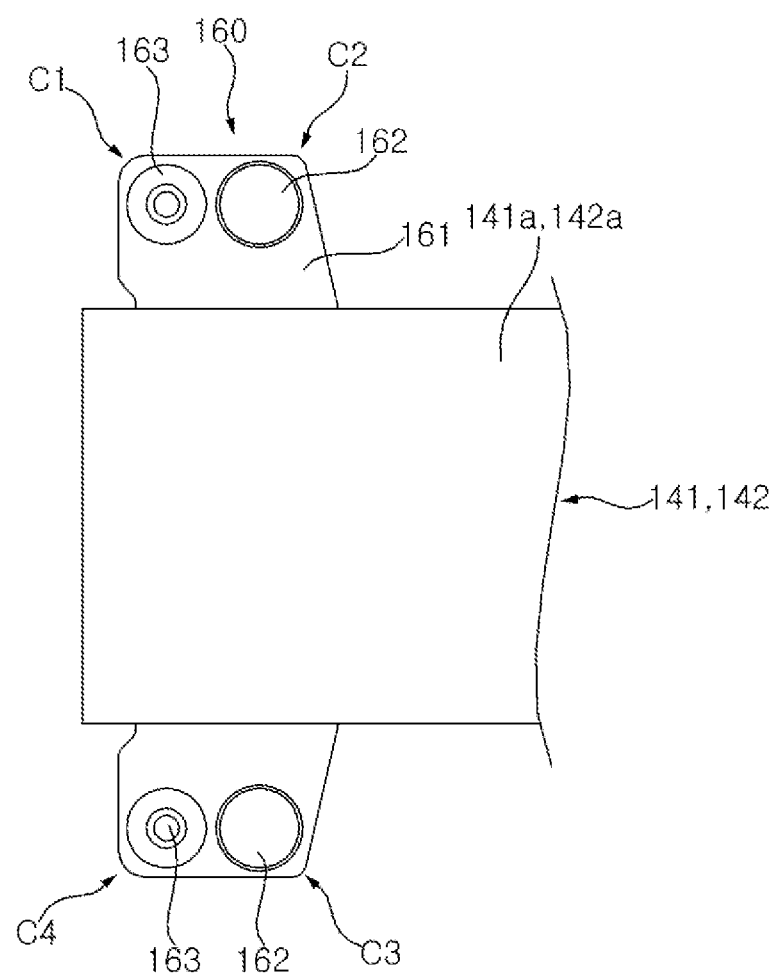

Referring to FIGS. 22 and 23, a first sliding mount 151 may be fixed to the rear surface of the plate 120 at a position adjacent to the first short side SS1 of the plate 120. The second sliding mount 152 may be fixed to the rear surface of the plate 120 at a position adjacent to the second short side SS2 of the plate 120.

The driving module 130 may be disposed between the first sliding mount 151 and the second sliding mount 152 and may be coupled to the rear surface of the plate 120. The first wing 141 may have a first end pivotally connected to the driving module 130 and a second end coupled to the first sliding mount 151. The second end of the first wing 151 may move on the first sliding mount 151. The second wing 142 may have a first end pivotally connected to the driving module 130 and a second end coupled to the second sliding mount 152. The second end of the second wing 142 may move on the second sliding mount 152.

A PCB plate 159 may be disposed at the rear of the driving module 130. The PCB plate 159 may be fixed to the rear bracket 130R (see FIG. 2) of the driving module 130. Printed Circuit Boards (PCBs) may be coupled to the PCB plate 159.

A side cover 201 may form a wall around the sides of the driving module 130. For example, the side cover 201 may be a square frame. A back cover (not shown) may be coupled to the side cover 201 while covering the driving module 130.

A slide bracket 160 may be coupled or fixed to distal ends of the wings 141 and 142. The slide bracket 160 may include a body 161 having an elongated plate shape and protrusions 162 and 163 formed adjacent to both ends of the body 161. The protrusions 162 and 163 may be referred to as friction protrusions 162 and 163 or contact protrusions 162 and 163. For example, the slide bracket 160 may be made of metal.

There may be a plurality of protrusions 162 and 163. The plurality of protrusions 162 and 163 may include front protrusions 163 and rear protrusions 162. The front protrusions 163 may be formed at the first corner C1 and/or the fourth corner C4 of the body 161. The front protrusions 163 may protrude by being pressed toward the front of the body 161. The front protrusions 163 may have a dome shape or a hemispherical shape. The rear protrusions 162 may be formed at the second corner C2 and/or the third corner C3 of the body 161. The rear protrusions 162 may protrude by being pressed toward the rear of the body 161. The rear protrusions 162 may have a dome shape or a hemispherical shape. The rear protrusions 162 may be adjacent to the front protrusions 163. The front protrusions 163 and the rear protrusions 162 may be disposed sequentially along the short side of the body 161. One pair of the front protrusion 163 and the rear protrusion 162 may be disposed opposite another pair of the front protrusion 163 and the rear protrusion 162 with respect to the wings 141 and 142.

Figure 24:
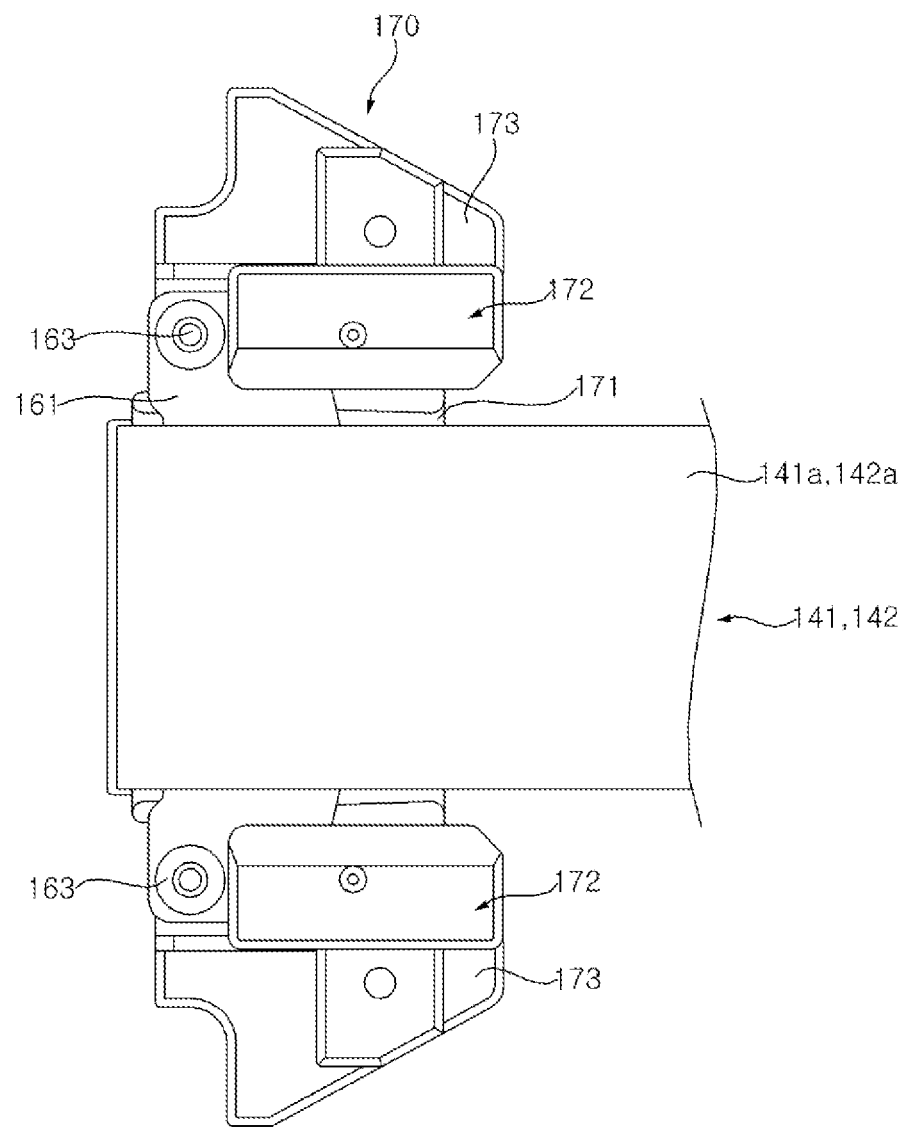
Figure 25:
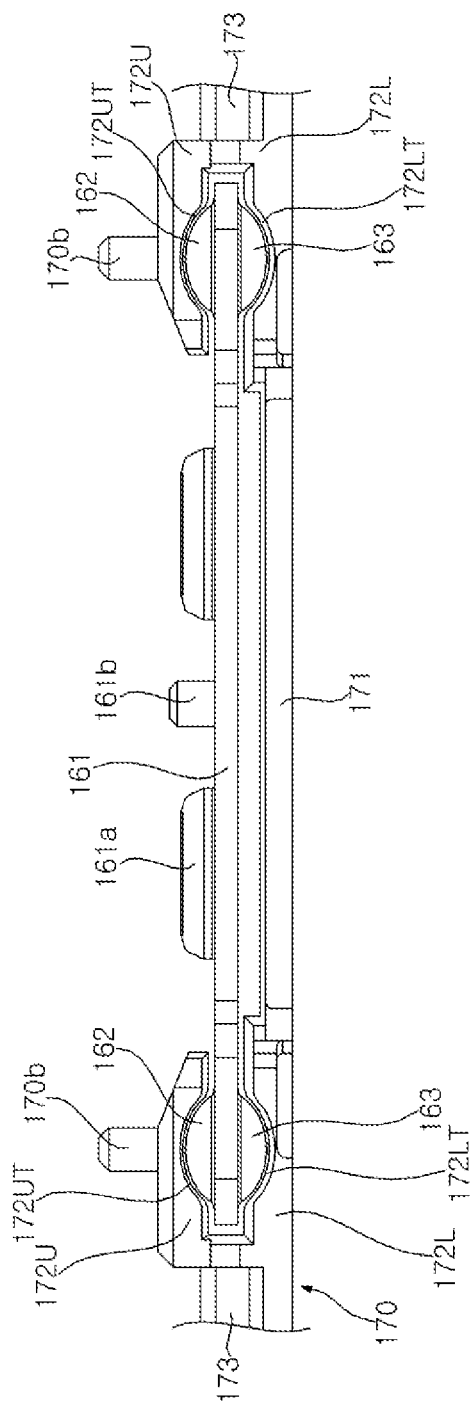

Referring to FIGS. 24 and 25, the slide bracket 160 may be coupled to the guide cover 170. The slide bracket 160 may be inserted into the guide cover 170 and may move on the guide cover 170. For example, the guide cover 170 may be made of a synthetic resin having low frictional force. For example, the guide cover 170 may be made of a low friction material. For example, the guide cover 170 may be made of polyoxymethylene (POM, acetal homopolymer).

The guide cover 170 may include a base 171, a side rail 172, and a fixing plate 173. The base 171 may have an elongated plate shape and may face the slide bracket 160. The side rail 172 may be formed at both ends of the base 171. The side rail 172 may include a lower part 172L and an upper part 172U. The lower part 172L may extend from the base 171.

A lower trench 172LT may be formed in the lower part 172L. The lower trench 172LT may be formed in the lower part 172L as an upper surface of the lower part 172L is recessed inward in an elongated shape. For example, the lower trench 172LT may be in the shape of a half pipe. The front protrusion 163 of the slide bracket 160 may move on the lower trench 172LT. A radius of curvature of the front protrusion 163 may be smaller than a radius of curvature of the lower trench 172LT. Accordingly, the front protrusion 163 may make point contact with the lower trench 172LT.

The upper part 172U may be spaced apart from the lower part 172LT and may face the lower part 172L. A gap may be formed between the upper prat 172U and the lower part 172L, and the slide bracket 160 may be inserted into the gap. An upper trench 172UT may be formed in the upper part 172U. The upper trench 172UT may be formed in the upper part 172UT as a lower surface of the upper part 172U is recessed inward in an elongated shape. For example, the upper trench 172UT may be in the shape of a half pipe. The rear protrusion 162 of the slide bracket 160 may move on the lower trench 172LT. A radius of curvature of the rear protrusion 162 may be smaller than a radius of curvature of the upper trench 172UT. Accordingly, the rear protrusion 162 may make point contact with the upper trench 172UT.

As the slide bracket 160 and the guide cover 170 are coupled to each other, it is possible to prevent drooping of the wings 141 and 142 due to self-weight.

The slide bracket 160 may include a coupling part 161a and a PEM nut 161b or a coupling protrusion 161b for coupling with the wings 141 and 142. The guide cover 170 may include a PEM nut 170b or a coupling protrusion 170b for coupling with the sliding mounts 151 and 152.

Figure 26:
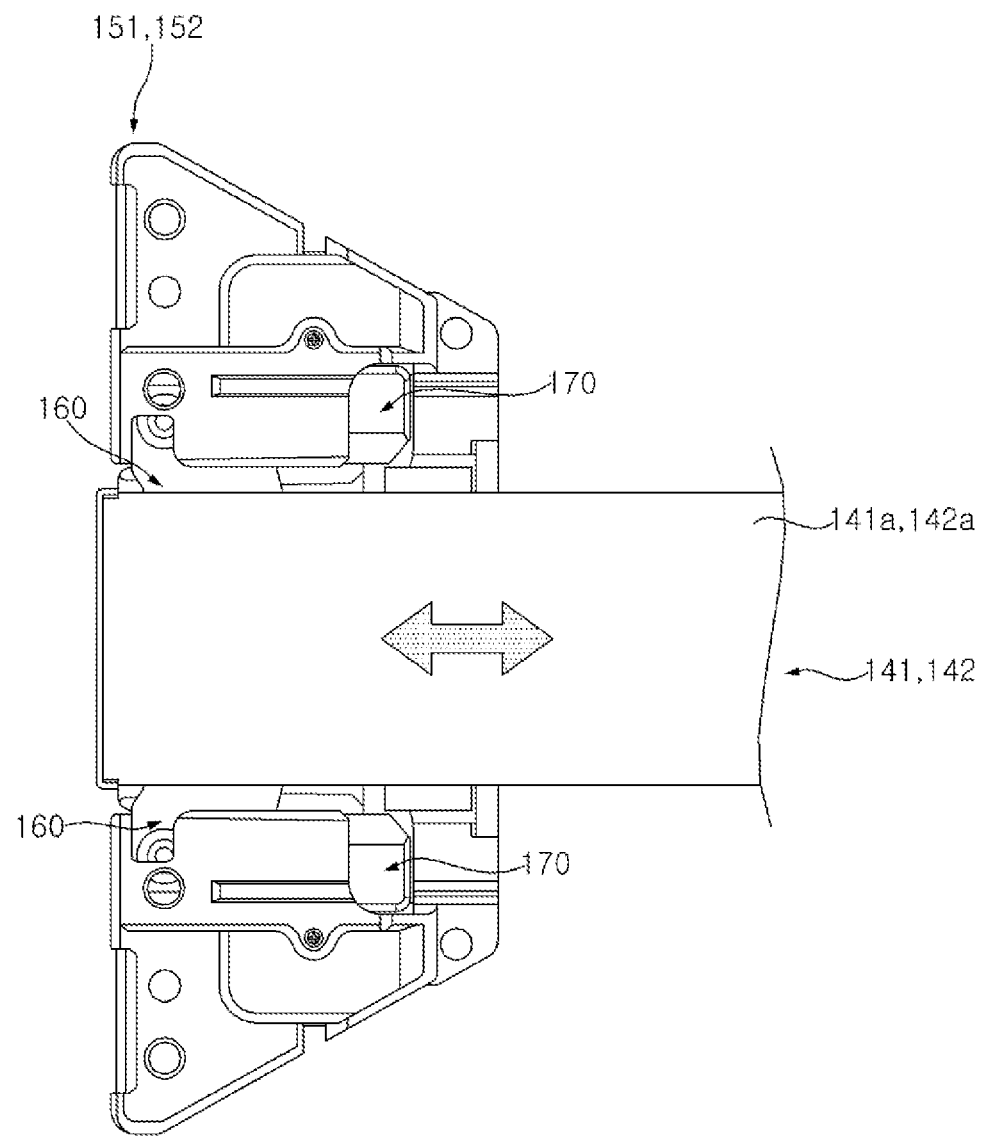
Figure 27:
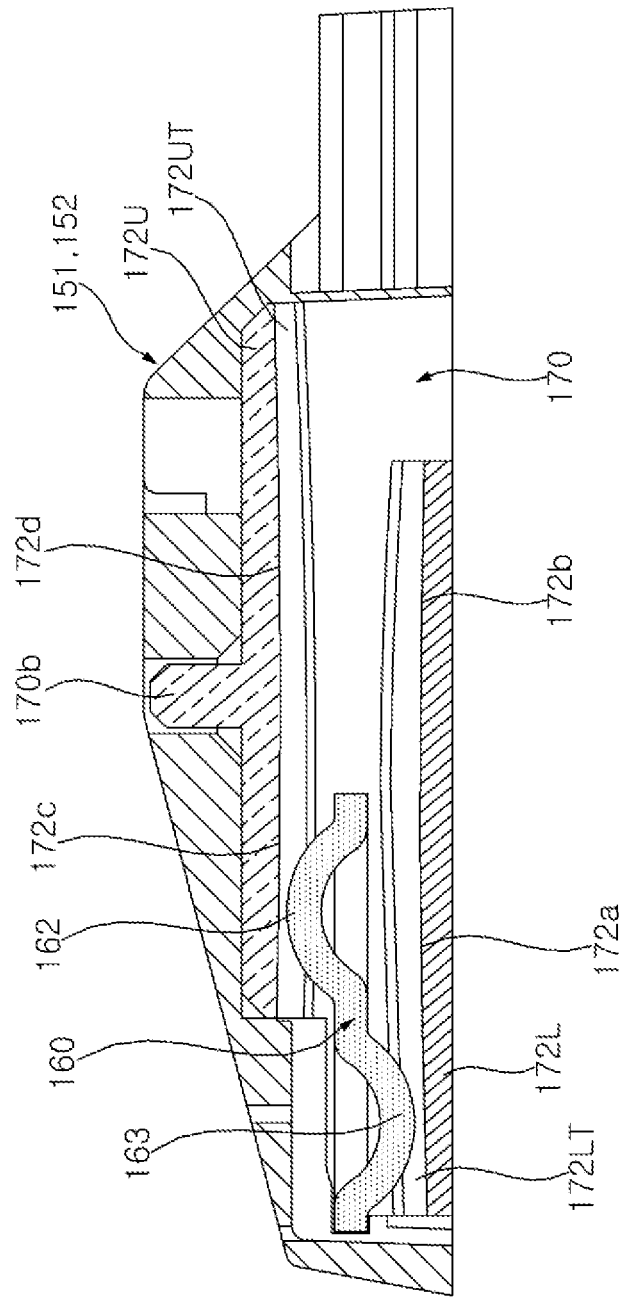
Figure 28:
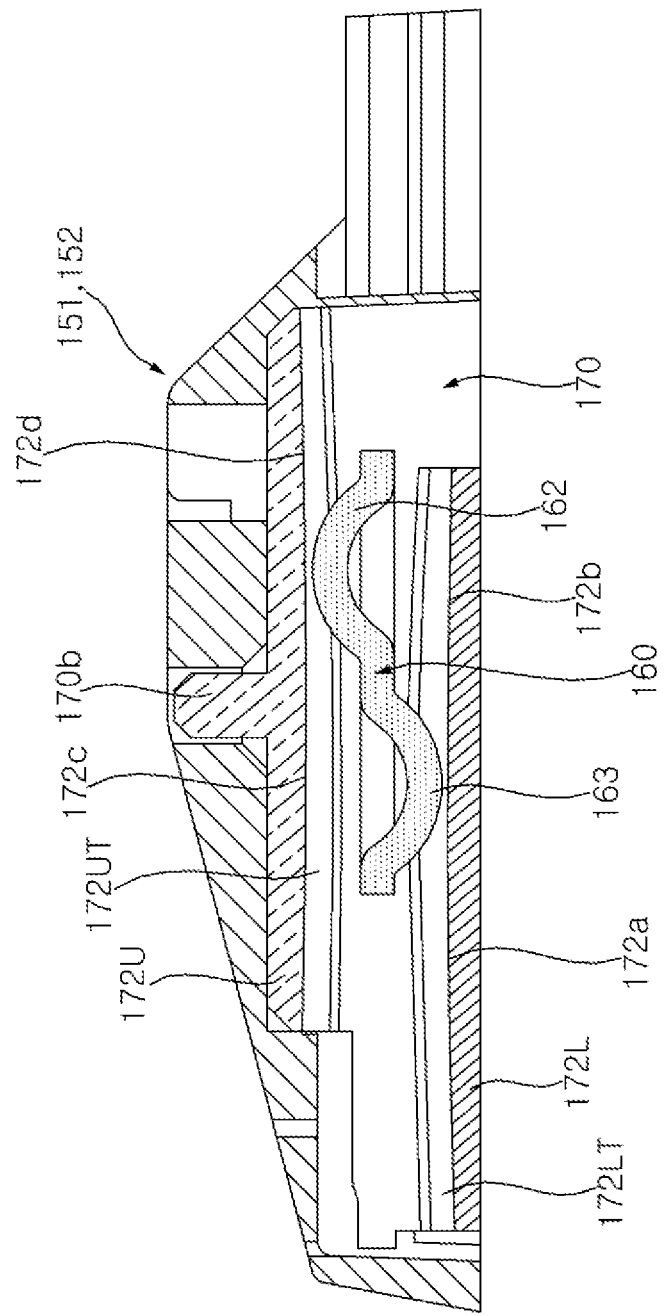

Referring to FIGS. 26 to 28, the slide bracket 160 may be coupled to front surfaces of the wing blades 141a and 142b at a position adjacent to the distal ends of the wings 141 and 142. The guide cover 170 may be fixed to the sliding mounts 151 and 152. The slide bracket 160 may be inserted into the guide cover 170 and may make a reciprocal movement on the guide cover 170 in a longitudinal direction of the wings 141 and 142.

When the display panel 110 changes to a flat shape after being curved with a predetermined curvature, the slide bracket 160 may move on the guide cover 170 toward the short sides SS1 and SS2 of the plate 120. The front protrusion 163 may move on the lower trench 172LT. The front protrusion 163 may move on the lower trench 172LT while making contact with or rubbing smoothly against a surface of the lower trench 172LT. The rear protrusion 162 may move on the upper trench 172UT while making contact with or rubbing smoothly against a surface of the upper trench 172UT.

When the display panel 110 changes from flat to curved with a predetermined curvature, the slide bracket 160 may move on the guide cover 170 from the short sides SS1 and SS2 of the plate 120 toward the driving module 130. The front protrusion 163 may move on the lower trench 172LT. The front protrusion 163 may move on the lower trench 172LT while making contact with or rubbing smoothly against the surface of the lower trench 172LT. The rear protrusion 162 may move on the upper trench 172UT while making contact with or rubbing smoothly against the surface of the upper trench 172UT.

As the protrusions 162 and 163 make point contact with the trenches 172LT and 172UT, it is possible to reduce friction and abrasion caused by the friction, and no lubricant is required, thereby improving structural durability of a mechanism.

Figure 29:
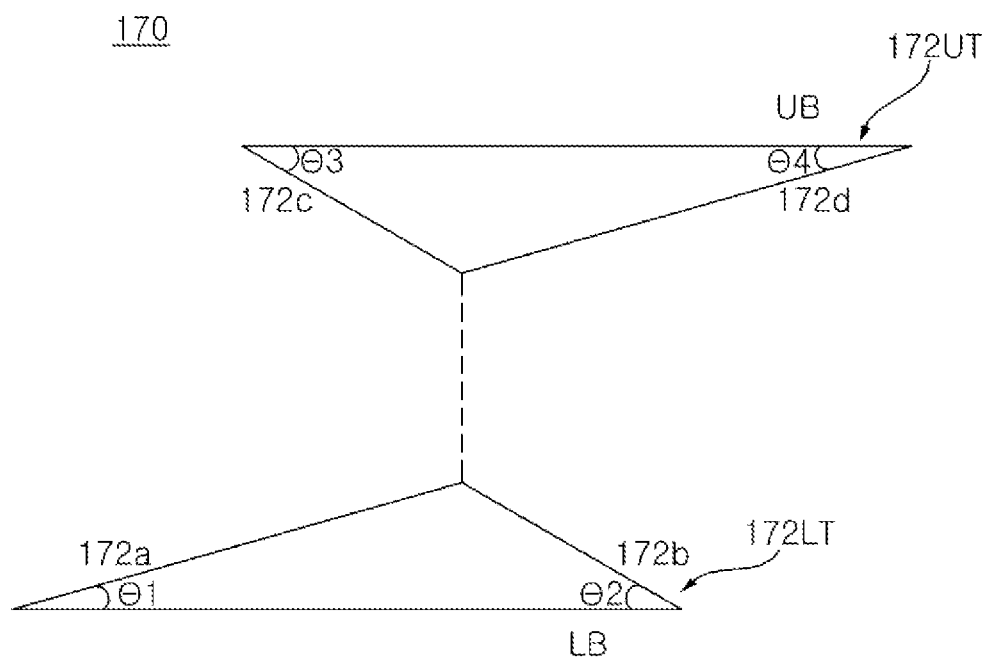

Referring to FIG. 29, the lower trench 172LT may include a first inclined surface 172a and a second inclined surface 172b, and the upper trench 172UT may include a third inclined surface 172c and a fourth inclined surface 172d. The first inclined surface 172a may form a first angle θ1 with respect to a base surface LB. The second inclined surface 172b may form a second angle θ2 with respect to the base surface LB. The second inclined surface 172b may make contact with the first inclined surface 172a.

The third inclined surface 172c may form a third angle θ3 with respect to the base surface UB. The fourth inclined surface 172d may form a fourth angle θ4 with respect to the base UB. The fourth inclined surface 172d may be in contact with the third inclined surface 172c. A boundary between the third inclined surface 172c and the fourth inclined surface 172d may correspond to or may be aligned with a boundary between the first inclined surface 172a and the second inclined surface 172b. For example, the boundary between the third inclined surface 172c and the fourth inclined surface 172d may be vertically aligned on the same line as the boundary between the first inclined surface 172a and the second inclined surface 172b.

The second angle θ2 may be greater than the first angle θ1. The third angle θ3 may be greater than the fourth angle θ4. The first inclined surface 172a may be longer than the second inclined surface 172b. The fourth inclined surface 172d may be longer than the third inclined surface 172c. The third inclined surface 172c may face the first inclined surface 172a, and the second inclined surface 172b may face the fourth inclined surface 172d.

Figure 30:
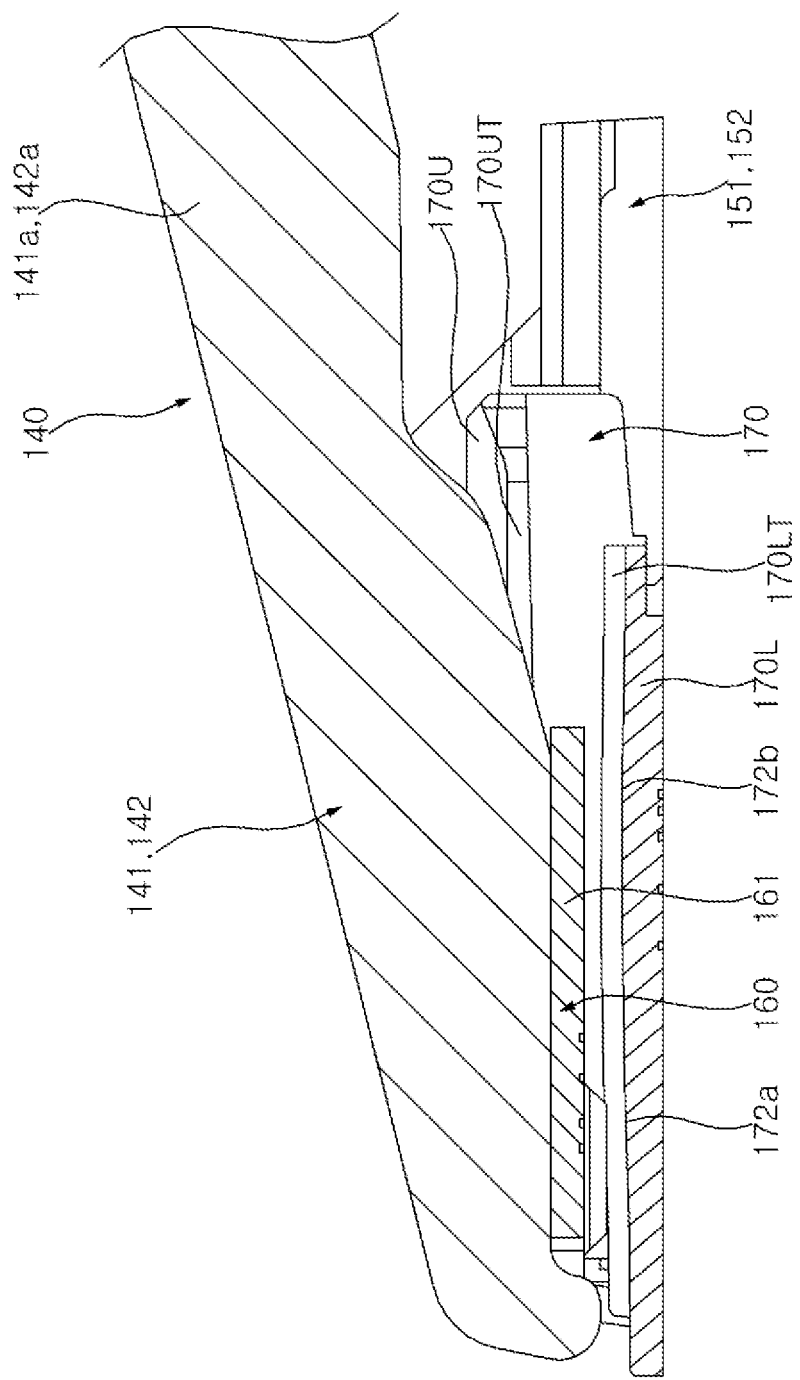

Referring to FIG. 30 along with FIG. 26, the slide bracket 160, to which the wing 140 is coupled, may be inserted into or coupled to the guide cover 170 and the sliding mounts 151 and 152. As the wings 151 and 152 move by pivoting about the driving module 130, the slide bracket 160 may move on the guide cover 170 in a longitudinal direction of the wing 140.

When the wing 140 causes the display panel 110 to change from flat to curved, the slide bracket 160 may move from the first inclined surface 172a to the second inclined surface 172b. When the wing 140 causes the display panel 110, which is curved with a predetermined curvature, to change to a flat shape, the slide bracket 160 may move from the second inclined surface 172b to the first inclined surface 172a.

Referring to FIG. 30 along with FIG. 27, while the wing 140 causes the display panel 110 to change from flat to curved, the front protrusion 163 of the slide bracket 160 may slide in contact with the lower trench 172LT. The front protrusion 163 may press and rub against the lower trench 172LT. The rear protrusion 162 may slide in contact with the upper trench 172UT or may slide while being supported by the upper trench 172UT.

Referring to FIG. 30 along with FIG. 28, while the wing 140 causes the display panel 110, which is curved with a predetermined curvature, to change to a flat shape, the front protrusion 63 of the slide bracket 160 may slide in contact with the lower trench 172LT or may slide while being supported by the lower trench 172LT. The rear protrusion 162 may slide in contact with the upper trench 172UT or may slide while being supported by the upper trench 172UT.

Accordingly, when the display panel 110 is curved, the display panel 110 curved with a predetermined curvature may have a constant curvature or a curvature close to the constant curvature.

Figure 31:
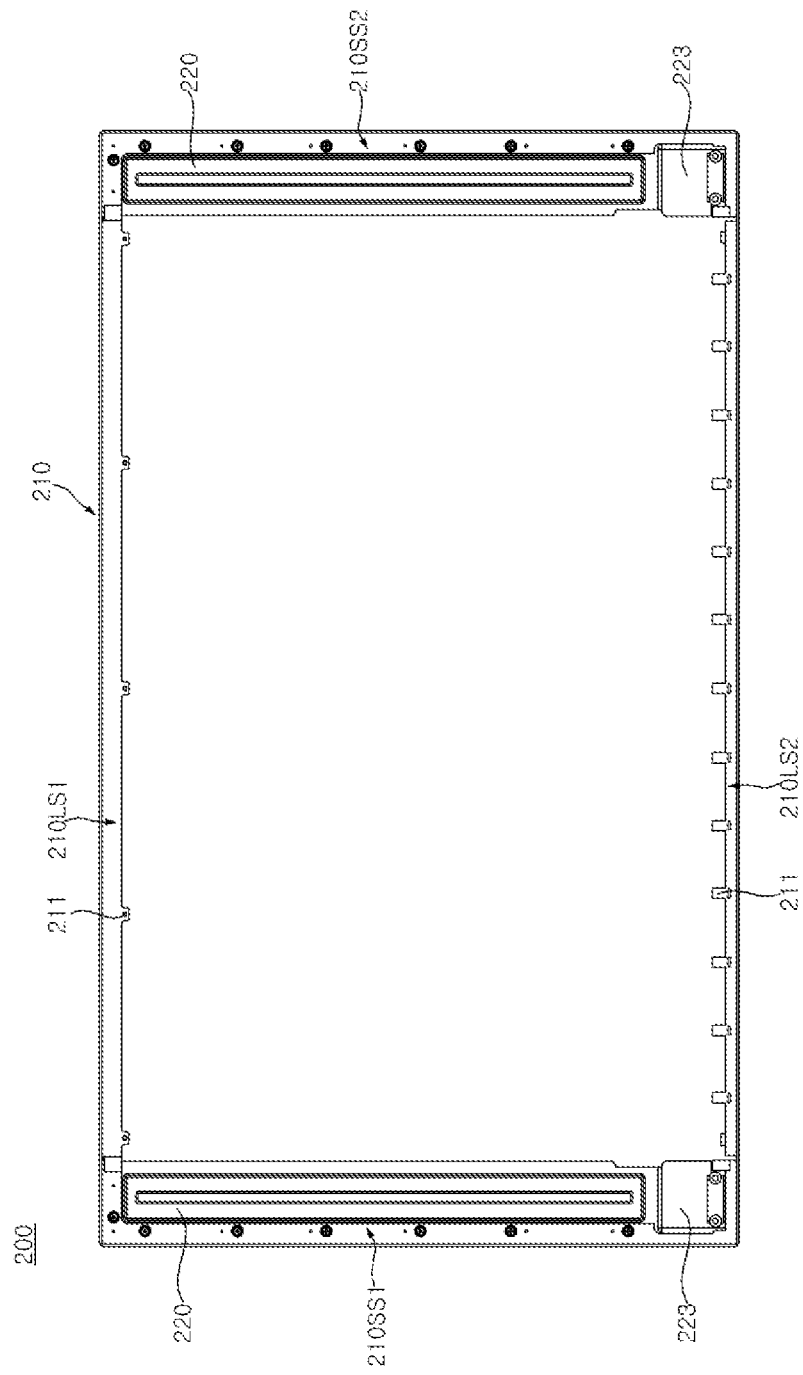
Figure 32:
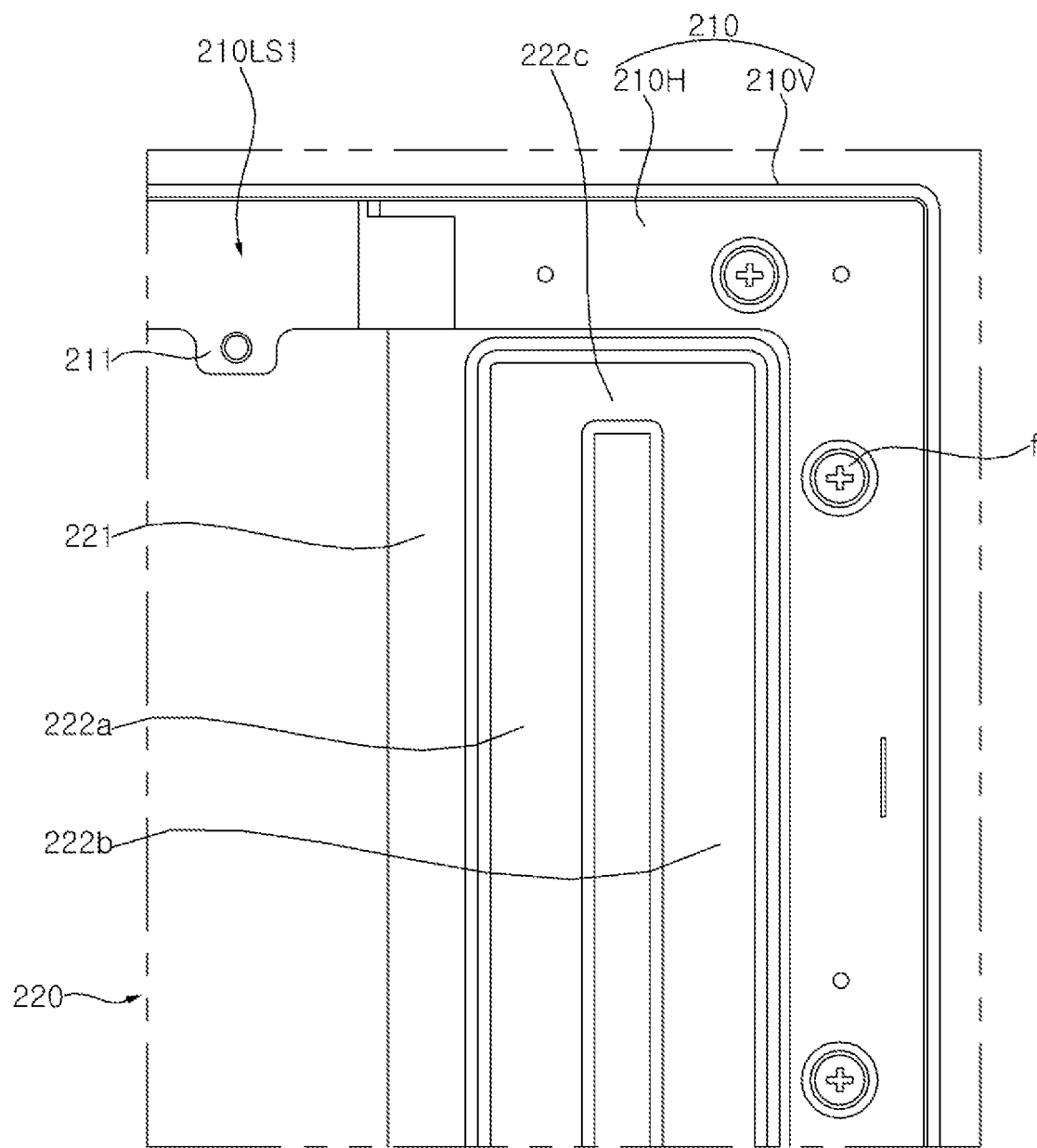

Referring to FIGS. 31 and 32, the plate 120 (see FIG. 2) may be referred to as a bottom cover 120 and 200 or a rear cover 120 and 200. The bottom cover 200 may include a main frame 210 and a side bracket 220.

The main frame 210 may be a hollow rectangular frame. For example, the main frame 210 may be made of a synthetic resin. The main frame 210 may include a horizontal part 210H and a vertical part 210V. The horizontal part 210H may be elongated along the sides LS1, LS2, SS1, and SS2 of the display panel 110 in a plane direction of the display panel 110 (see FIG. 1). The vertical part 210V may extend in a direction intersecting an extending direction of the horizontal part 210H and may be formed at an edge of the horizontal part 210H. The main frame 210 may include a first long side part 210LS1, a second long side part 210LS2, a first short side part 210SS1, and a second short side part 210SS2. The first long side part 210LS1, the second long side part 210LS2, the first short side part 210SS1, and the second short side part 210SS2 may be integrally formed with each other (see FIG. 44). The main frame 210 may be flexible in a direction in which the display panel 110 is curved.

The side bracket 220 may have an elongated plate shape and may be pressed and curved. There may be a plurality of side brackets 220. The side bracket 220 may include a flat plate part 221, rib parts 222a, 222b, and 222c, and a support part 223. As the flat plate part 221 is pressed forward, the rib parts 222a, 222b, and 222c may protrude from the flat plate part 221. The rib parts 222a, 222b, and 222c may include a first rib 222a, a second rib 222b, and a connection part 222. The first rib 222a may be parallel to the second rib 222b, and the connection part 222c may connect the ends of the first rib 222a and the second rib 222b. The support part 223 may be pressed rearward from the flat plate part 221 to protrude from the flat plate part 221. The support part 223 may be disposed at corners C3 and C4 formed between the short sides SS1 and SS2 and the long sides LS1 and LS2 of the main frame 210. The side bracket 220 may be fixed to the main frame 210 by a fastening member f. For example, the fastening member f may be a screw.

A first side bracket 220 may be disposed parallel to the first short side part 210SS1 of the main frame 210, and a second side bracket 220 may be disposed parallel to the second short side part 210SS2 of the main frame 210. The side bracket 220 may be coupled to the main frame 210. The first side bracket 220 may be coupled to the first short side part 210SS 1, and the second side bracket 220 may be coupled to the second short side part 210SS2, thereby providing rigidity to the main frame 210.

A coupling protrusion 211 may be formed on the first long side part 210LS1 and/or the second long side part 210LS2 of the main frame 210. The coupling protrusion 211 may be referred to as a coupling part 211. There may be a plurality of coupling protrusions 211. The coupling protrusion 211 may be disposed opposite the vertical part 210V with respect to the horizontal part 210H. A first plurality of coupling protrusions 211 may be formed at an edge of the first long side part 210LS1. A second plurality of coupling protrusions 211 may be formed at an edge of the second long side part 210LS2. The number of the second plurality of coupling protrusions 211 may be greater than the number of the first plurality of coupling protrusions 211.

Figure 33:
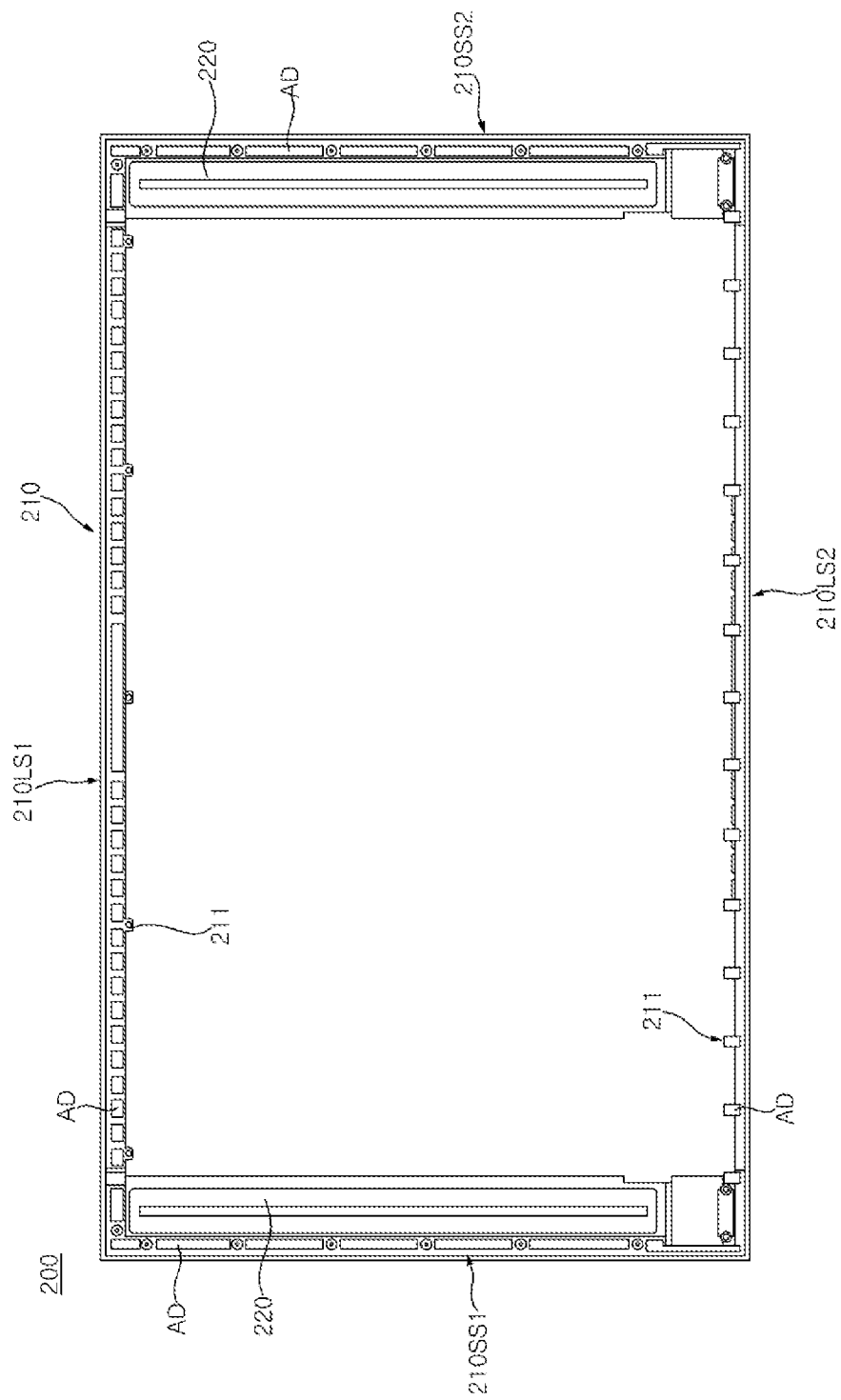
Figure 34:
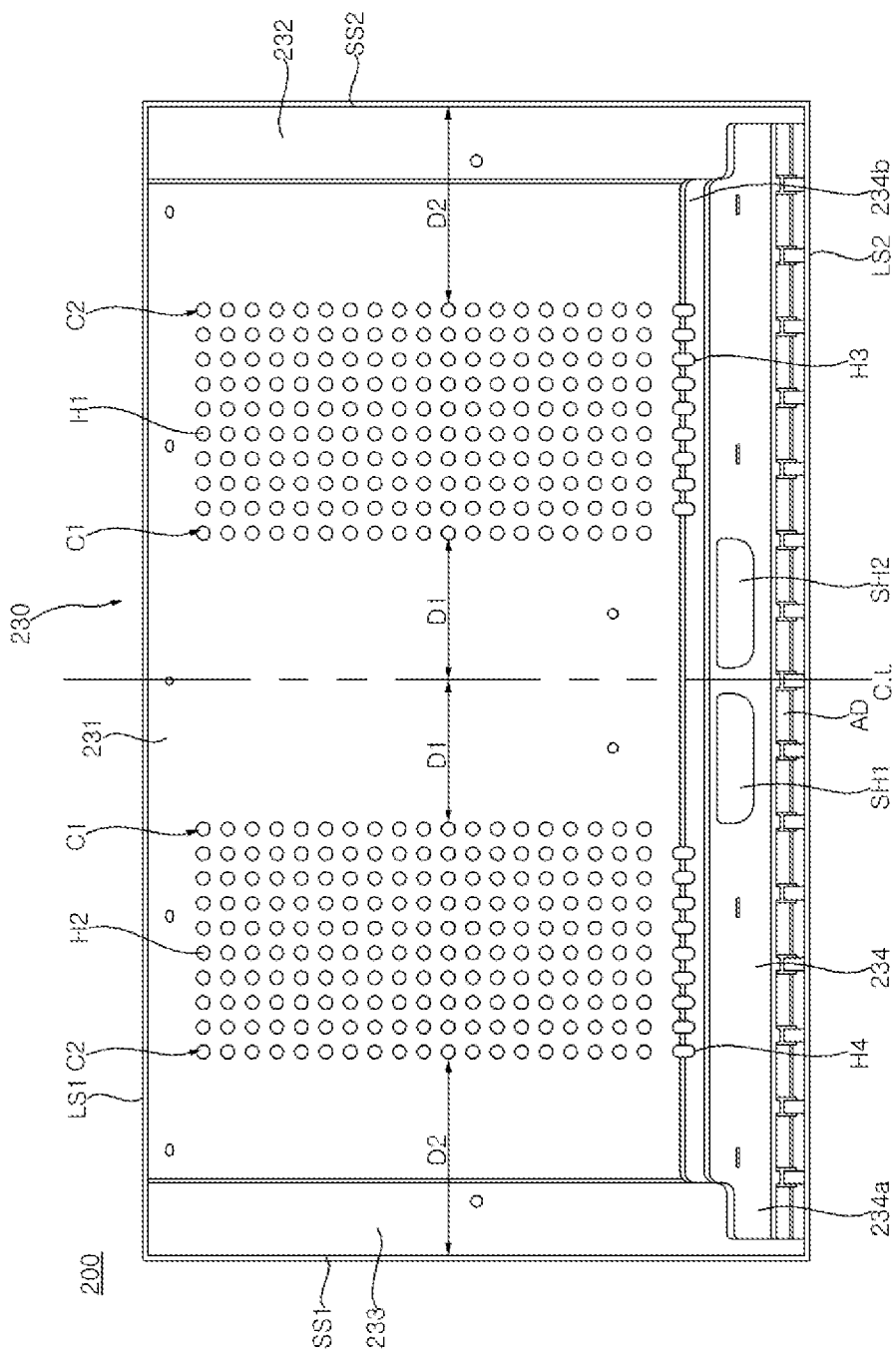

Referring to FIGS. 33 and 34, adhesive members AD may be fixed to the main frame 210. For example, the adhesive member AD may be double-sided tape. In another example, the adhesive member AD may be single-sided tape. The adhesive member AD may have elasticity. For example, the adhesive member AD may be a sponge.

The adhesive members AD may be disposed at regular intervals on the horizontal part 210H (see FIG. 32) of the first long side part 210LS1 of the main frame 210. The adhesive members AD may be fixed onto the coupling protrusions 211 to correspond to the coupling protrusions 211 of the second long side part 210LS2 of the main frame 210. The adhesive members AD may be disposed at regular intervals on the horizontal part 210H (see FIG. 32) of the first short side part 210SS1 and/or the second short side part 210SS2.

The bottom cover 200 may include an inner plate 230. The inner plate 230 may be coupled to the main frame 210 while covering the main frame 210 and/or the side bracket 220. The inner plate 230 may be fixed to the adhesive members AD.

The inner plate 230 may include a flat plate part 231, side parts 232 and 233, and a receiving part 234. For example, the inner plate 230 may include metal and may be a thin plate.

The side parts 232 and 233 may protrude by being pressed forward from the flat plate part 231. The side parts 232 and 233 may protrude while forming a step upward from the flat plate part 231. The side parts 232 and 233 may cover the side brackets 220.

The receiving part 234 may be recessed by being pressed rearward from the flat plate part 231. The receiving part 234 may be recessed while forming a step downward from the flat plate part 231. The receiving part 234 may form a plurality of steps with respect to the flat plate part 231. A boundary, at which the steps are formed between the flat plate part 231 and the receiving part 234, may be referred to as a boundary part.

Cable holes SH1 and SH2 may be formed in the receiving part 234. The cable holes SH1 and SH2 may be formed by passing through the receiving part 234. A first cable hole SH1 may extend over a first distance D1 on the left side of the inner plate 231. The second cable hole SH2 may extend over a first distance D1 on the right side of the inner plate 230.

A plurality of holes H1, H2, H3, and H4 may be formed in the flat plate part 231 of the inner plate 230. For example, the holes H1, H2, H3, and H4 may have a circular shape or an elliptical shape. The plurality of holes H1 and H2 may form rows and columns in an up-down direction of the inner plate 230. The number of columns of the plurality of holes H1 and H2 may be smaller than the number of rows thereof. For example, the number of columns of the plurality of holes H1 and H2 may be 10. In another example, the number of rows of the plurality of holes H1 and H2 may be 19. For example, the plurality of holes H1 and H2 may have a circular shape and may be formed at equal intervals.

The plurality of holes H3 and H4 may be formed in the boundary part at which the steps are formed between the flat plate part 231 and the receiving part 234. For example, the plurality of holes H3 and H4 may be long holes or may have an elliptical shape. A major axis of the holes H3 and H4 may be vertically aligned. The number of the holes H3 and H4 formed in the boundary part may be smaller than the number of the holes H1 and H2 formed in the flat plate part 231.

The first distance D1 from a center line CL of the inner plate 230 to a first outermost column C1 of the plurality of holes H1 and H2 may be smaller than a second distance D2 from the first short side SS1 and/or the second short side SS2 of the inner plate 230 to a second outermost column C2 of the plurality of holes H1 and H2.

Accordingly, when the inner plate 230 is curved, a constant curvature or a curvature close to the constant curvature may be achieved.

Figure 35:
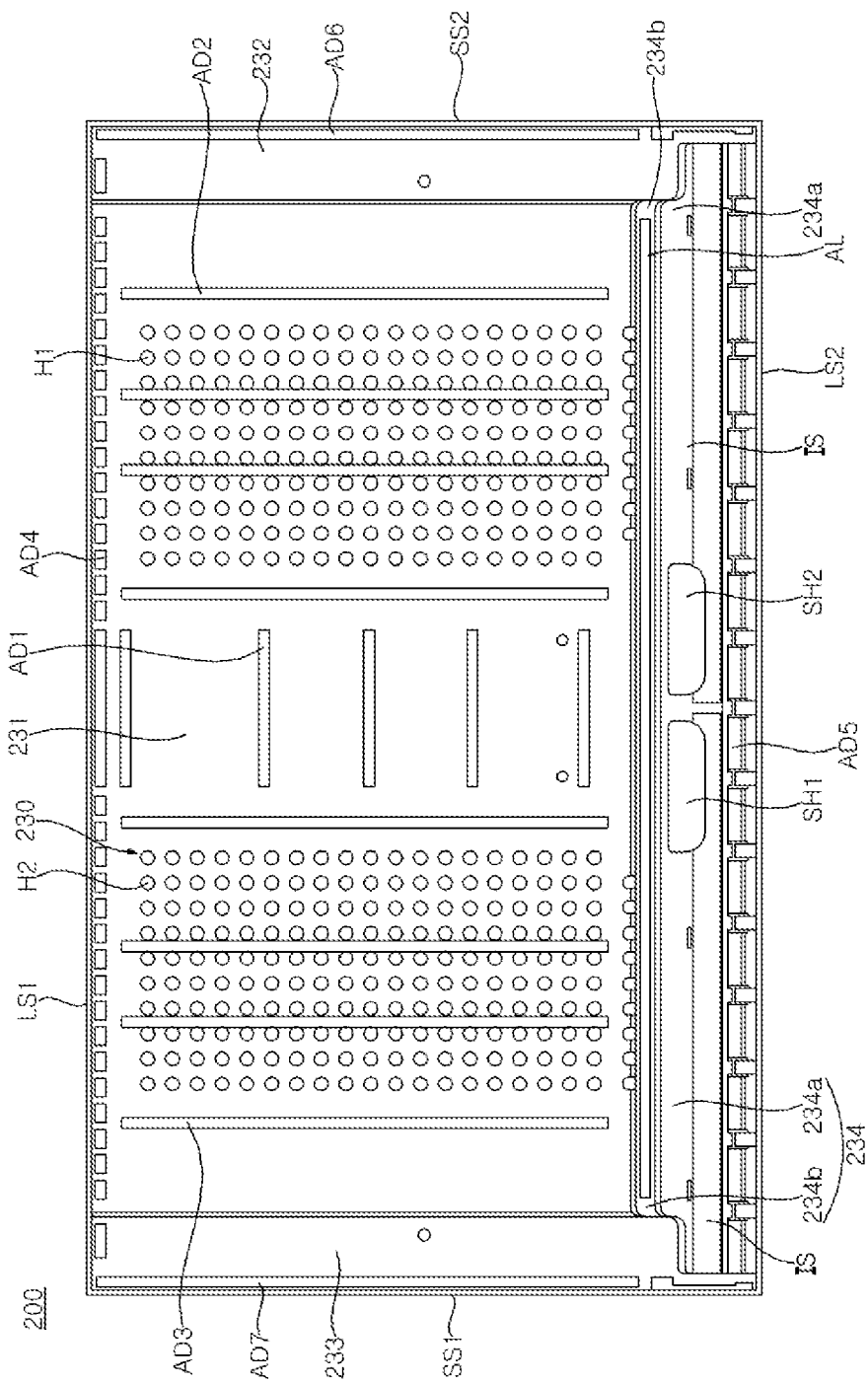

Referring to FIG. 35, a first adhesive member AD1 may be fixed to a central region of the inner plate 230. The first adhesive member AD1 may be elongated horizontally to be fixed to the central region of the inner plate 230. A plurality of first adhesive members AD1 may be vertically spaced apart from each other to be adhered to the inner plate 230. For example, the first adhesive member AD1 may be single-sided tape. The central region of the inner plate 230 and the first adhesive member AD1 may support the center of the display panel 110 (see FIG. 2). As the display panel 110 is curved, the display panel 110 may be curved with a curvature that is symmetrical with respect to the center of the display panel 110.

A second adhesive member AD2 may be disposed between the first adhesive member AD1 and the second short side SS2 of the inner plate 230. The second adhesive member AD2 may be elongated vertically to be fixed to the inner plate 230. A plurality of second adhesive members AD2 may be horizontally spaced apart from each other to be adhered to the inner plate 230. For example, the second adhesive member AD2 may be double-sided tape. As the display panel 110 is curved, the display panel 110 fixed to the second adhesive member AD2 may slip relative to the inner plate 230, and the second adhesive member AD2 may be deformed in the horizontal direction in response to the relative slip occurring between the display panel 110 and the inner plate 230.

A third adhesive member AD3 may be disposed between the first adhesive member AD1 and the first short side SS1 of the inner plate 230. The third adhesive member AD3 may be elongated vertically to be fixed to the inner plate 230. A plurality of third adhesive members AD3 may be horizontally spaced apart from each other to be adhered to the inner plate 230. For example, the third adhesive member AD3 may be double-sided tape. As the display panel 110 is curved, the display panel 110 fixed to the third adhesive member AD3 may slip relative to the inner plate 230, and the third adhesive member AD3 may be deformed in the horizontal direction in response to the relative slip occurring between the display panel 110 and the inner plate 230. A length, width, and position of the third adhesive member AD3 may be symmetric to the second adhesive member AD2 with respect to the first adhesive member AD1. Accordingly, the display panel 110 may be curved symmetrically.

A fourth adhesive member AD4 may be disposed along the first long side LS1 of the inner plate 230. There may be a plurality of fourth adhesive members AD4, and the plurality of fourth adhesive members AD4 may form a short segment. The plurality of fourth adhesive members AD4 are sequentially arranged along the first long side LS1 of the inner plate 230 and may be spaced apart from each other. For example, the fourth adhesive member AD4 may be double-sided tape. Accordingly, as the display panel 110 is curved, the fourth adhesive member AD4 may respond to the slip occurring between the display panel 110 and the inner plate 230 and may improve coupling between the display panel 110 and the inner plate 230.

A fifth adhesive member AD5 may be disposed along the second long side LS2 of the inner plate 230. The fifth adhesive member AD5 may be disposed between the coupling parts 211 of the main frame 210 and may be fixed to the receiving part 234 of the inner plate 230. There may be a plurality of fifth adhesive members AD5, and the plurality of fifth adhesive members AD5 may form a segment. The fifth adhesive member AD5 may be longer than the fourth adhesive member AD4. For example, the fifth adhesive member AD5 may be double-sided tape.

A sixth adhesive member AD6 may be elongated to be fixed to the inner plate 230 at a position parallel to and adjacent to the second short side SS2 of the inner plate 230. A seventh adhesive member AD7 may be elongated to be fixed to the inner plate 230 at a position parallel to and adjacent to the first short side SS1 of the inner plate 230. For example, the sixth adhesive member AD6 and/or the seventh adhesive member AD7 may be double-sided tape.

An insulation sheet IS may be fixed to the receiving part 234 of the inner plate 230. The insulation sheet IS may be elongated along the second long side LS2 of the inner plate 230, and may be disposed parallel to the second long side LS2 of the inner plate 230 at a position adjacent to the coupling part 211 of the main frame 210 (see FIG. 30). A source PCB of the display panel 110 may be disposed in the receiving part 234, and the insulation sheet IS may prevent electrical short circuit between the inner plate 230, including metal, and the source PCB.

A gasket AL may be fixed to the inner plate 230. For example, the gasket AL may include aluminum. The gasket AL may be elongated and may be disposed in the receiving part 234. The receiving part 234 may form a plurality of steps with respect to the flat plate part 231. The receiving part 234 may include a first receiving part 234b which is stepped downward from the flat plate part 231, and a second receiving part 234a which is stepped downward from the first receiving part 234b. The gasket AL may be disposed in the first receiving part 234b.

Figure 36:
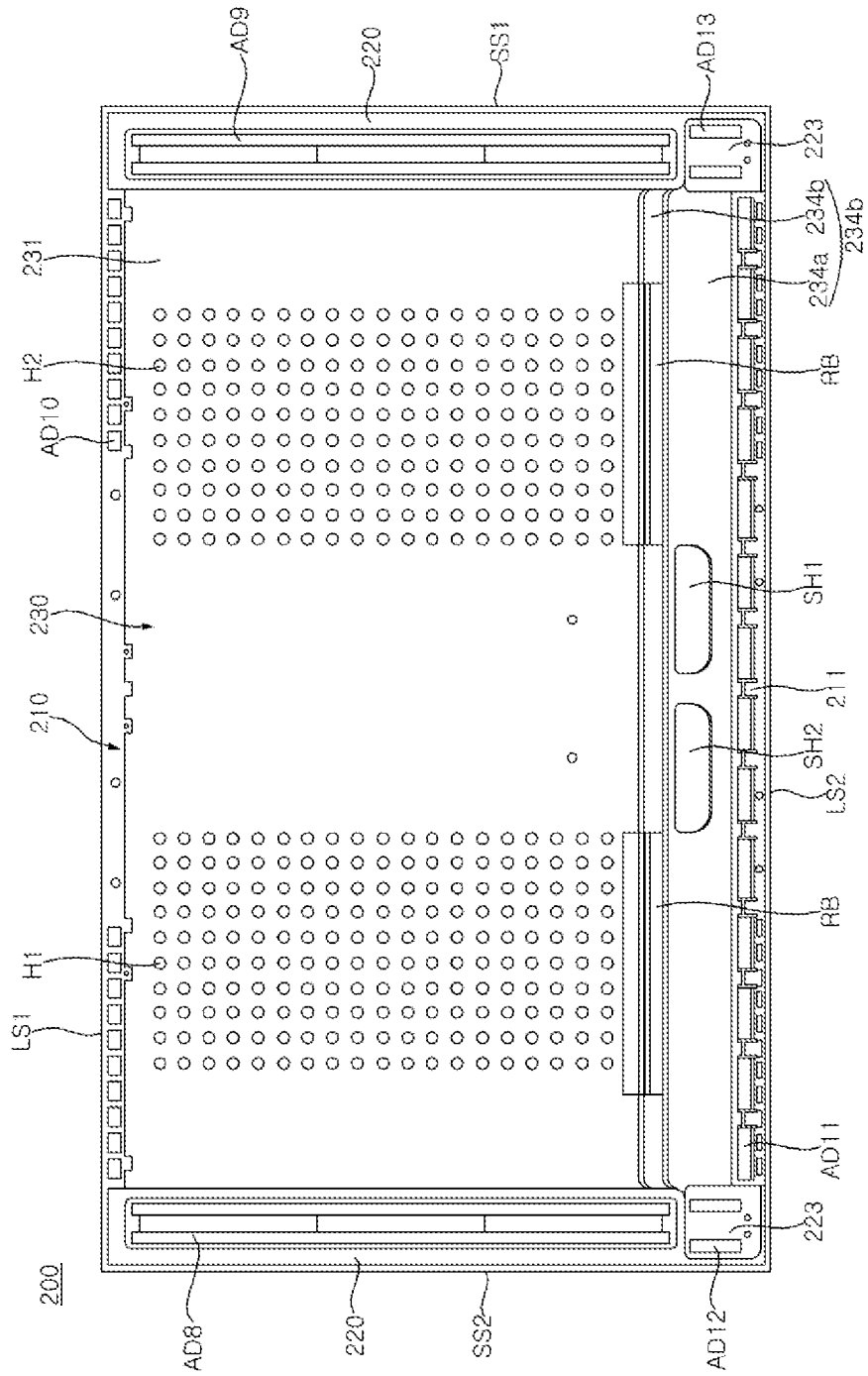
Figure 37:
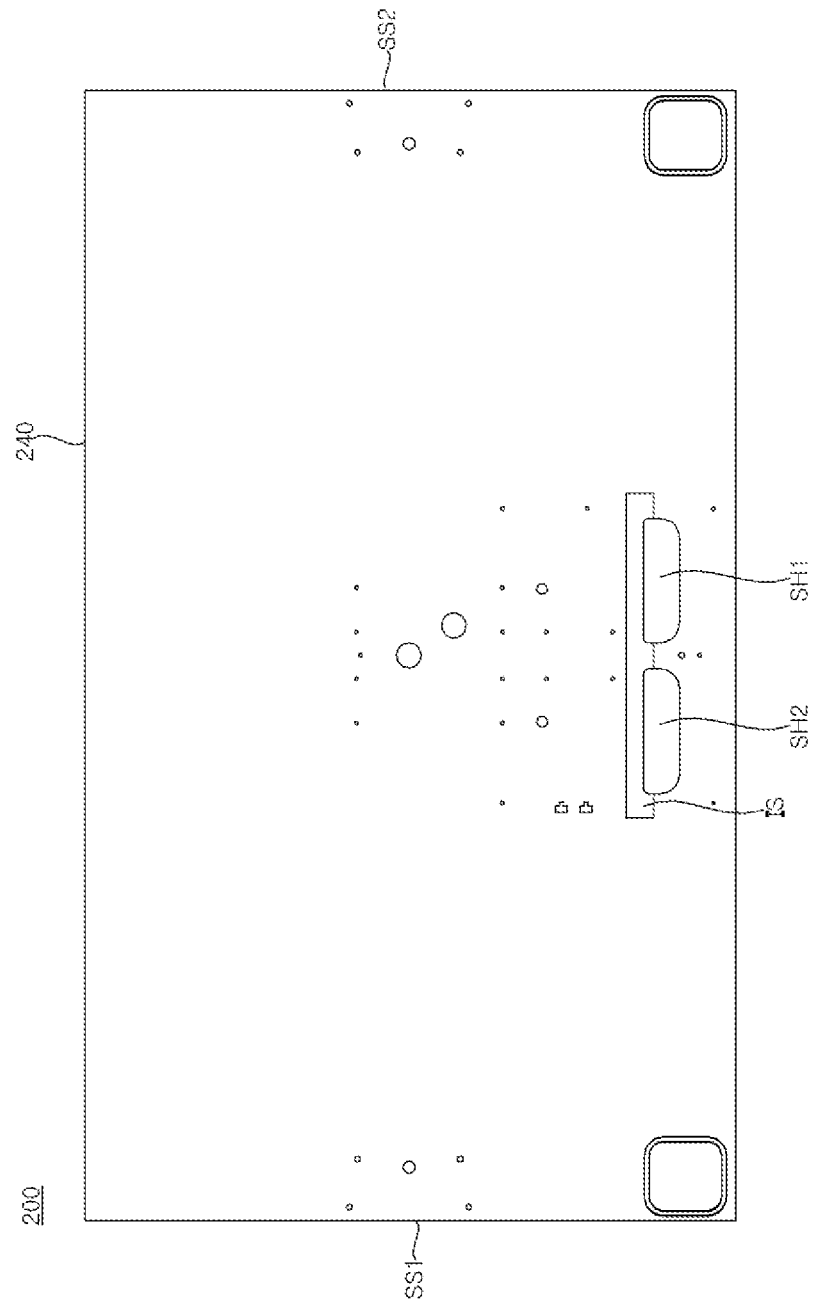

Referring to FIGS. 36 and 37, a buffering member RB may be fixed to a rear surface of the inner plate 230. The buffering member RB may be referred to as an insulation member RB. The buffering member RB may be adhered to a rear surface of the flat plate part 231 and/or a rear surface of the receiving part 234. For example, the buffering member RB may be rubber and may be adhered to the rear surface of the flat plate part 231 and a rear surface of the first receiving part 234. In another example, the buffering member RB may be insulation tape.

An eighth adhesive member AD8 and/or a ninth adhesive member AD9 may be fixed to a rear surface of the side bracket 220. The eighth adhesive member AD8 may be elongated and disposed parallel to the second short side SS2 of the main frame 210. The ninth adhesive member AD9 may be elongated and disposed parallel to the first short side SS1 of the main frame 210.

Tenth adhesive members AD10 may include a plurality of segments and may be sequentially arranged along the first long side LS1 of the main frame 210. An eleventh adhesive member AD11 may be fixed to the rear surface of the receiving part 234 at a position adjacent to the second long side LS2 of the main frame 210. There may be a plurality of eleventh adhesive members AD11, and the plurality of eleventh adhesive members AD11 may be disposed between the coupling parts 211 of the main frame 210.

A twelfth adhesive member AD12 and/or a thirteenth adhesive member AD13 may be fixed to a rear surface of the support part 223 of the side bracket 220.

The bottom cover 200 may include an outer plate 240. The outer plate 240 disposed at the rear of the inner plate 230 may be fixed to the main frame 210 and/or the rear surface of the side bracket 220. For example, the outer plate 240 may be a flexible thin metal plate. In another example, the outer plate 240 may be a flexible thin plastic plate.

The outer plate 240 may include the cable holes SH1 and SH2. The cable holes SH1 and SH2 may include a first cable hole SH1 and a second cable hole SH2. The first cable hole SH1 of the outer plate 240 may correspond to the second cable hole SH2 of the inner plate 230, and the second cable hole SH2 of the outer plate 240 may correspond to the first cable hole SH1 of the inner plate 220.

The insulation sheet IS may be fixed to a front surface of the outer plate 240 at a position adjacent to the cable holes SH1 and SH2. The insulation sheet IS may be adhered to the front surface of the outer plate 240 while covering edges of the cable holes SH1 and SH2.

Figure 38:
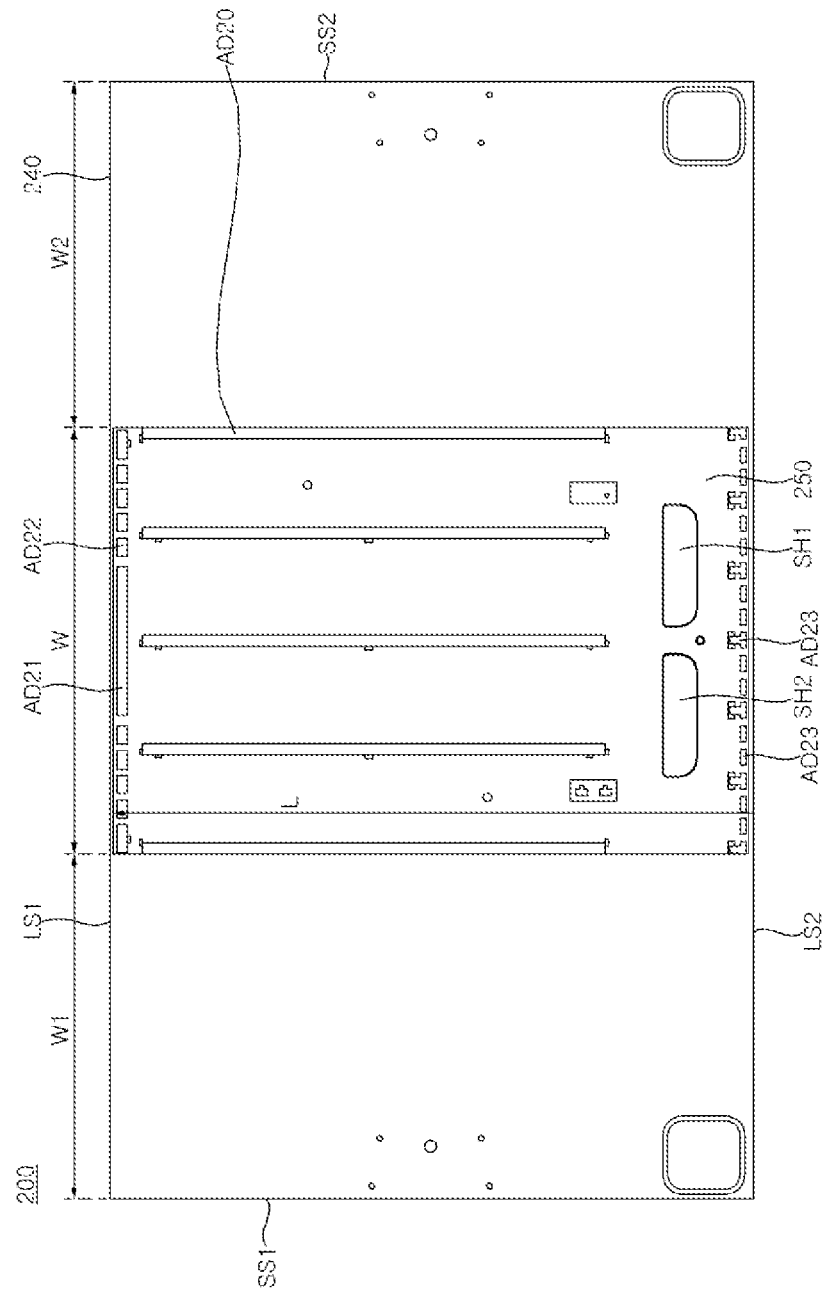

Referring to FIG. 38, the bottom cover 200 may include a rear plate 250. The rear plate 250 may be referred to as a center plate 250. The rear plate 250 may be coupled between the inner plate 230 and the outer plate 240. The rear plate 250 may be fixed to the front surface of the outer plate 240 by an adhesive member AD (not shown). In addition, the rear plate 250 may be fixed to the rear surface of the inner plate 230 by the adhesive member AD. A size of the rear plate 250 may be smaller than a size of the outer plate 240. For example, the rear plate 250 may be a thin metal plate. A thickness of the rear plate 250 may be smaller than a thickness of the outer plate 240. For example, the outer plate 240 may have a thickness of 0.5 mm, and the rear plate 250 may have a thickness of 0.4 mm. The rear plate 250 may reinforce the bending rigidity of a center portion of the bottom cover 200.

A length L of the rear plate 250 may be equal to or slightly smaller than a length of the first short side SS1 and/or a length of the second short side SS2. A width W of the rear plate 250 may be smaller than a length of the first long side LS1 and/or a length of the second long side LS2 of the outer plate 240. For example, a first distance W1 from the first short side SS1 of the outer plate 240 to the rear plate 250 may be equal to a second distance W2 from the second short side SS2 of the outer plate 240 to the rear plate 250. In another example, the width W of the rear plate 250 may be greater than the first distance W1 and/or the second distance W2.

The rear plate 250 may have cable holes SH1 and SH2. The cable holes SH1 and SH2 of the rear plate 250 may correspond to the cable holes SH1 and SH2 of the inner plate 230 and the outer plate 240.

A twentieth adhesive member AD20 may be elongated in an up-down direction of the rear plate 250. There may be a plurality of twentieth adhesive members AD20 which may be spaced apart from each other in a left-right direction of the rear plate 250.

A twenty-first adhesive member AD21 may be elongated along an upper side of the rear plate 250 and may be fixed to a front surface of the rear plate 250. A plurality of twenty-second adhesive members AD22 may be provided and may be short segments. The twenty-second adhesive members AD22 may be sequentially arranged along the upper side of the rear plate 250. The twenty-second adhesive members AD22 may be spaced apart from each other.

A twenty-third adhesive members AD23 may be sequentially arranged along a lower side of the rear plate 250 and may be fixed to the front surface of the rear plate 250. A plurality of twenty-third adhesive members AD23 may be provided and may be spaced apart from each other. The twenty-third adhesive members AD23 may be formed as short segments.

Figure 39:
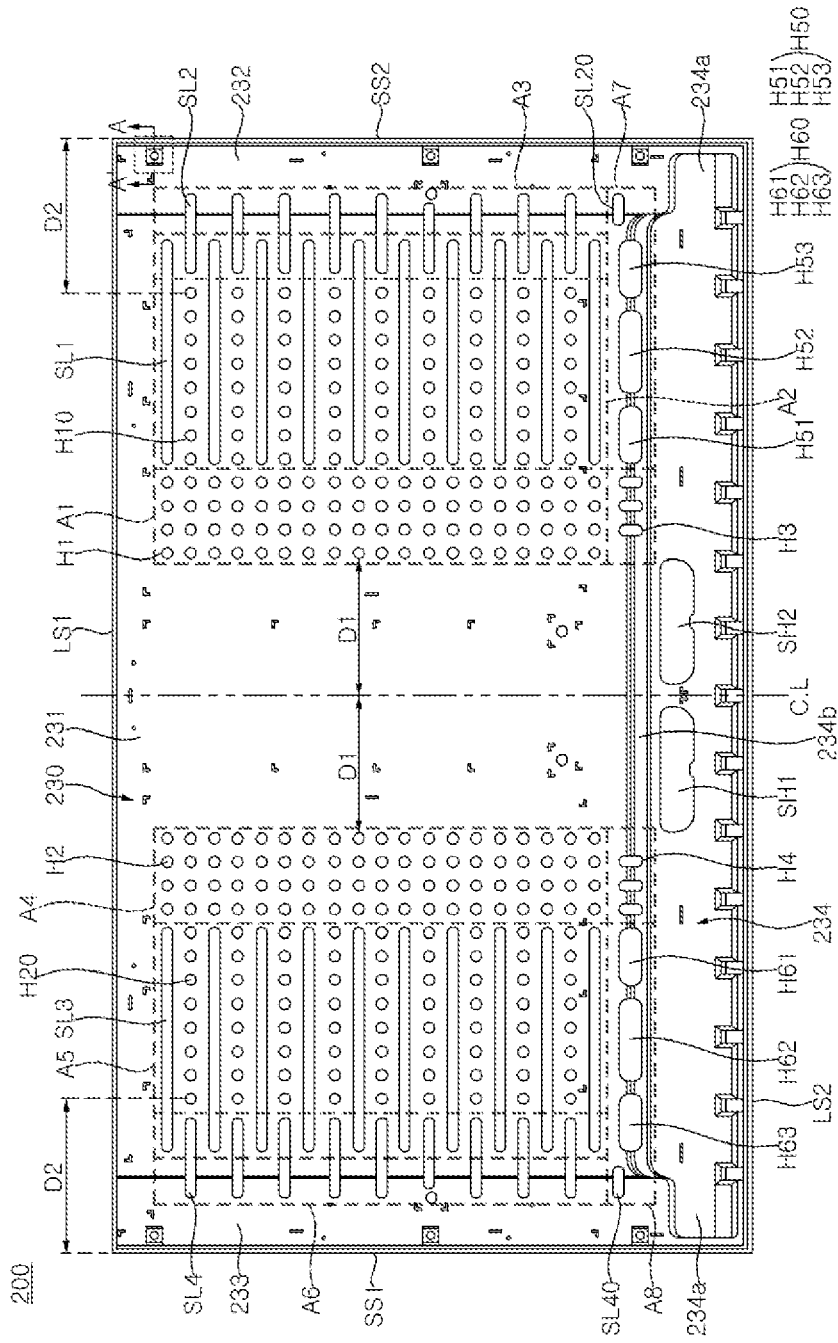
Figure 40:
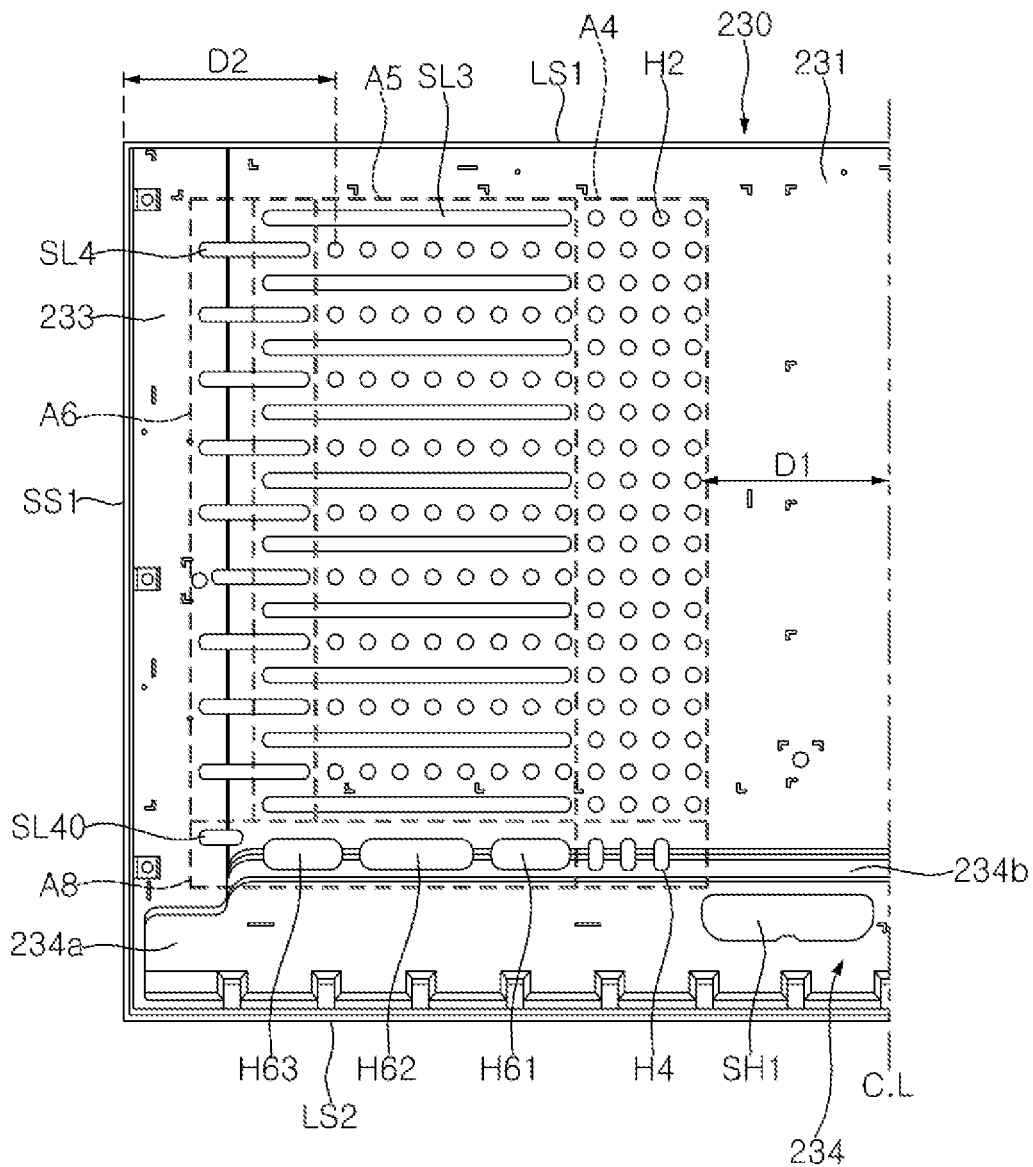
Figure 41:
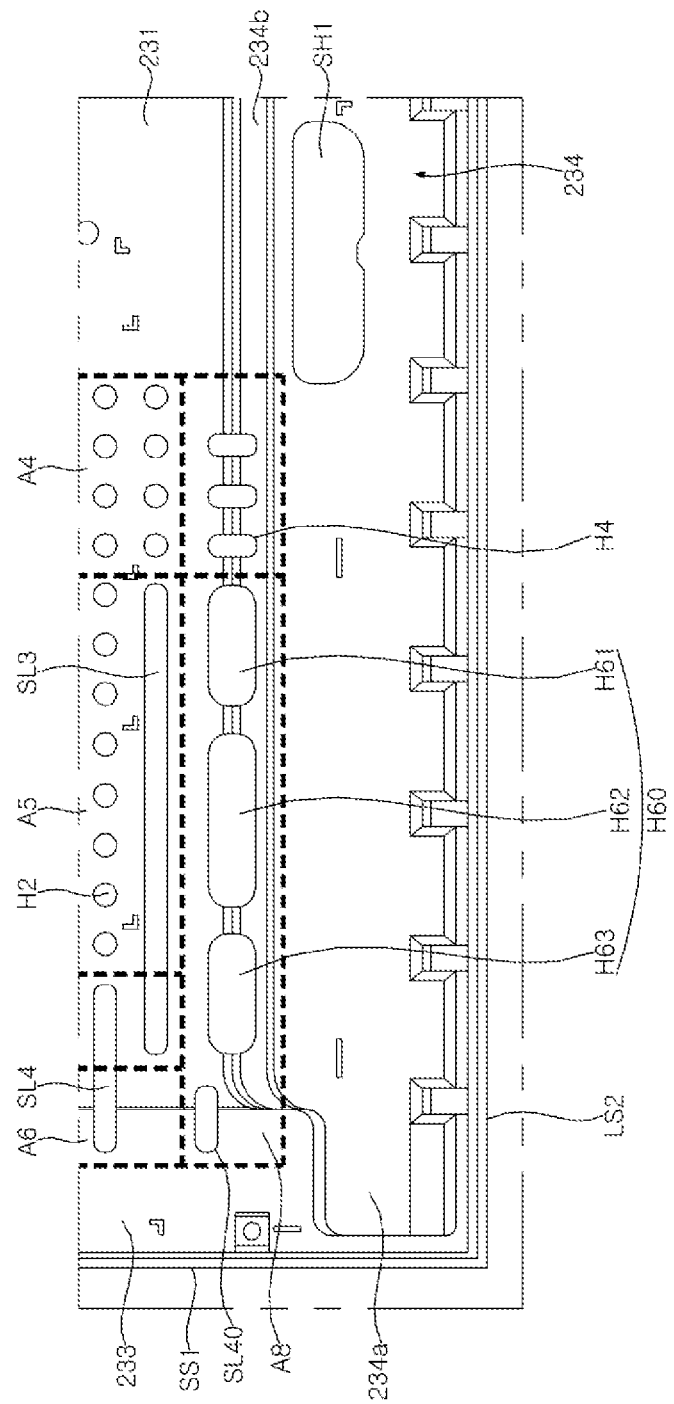

Referring to FIGS. 39 to 41, as the inner plate 230 may be axisymmetric with respect to a center line CL, a configuration of the left side of the inner plate 230 will be described below while a description of the right side, which is symmetrical to the left side, may be omitted (see FIGS. 40 and 41).

A plurality of holes H may be formed in the flat plate part 231 of the inner plate 230. A plurality of slits SL may be formed in the flat plate part 231 of the inner plate 230 and/or the side parts 232 and 233. The plurality of slits SL may include long slits SL1 and SL3 and short slits SL2 and SL4. The plurality of holes H may be spaced apart by a first distance D1 from the center line CL of the inner plate 230. The plurality of holes H may be formed in the flat plate part 231 while forming rows and columns.

A first plurality of holes H1 may be formed on the right side of the center line CL of the inner plate 230 and may form a rectangular shape which is elongated in an up-down direction of the inner plate 230. For example, the first plurality of holes H1 may form 19 rows and 4 columns. The holes H1 may be arranged at regular intervals. An area in which the first plurality of holes H1 are formed may be referred to as a first area A1.

A first plurality of long slits SL1 may be formed on the right side of the center line CL of the inner plate 230 and may be elongated horizontally. The first plurality of long slits SL1 may be vertically spaced apart from each other at regular intervals. A tenth plurality of holes H10 may be formed between the first plurality of long slits SL1. The tenth plurality of holes H10 may be sequentially arranged in a longitudinal direction of the first plurality of long slits SL1. Intervals between the tenth plurality of holes H10 may be equal to intervals between the first plurality of holes H1. An area in which the first plurality of long slits SL1 are formed may be referred to as a second area A2. The tenth plurality of holes H10 may be formed in the second area A2. The second area A2 may be adjacent to the first area A1 and may be disposed between the first area A1 and the second short side SS2. For example, a length of the second area A2 may be equal to a length of the first area A1. In another example, a width of the second area A2 may be greater than a width of the first area A1.

A third area A3 may be disposed between the second area A2 and the second short side SS2. The third area A3 may partially overlap the second area A3. The first plurality of short slits SL2 may be formed in the third area A3. The first plurality of short slits SL2 may be elongated horizontally. Each of the first plurality of short slits SL2 may be disposed between each of the first plurality of long slits SL1. A step formed at a boundary between the flat plate part 231 and the side part 232 may be formed in the third area A3. A step formed at a boundary between the flat plate part 231 and the side part 232 may be disposed outside of the second area A2 and inside the third area A3. For example, a length of the third area A3 may be equal to a length of the second area A2. In another example, a width of the third area A3 may be smaller than a width of the second area A2. In yet another example, a width of the third area A3 may be smaller than a width of the first area A1.

A second plurality of holes H2 may be located on the left side of the center line CL of the inner plate 230 and may form a rectangular shape which is elongated in the up-down direction of the inner plate 230. For example, the second plurality of holes H2 may form 19 rows and 4 columns. The holes H2 may be arranged at regular intervals. An area in which the second plurality of holes H2 are formed may be referred to as a fourth area A4.

A second plurality of long slits SL3 may be formed on the left side of the center line CL of the inner plate 230 and may be elongated horizontally. The second plurality of long slits SL3 may be vertically spaced apart from each other at regular intervals. A twentieth plurality of holes H20 may be formed between the second plurality of long slits SL3. The twentieth plurality of holes H20 may be sequentially arranged in the longitudinal direction of the second plurality of long slits SL3. Intervals between the twentieth plurality of holes H20 may be equal to intervals between the second plurality of holes H2. An area in which the second plurality of long slits SL3 are formed may be referred to as a fifth area A5. The twentieth plurality of holes H20 may be formed in the fifth area A5. The fifth area A5 may be adjacent to the fourth area A4 and may be disposed between the fourth area A4 and the first short side SS1. For example, a length of the fifth area A5 may be equal to a length of the fourth area A4. In another example, a width of the fifth area A5 may be greater than a width of the fourth area A4.

A sixth area A6 may be disposed between the fifth area A5 and the first short side SS1. The sixth area A6 may partially overlap the fifth area A5. The second plurality of short slits SL4 may be formed in the sixth area A6. The second plurality of short slits SL4 may be elongated horizontally. Each of the second plurality of short slits SL4 may be disposed between each of the second plurality of long slits SL3. A step formed at a boundary between the flat plate part 231 and the side part 233 may be formed in the sixth area A6. A step formed at a boundary between the flat plate part 231 and the side part 233 may be disposed outside of the fifth area A5 and inside the sixth area A6. For example, a length of the sixth area A6 may be equal to a length of the fifth area A5. In another example, a width of the sixth area A6 may be smaller than a width of the fifth area A5. In yet another example, a width of the sixth area A6 may be smaller than a width of the fourth area A4.

A seventh area A7 may be an area located on the right side of the center line CL of the inner plate 230 and having steps formed between the flat plate part 231 and the first receiving part 234*b* and the second receiving part 234*a*. An eighth area A8 may be an area located on the left side of the center line CL of the inner plate 230 and having steps formed between the flat plate part 231 and the first receiving part 234*b* and the second receiving part 234*a*.

There may be a plurality of third holes H3, which may be long holes elongated vertically. The third holes H3 may be formed in the seventh area A7. For example, the third holes H3 may be formed in a step at a boundary between the flat plate part 231 and the first receiving part 234b. The third holes H3 are adjacent to and below the first area A1 and may be sequentially spaced apart from each other in a width direction of the first area A1.

A fiftieth hole H50 may be formed in the seventh area A7. There may be a plurality of fiftieth holes H50, which may be long holes elongated horizontally. The fiftieth holes H50 may be formed in a step at a boundary between the flat plate part 231 and the first receiving part 234b. A fifty-first hole H51 may be disposed adjacent to the third hole H3 and the second area A2. A fifty-second hole H52 may be disposed adjacent to the second area A2 and the fifty-first hole H51. A fifty-third hole H53 may be disposed adjacent to the second area A2 and the fifty-second hole H52. The insulation member RB (see FIG. 36) may cover the fiftieth holes H50.

There may be a plurality of fourth holes H4, which may be long holes elongated vertically. The fourth holes H4 may be formed in the eighth area A8. For example, the fourth holes H4 may be formed in a step at a boundary between the flat plate part 231 and the first receiving part 234b. The fourth holes H3 are adjacent to and below the fourth area A4 and may be sequentially spaced apart from each other in a width direction of the fourth area A4.

A sixtieth hole H60 may be formed in the eighth area A8. There may be a plurality of sixtieth holes H60, which may be long holes elongated horizontally. The sixtieth holes H60 may be formed in a step at a boundary between the flat plate part 231 and the first receiving part 234b. A sixty-first hole H61 may be disposed adjacent to the fourth hole H4 and the fifth area A5. A sixty-second hole H62 may be disposed adjacent to the fifth area A5 and the sixty-first hole H61. A sixty-third hole H63 may be disposed adjacent to the fifth area A5 and the sixty-second hole H62. For example, a length of the sixty-second hole H62 may be greater than a length of the sixty-first hole H61 or a length of the sixty-third hole H63. In another example, a width of the sixty-second hole H62 may be greater than a width of the sixty-first hole H61 and/or a width of the sixty-third hole H63. The insulation member RB (see FIG. 36) may cover the sixtieth holes H60.

A third short slit SL20 may be formed in the seventh area A7 at a position adjacent to the third area A3. The third short slit SL20 may be formed in a step at a boundary between the flat plate part 231 and the side part 232. A length of the third short slit SL20 may be smaller than a length of the first short slit SL2.

A fourth short slit SL40 may be formed in the eighth area A8 at a position adjacent to the sixth area A6. The fourth short slit SL40 may be formed in a step at a boundary between the flat plate part 231 and the side part 233. A length of the fourth short slit SL40 may be smaller than a length of the second short slit SL4.

Accordingly, the inner plate 230 may be curved with a constant curvature or a curvature close to the constant curvature. In addition, when the inner plate 230 is curved to ensure rigidity and/or to store the S-PCB, it may be difficult to achieve a constant curvature for the curved inner plate 230, but in this embodiment, the problem may be solved, and the display panel 110 and the bottom cover 200 may be curved with the constant curvature or a curvature close to the constant curvature.

Figure 42:
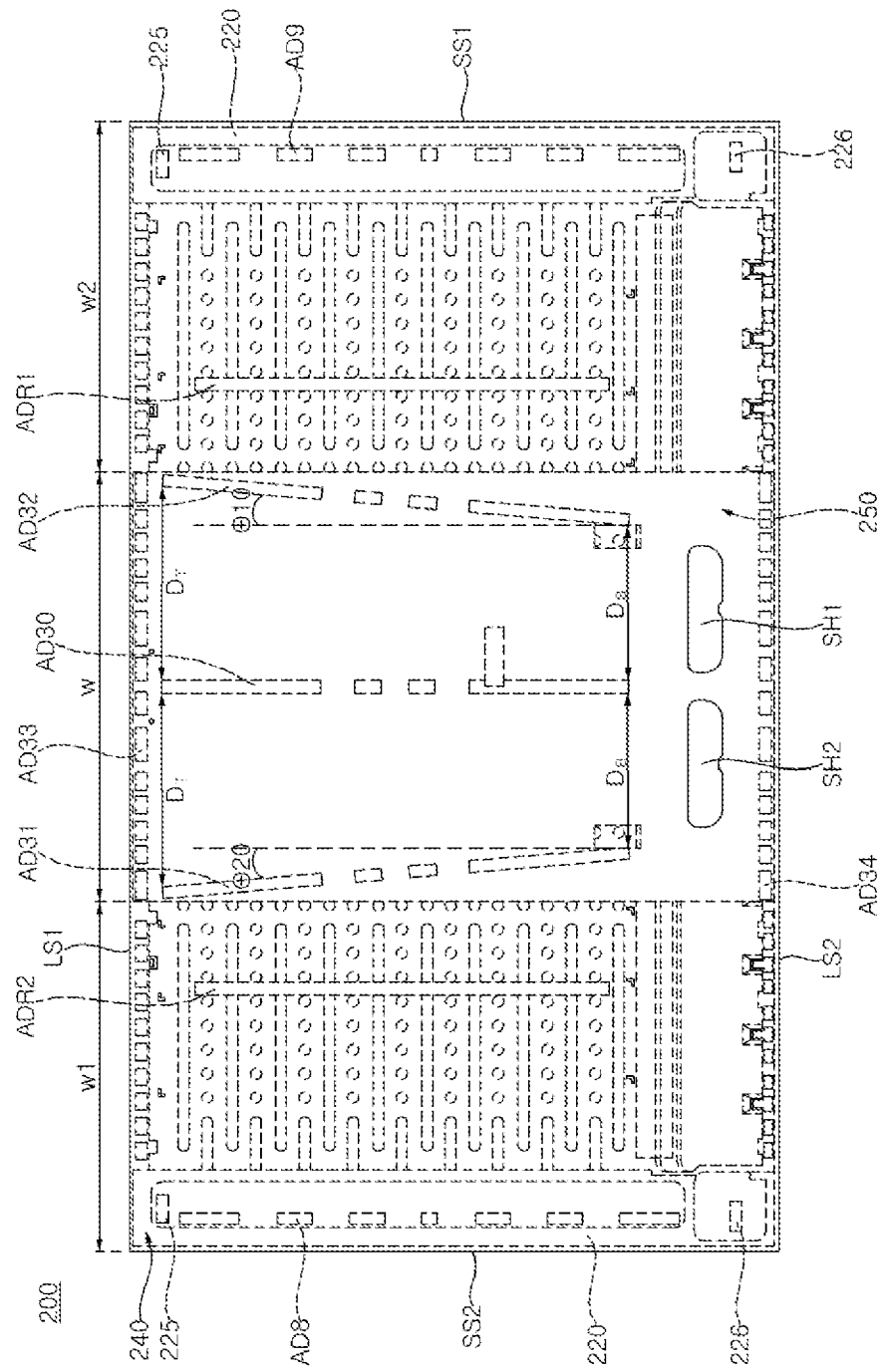
Figure 43:
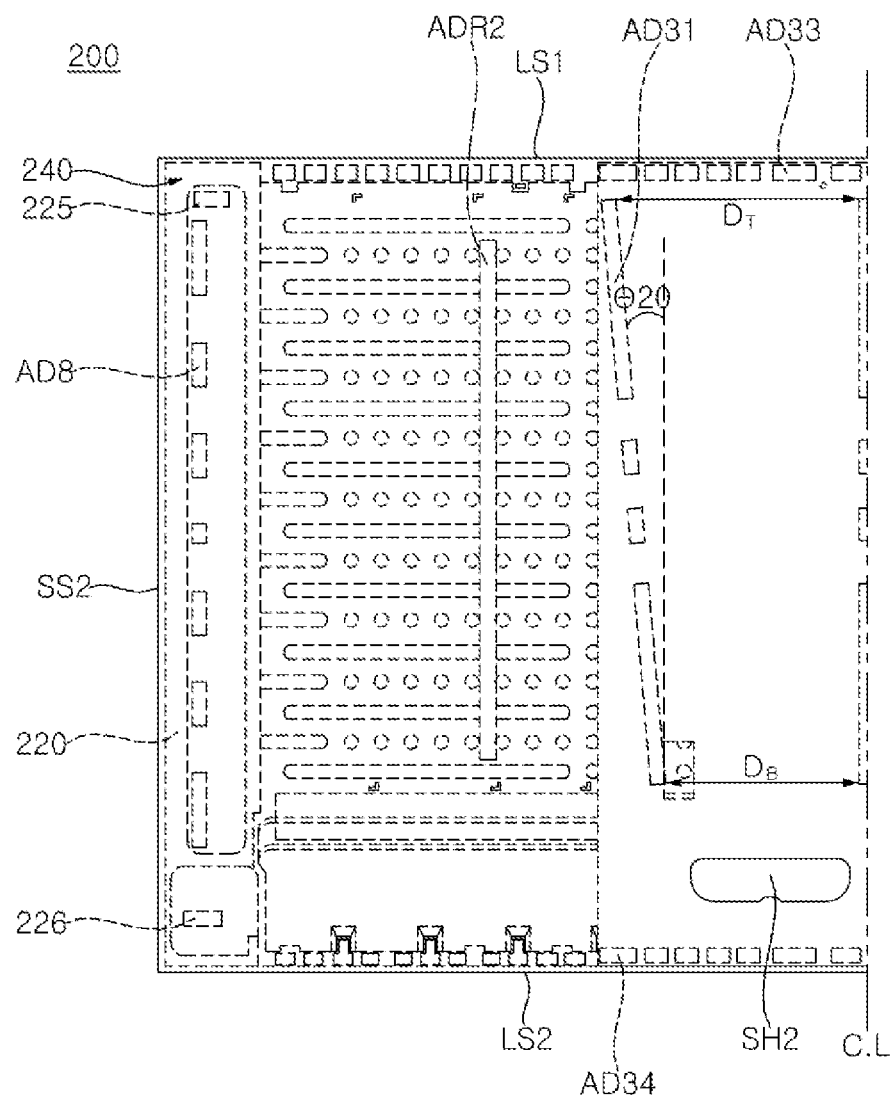

Referring to FIGS. 42 and 43, the outer plate 240 may be coupled to the rear of the inner plate 230 (see FIG. 36), and the rear plate 250 may be coupled between the outer plate 240 and the inner plate 230. The outer plate 240 may be coupled or fixed to the inner plate 230 by adhesive members AD and ADR. The eighth adhesive members AD8 disposed on a rear surface of the right side bracket 220 may be arranged in the longitudinal direction of the side bracket 220. The ninth adhesive members AD9 disposed on a rear surface of the left side bracket 220 may be disposed in the longitudinal direction of the side bracket 220. The eighth adhesive members and/or the ninth adhesive members AD9 may be formed as a plurality of segments.

Rear adhesive members ADR1 and ADR2 may be fixed to the rear surface of the inner plate 230. The rear adhesive members ADR1 and ADR2 may be elongated and disposed parallel to the up-down direction of the inner plate 230. A first rear adhesive member ADR1 may be disposed between the left side bracket 220 and the rear plate 250. The first rear adhesive member ADR1 may be disposed closer to the rear plate 250 than to the left side bracket 220.

The second rear adhesive member ADR2 may be disposed between the right side bracket 220 and the rear plate 250. The second rear adhesive member ADR2 may be disposed closer to the rear plate 250 than to the right side bracket 220.

Magnets 225 and 226 may be fixed to the side bracket 220. The outer plate 240 may be coupled to the side bracket 220 by the magnets 225 and 226. A first magnet 225 may be fixed to the rear surface of the side bracket 220 at a position adjacent to an upper end of the side bracket 220. A second magnet 226 may be fixed to the rear surface of the side bracket 220 at a position adjacent to a lower end of the side bracket 220. For example, the outer plate 240 may be a metal plate.

The rear plate 250 may be coupled between the inner plate 230 and the outer plate 240 by the adhesive member AD. The adhesive member AD may be fixed to the front surface of the outer plate 240 and the rear surface of the rear plate 250. A thirty-third adhesive member AD33 may be formed as a plurality of segments, which may be spaced apart from each other along the first long side LS1 of the outer plate 240. A thirty-fourth adhesive member AD34 may be formed as a plurality of segments, which may be spaced apart from each other along the second long side LS2 of the outer plate 240.

A thirtieth adhesive member AD30 may be elongated along the center line CL of the outer plate 240. The thirtieth adhesive member AD30 may be formed as a plurality of segments. A thirty-first adhesive member AD31 may be disposed between the right side of the rear plate 250 and the center line CL. For example, the thirty-first adhesive member AD31 may be disposed adjacent to the right side of the rear plate 250. The thirty-first adhesive member AD31 may form a twentieth angle theta20 with respect to the center line CL of the outer plate 240. For example, in the thirty-first adhesive member AD31, a distance DT from a distal end adjacent to the first long side LS1 to the center line CL may be greater than a distance DB from a distal end adjacent to the second long side LS2 to the center line CL.

A thirty-second adhesive member AD32 may be disposed between the left side of the rear plate 250 and the center line CL. For example, the thirty-second adhesive member AD32 may be disposed adjacent to the left side of the rear plate 250. The thirty-second adhesive member AD32 may form a tenth angle theta10 with respect to the center line CL of the outer plate 240. For example, in the thirty-second adhesive member AD32, the distance DT from the distal end adjacent to the first long side LS1 to the center line CL may be greater than the distance DB from the distal end adjacent to the second long side LS2 to the center line CL.

Accordingly, the display panel 110 and the bottom cover 200 including the inner plate 230, the outer plate 240, and/or the rear plate 250 may be curved with the constant curvature or a curvature close to the constant curvature. When cured at a low temperature, the adhesive member AD may decrease in flexibility and may affect a curved structure in which the module cover 200 is curved with the constant curvature or a curvature close to the constant curvature, and power consumption may increase. In this embodiment, by minimizing such effects, the module cover 200 in a flat shape may be curved with the constant curvature or a curvature close to the constant curvature.

Figure 44:
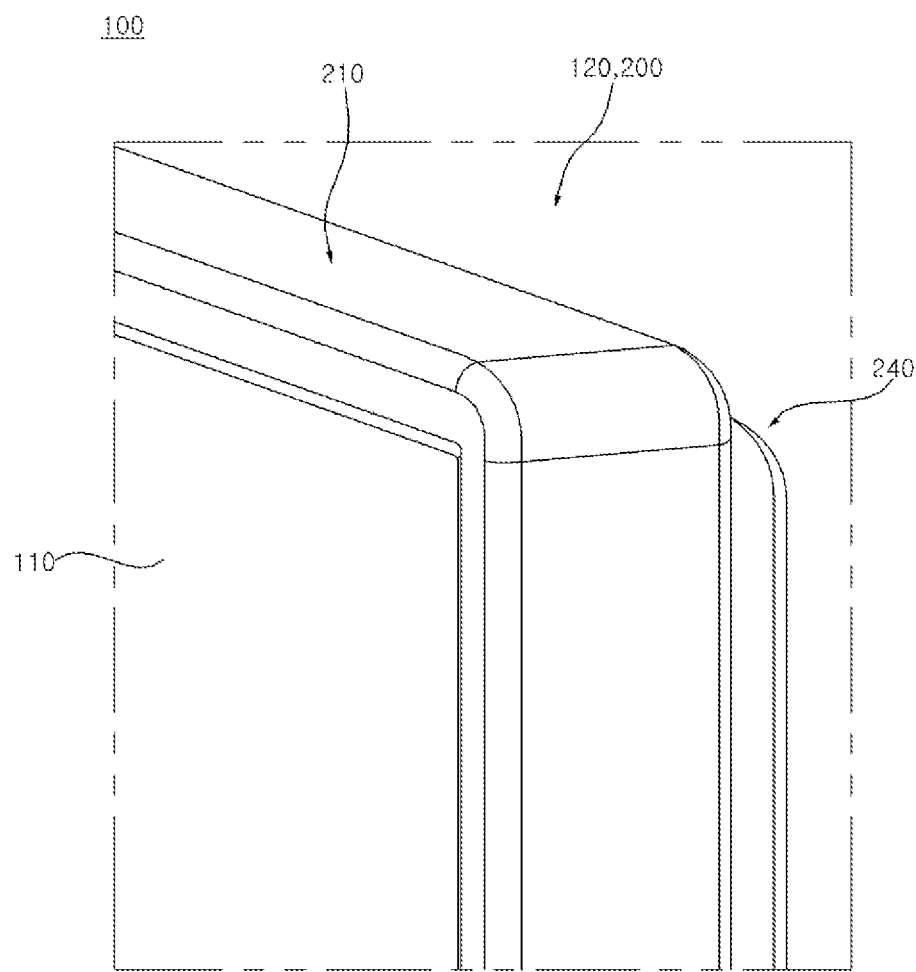
Figure 45:
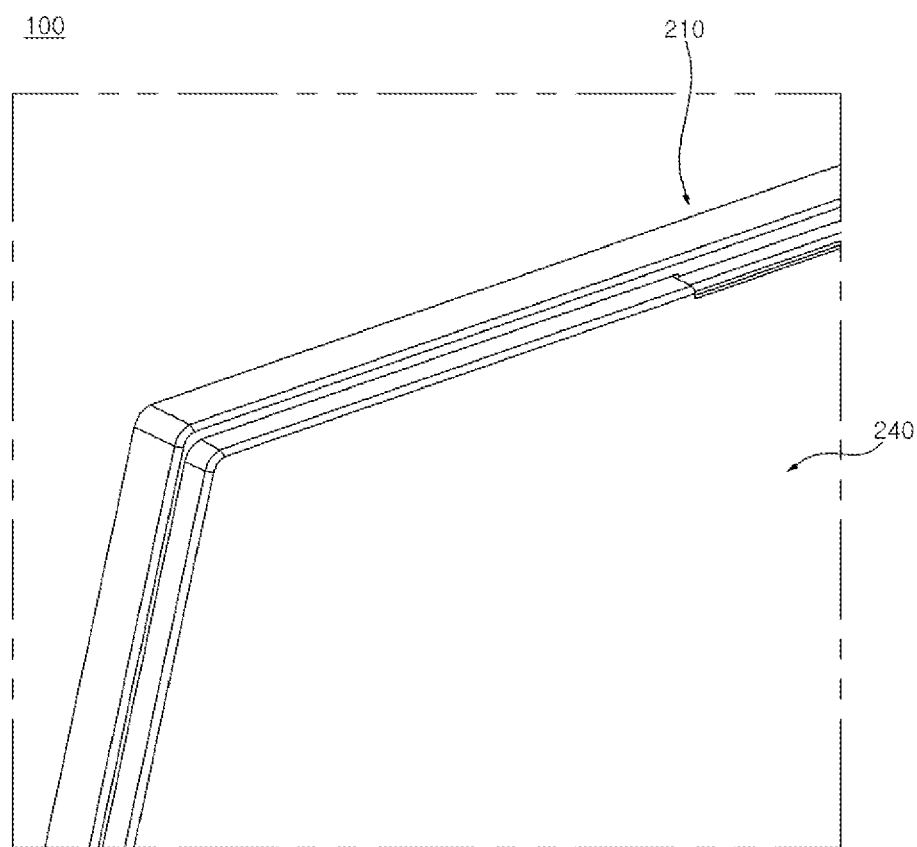
Figure 46:
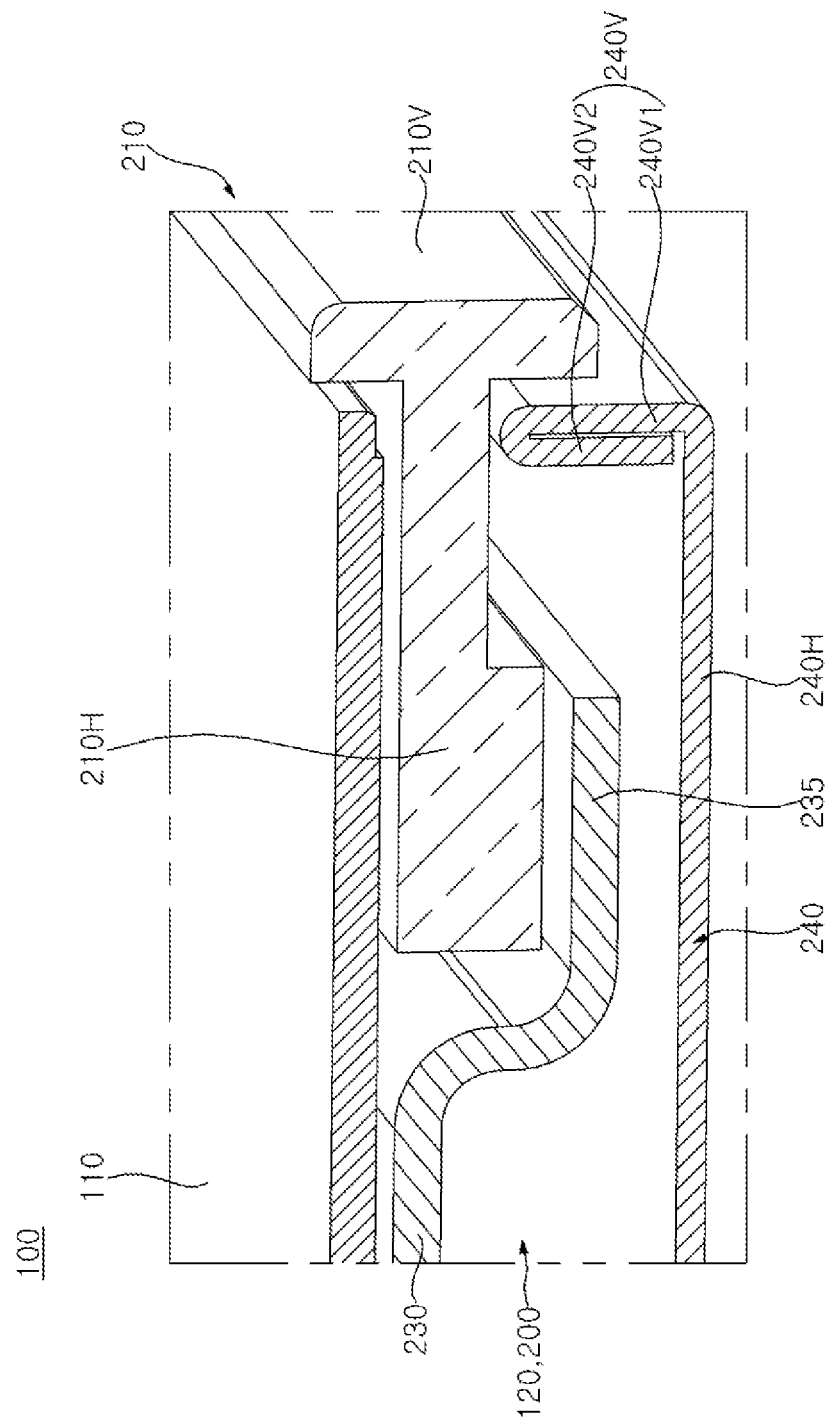

Referring to FIGS. 44 to 46, the display panel 110 may be supported by the horizontal part 210H of the main frame 210 or may be partially fixed thereto. The horizontal part 210H of the main frame 210 may extend parallel to the rear surface of the display panel 110 to face the display panel 110. The vertical part 210V of the main frame 210 may extend in a direction intersecting the horizontal part 210H. The vertical part 210V may cover a lateral surface of the display panel 110.

The inner plate 230 may face the rear surface of the display panel 110. The inner plate 230 may support the rear surface of the display panel 110. The display panel 110 may be partially fixed to the inner plate 230. The inner plate 230 may have a stepped portion 235 which is pressed and bent. A distance between the flat plate part 231 (see FIG. 35) of the inner plate 230 and the display panel 110 may be smaller than a distance between the stepped portion 235 of the inner plate 230 and the display panel 110. The horizontal part 210H of the main frame 210 may be inserted between the display panel 110 and the stepped portion 235 of the inner plate 230.

The outer plate 240 may face the rear surface of the inner plate 230. The outer plate 240 may be partially fixed to the inner plate 230. The outer plate 240 may include a flat plate part 240H and a side part 240V. The flat plate part 240H may be a thin and wide metal plate. The side part 240V may be bent from the flat plate part 240H. The side part 240V may be bent from the flat plate part 240H. The first side part 240V may include a first side part 240V1 and a second side part 240V2. The first side part 240V1 may be bent and extend from the flat plate part 240H. For example, the first side part 240V1 may be vertically bent from the flat plate part 240H. The second side part 240V2 may be bent and extend from the first side part 240V1. The second side part 240V2 may face the first side part 240V1. For example, the second side part 240V2 may extend while being folded from the first side part 240V1. The side part 240V may be disposed between the vertical part 210V of the main frame 210 and a distal end of the inner plate 230.

Accordingly, when the display panel 110 is curved, slip may occur between the display panel 110 and the inner plate 230, and slip may occur between the inner plate 230 and the outer plate 240. In addition, slip may occur between the main frame 210 and the inner plate 230. Further, the main frame 210 may move relative to the outer frame 240.

Figure 47:
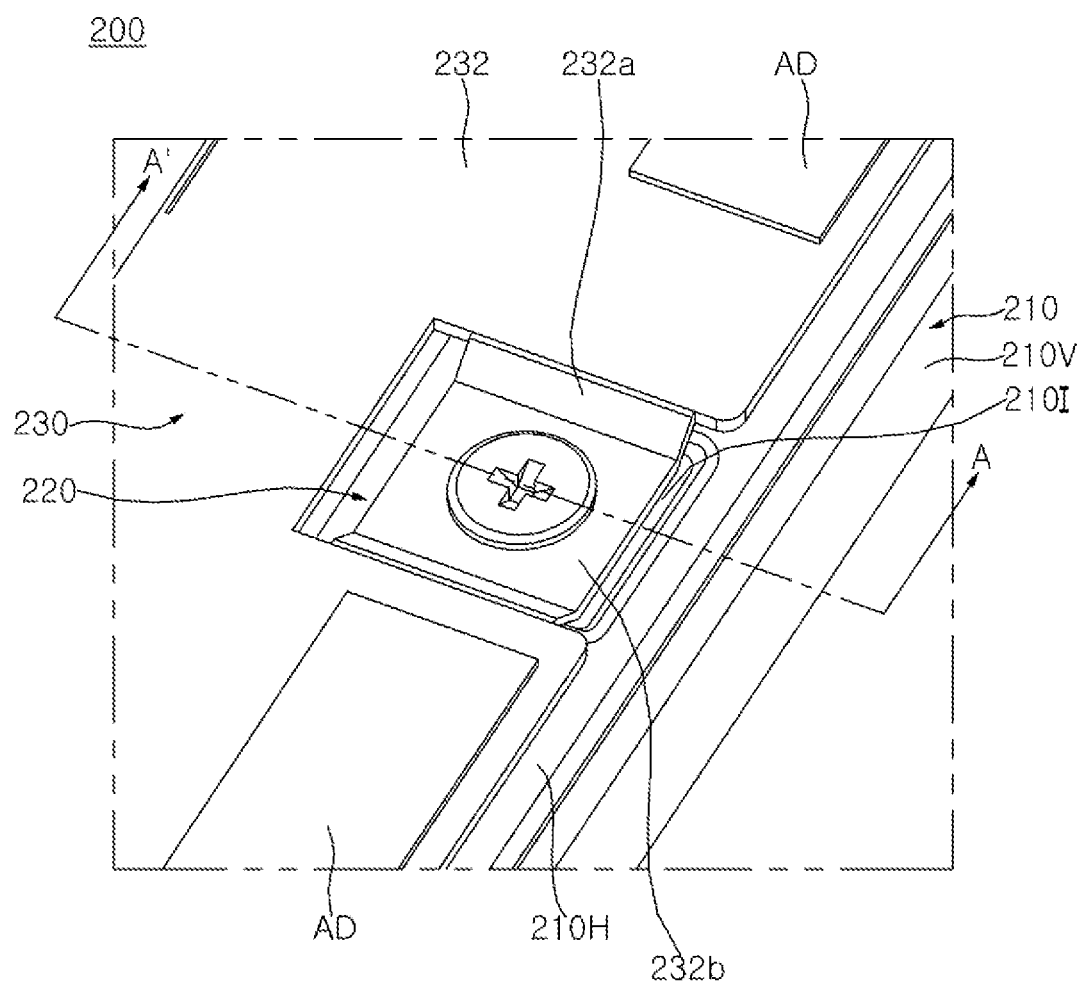
Figure 48:
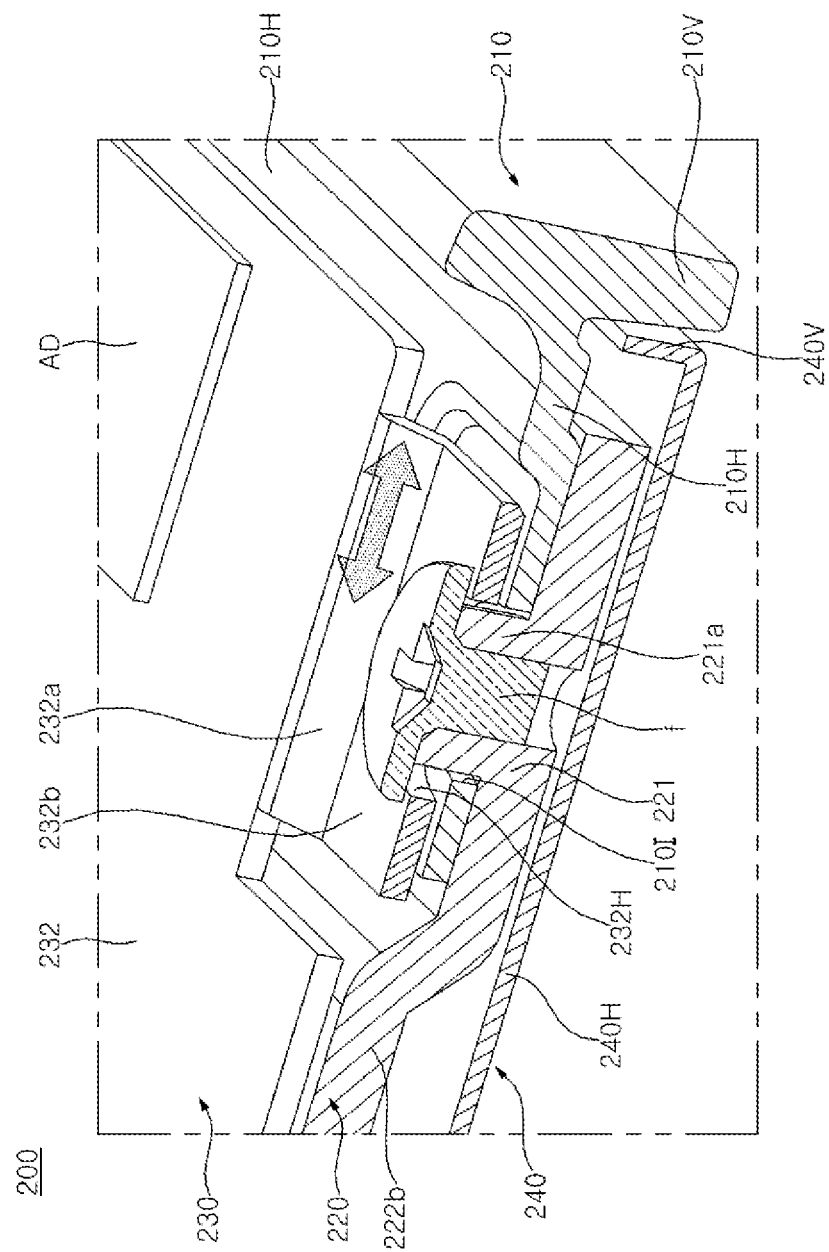

Referring to FIGS. 47 and 48 along with FIG. 39, the side bracket 220 may be coupled to the inner plate 230 in a manner that allows for slip therebetween. The side bracket 220 may include the flat plate part 221 and the rib parts 222 and 222b. The rib part 222b may be stepped downward from the flat plate part 221. A fastening part 221a may be formed on the flat plate part 221. The fastening part 221a may be referred to as a front fastening part 221a. For example, the fastening part 221a may be a PEM nut. The fastening part 221a may protrude from the flat plate part 221 toward the inner plate 230. The inner plate 230 may include coupling tabs 232a and 232b. The coupling tabs 232a and 232b may be formed on the side part 232 of the inner plate 230. The coupling tabs 232a and 232b may be formed as the side part 232 is pressed or cut and bent. The coupling tabs 232a and 232b may include an inclined part 232a and a horizontal part 232b. The inclined part 232a may be formed by a step downward from the side part 232 to the horizontal part 232b as the side part 232 is pressed or cut and bent. The horizontal part 232b may have a long hole 232H. For example, the long hole 232H may be formed by punching the horizontal part 232b. A length of the long hole 232H may be greater than an outer diameter of the fastening part 221a. A width of the long hole 232H may be slightly greater than or substantially equal to the outer diameter of the fastening part 221a. The main frame 210 may include the vertical part 210V and the horizontal part 210H.

The horizontal part 210H may be inserted between the side bracket 220 and the inner plate 230. A through-hole 2101 may be formed in the horizontal part 210H of the main frame 210. The fastening part 221a of the side bracket 220 may be inserted into the through-hole 2101. For example, the fastening member 221a of the side bracket 220 may be a PEM nut, and the PEM nut may be inserted into the through-hole 2101 of the horizontal part 210H of the main frame 210 and the long hole 232H of the coupling tabs 232a and 232b of the inner frame 230. By the fastening member f inserted into the PEM nut 221a, the coupling tabs 232a and 232b of the inner plate 230 may be connected to the fastening part 221a of the side bracket 220. For example, the fastening member f may be a screw.

The flat plate part 240H of the outer plate 240 may face the side bracket 220, and the side part 240V may be inserted between an edge of the side bracket 220 and the vertical part 210V of the main frame 210. A gap may be formed between the edge of the side bracket 220 and the vertical part 210V of the main frame 210. The side part 240V of the outer plate 240 may be disposed in the gap.

Accordingly, as the module cover 200 is curved, slip may occur between the inner plate 230, the side bracket 220, and the outer plate 240, thereby ensuring flexibility in movement of the module cover 200 while maintaining structural stability of the module cover 220.

Figure 49:
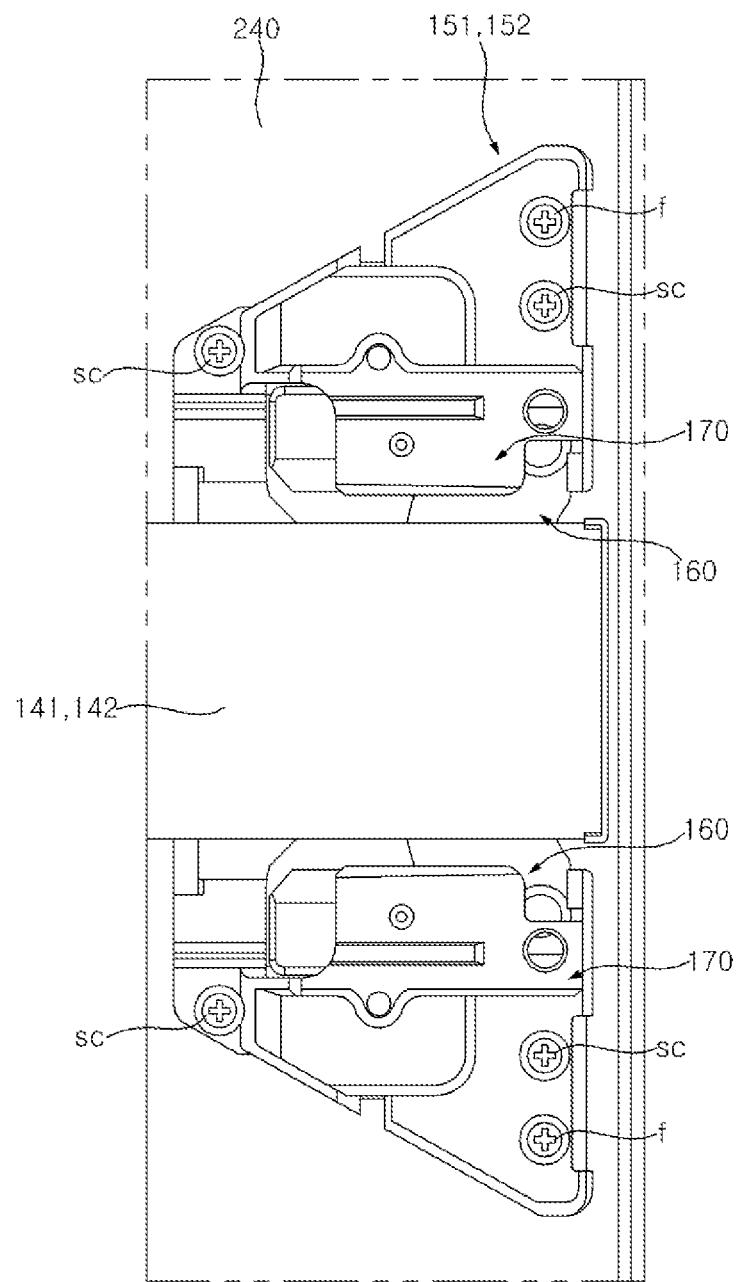
Figure 50:
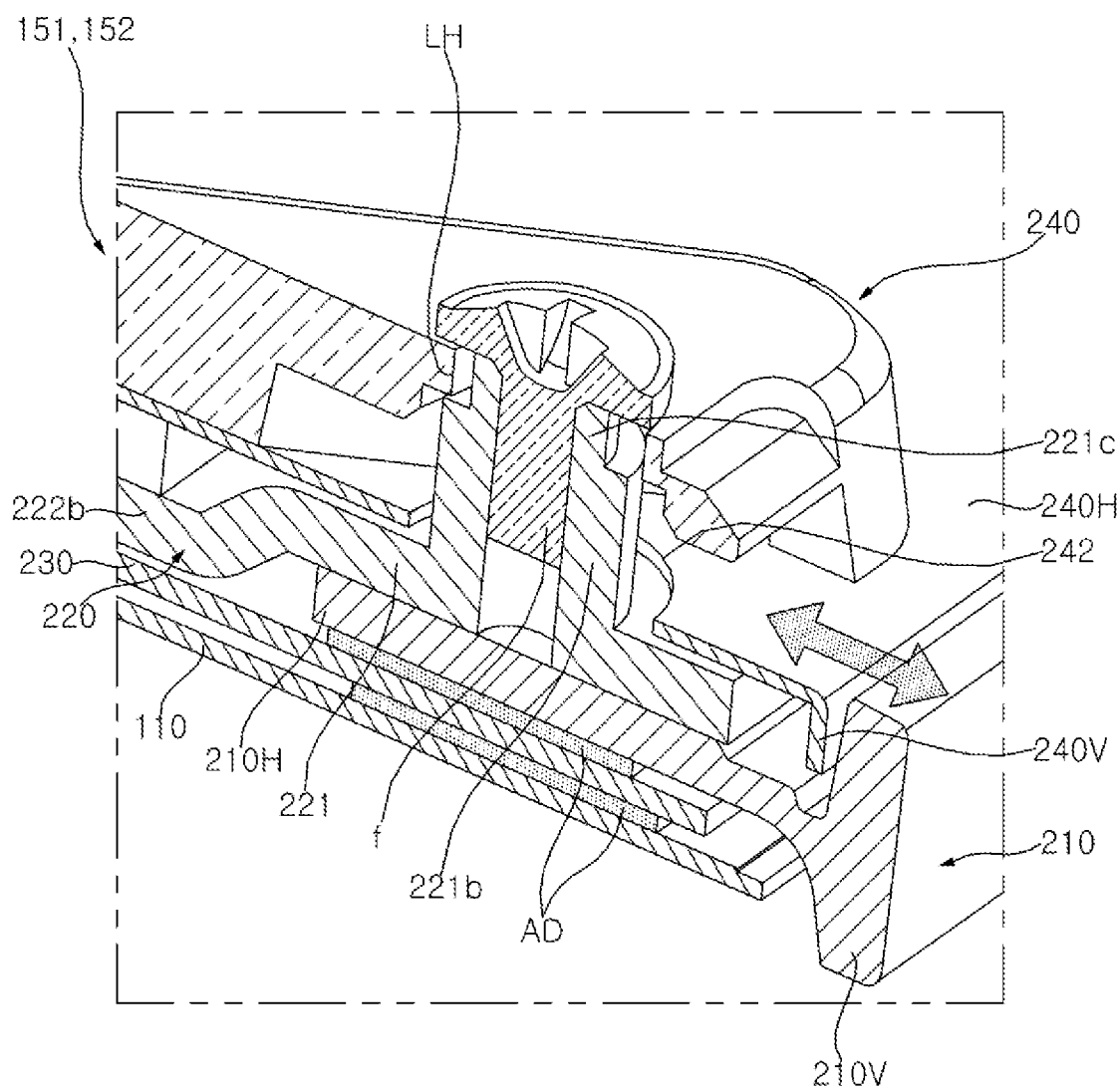

Referring to FIGS. 49 and 50, the outer plate 240 may be coupled to the side bracket 220 in a manner that allows for slip therebetween. The sliding mounts 151 and 152 may be fixed to the outer surface of the outer plate 240 by a fastening member SC. The sliding mounts 151 and 152 may have a slip hole LH. The slip hole LH may be formed by passing through the sliding mounts 151 and 152 in a thickness direction and may be an elongated long hole.

The outer plate 240 may have a slip hole 242 formed by passing through the outer plate 240. The slip hole 242 may be formed by passing through the outer plate 240 in a thickness direction. The slip hole 242 may be an elongated long hole. The slip hole 242 of the outer plate 240 may be aligned with the slip hole LH of the sliding mounts 151 and 152. For example, a size of the slip hole 242 of the outer plate 240 may be greater than a size of the slip hole LH of the sliding mounts 151 and 152.

A fastening part 221b may be formed in the flat plate part 221 of the side bracket 220. The fastening part 221b may be referred to as a rear fastening part 221b. The fastening part 221b may extend by protruding in a thickness direction of the side bracket 220. For example, the fastening part 221b may be a PEM nut. The fastening part 221b may be inserted into the slip hole 242 of the outer plate 240 and the slip hole LH of the sliding mounts 151 and 152. A length of the slip hole 242 of the outer plate 240 may be greater than an outer diameter of the fastening part 221b, and a width of the slip hole 242 of the outer plate 240 may be slightly greater than or substantially equal to the outer diameter of the fastening part 221b.

A fastening tip 221c may be formed at a distal end of the fastening part 221b. A diameter of the fastening tip 221c may be smaller than a diameter of the fastening part 221b. A length of the slip hole LH of the sliding mounts 151 and 152 may be greater than an outer diameter of the fastening tip 221c, and a width of the slip hole LH may be slightly greater than or substantially equal to the outer diameter of the fastening tip 221c. The fastening member f may be inserted into the fastening part 221b and the fastening tip 221c. For example, the fastening member f may be a screw. The sliding mounts 151 and 152 and the side bracket 220 may be coupled to each other by the fastening member f.

The main frame 210 may be fixed to the side bracket 220 to move together with the side bracket 220. The inner plate 230 may be coupled or fixed to the main frame 210 by the adhesive member AD, and the display panel 110 may be coupled or fixed to the inner plate 230 by the adhesive member AD.

Accordingly, as the module cover 200 is curved, slip may occur between the inner plate 230, the side bracket 220, and the outer plate 240, thereby ensuring flexibility in movement of the module cover 200 while maintaining structural stability of the module cover 220.

Figure 51:
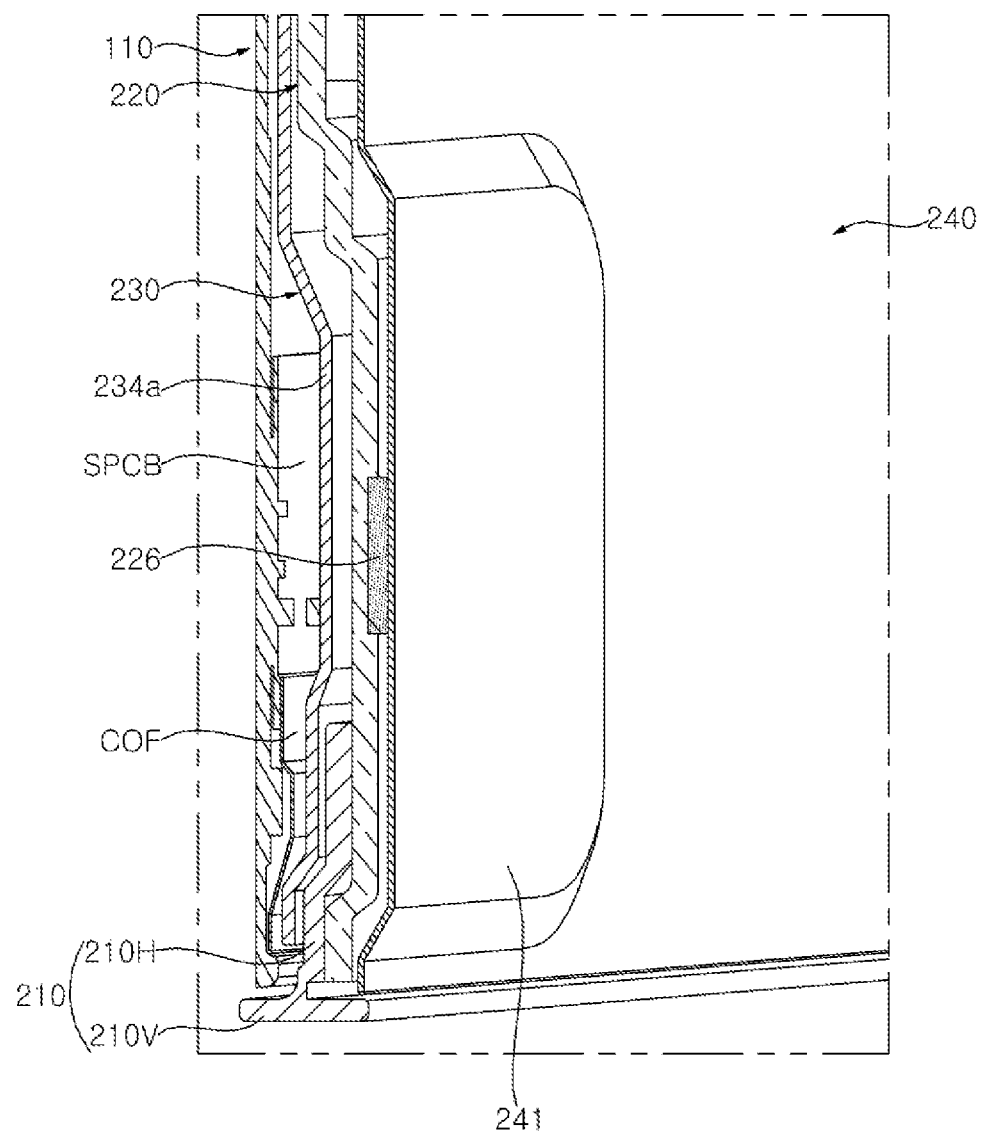

Referring to FIG. 51 along with FIG. 42, the display panel 110 may be coupled to the inner plate 230. The display panel 110 may include an S-PCB. The S-PCB may be connected to the display panel 110 via a flexible electric cable COF. For example, the flexible electric cable COF may be a chip on film (COF) or a flexible printed circuit board (F-PCB). The S-PCB may be disposed between the display panel 110 and the inner plate 230. The S-PCB may be disposed in the receiving part 234 or the second receiving part 234a. The receiving part 234 and/or the second receiving part 234a may be pressed from the inner plate 230 toward the outer plate 240, and in order to accommodate the receiving part 234 and/or the second receiving part 234a, the side bracket 220 may include the support part 223 which is pressed from the inner plate 230 toward the outer plate 240. In addition, the outer plate 240 may include a pocket 241 for receiving the support part 223 of the side bracket 220. The pocket 241 may be formed as the outer plate 240 is pressed.

The magnet 226 may be disposed between the pocket 241 of the outer plate 240 and the support part 223 of the side bracket 220. The pocket 241 of the outer plate 240 may be coupled to the support part 223 of the side bracket 220 by the magnet 226.

Accordingly, even when slip occurs between the side bracket 220 and the outer plate 240 while the module cover 200 is curved, the outer plate 240 may remain coupled to the side bracket 220, thereby ensuring flexibility in movement of the module cover 200 while maintaining structural stability of the module cover 200.

Figure 52:
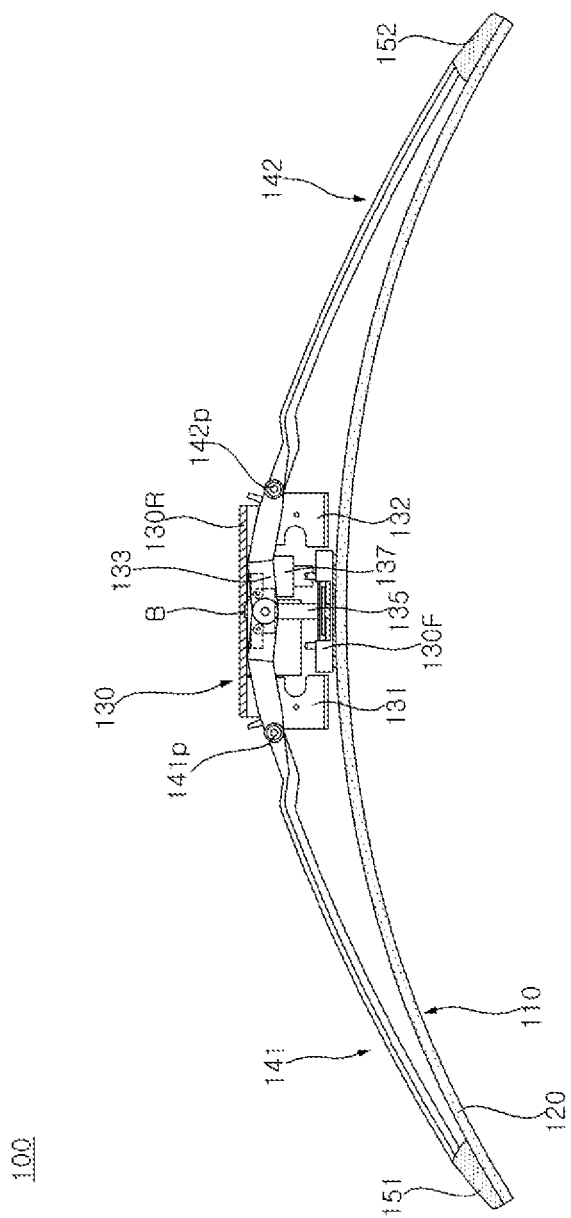

Referring to FIG. 52 along with FIG. 2, as the lead screw 135 is rotated by the torque provided by the motor 137, the flip frame 133 moves in a longitudinal direction of the lead screw 135, such that the wing 140 may pivot about the pivot shafts 141P and 142P.

When the wing 140 pivots, the slide bracket 160 moves on the sliding mounts 151 and 152 (see FIG. 26) and the guide cover 170 while pushing both sides of the display panel 110 and the plate 120 to bend the display panel 110.

When the lead screw 135 is reversely rotated, the flip frame 133 moves in a reverse direction of the lead screw 135, such that the wing 140 may pivot about the pivot shafts 141P and 141P in an opposite direction.

When the wing 140 pivots in the opposite direction, the slide bracket 160 moves on the sliding mounts 151 and 152 and the guide cover 170 while pulling both sides of the display panel 110 and the plate 120 to flatten the display panel 110.

Referring to FIGS. 1 to 52, a display device includes: a flexible display panel 110; flexible rear covers 120 and 200 disposed at a rear of the display panel 110 and coupled to the display panel 110; a driving module 130 disposed at a rear of the rear covers 120 and 200 and including a moving block 134 that makes a reciprocal movement; wing brackets 131 and 132 fixed to the rear of the rear covers 120 and 200 at a position adjacent to the driving module 130; and a wing 140 elongated with a first end fixed to the moving block 134 and a second end coupled to the rear covers 120 and 200, the wing 140 pivotally connected to the wing brackets 131 and 132 at a position between the first end and the second end, wherein the rear covers 120 and 200 include: a main frame 210 extending along sides of the display panel 110; an inner plate 230 facing a rear surface of the display panel 110 and coupled to the main frame 210; and a side bracket 220 disposed adjacent to one side of the display panel 110 and coupled to the main frame 210.

The display panel 110 may include: a first long side LS1; a second long side LS2 opposite the first long side LS1; a first short side SS1 connecting one end of the first long side LS1 with one end of the second long side LS2; and a second short side SS2 opposite the first short side SS1 and connecting another end of the first long side LS1 with another end of the second long side LS2, wherein the side bracket 220 may be elongated along the first short side SS1 and may be fixed to the first long side LS1, the second long side LS2, and the first short side SS1.

The inner plate 230 may be disposed between the display panel 110 and the side bracket 220 and may be coupled to the main frame 210.

The rear covers 120 and 200 may further include an outer plate 240 disposed opposite the inner plate 230 with respect to the main frame 210 and the side bracket 220, wherein the outer plate 240 may be coupled to the main frame 210.

The rear covers 120 and 200 may further include a rear plate 250 disposed between the outer plate 240 and the inner plate 230 and coupled to the outer plate 240 or the inner plate 230, wherein a size of the rear plate 250 may be smaller than a size of the outer plate 240.

The outer plate 240 may include: a first long side LS1; a second long side LS2 opposite the first long side LS1; a first short side SS1 connecting one end of the first long side LS1 with one end of the second long side LS2; and a second short side SS2 opposite the first short side SS1 and connecting another end of the first long side LS1 with another end of the second long side LS2, wherein the rear plate 250 may have a length parallel to the first short side SS1 and the second short side SS2 and a width W parallel to the first long side LS1 and the second long side LS2, wherein the width of the rear plate 250 may be smaller than a length of the first long side LS1 or the second long side LS2 of the outer plate 240.

The inner plate 230 may include: a plurality of holes H1 and H2 passing through the inner plate 230, wherein the plurality of holes H1 and H2 form a plurality of columns in a left-right direction of the inner plate 230 and a plurality of rows in an up-down direction of the inner plate 230.

The plurality of holes H1 and H2 may be symmetric to each other with respect to a center line CL of the inner plate 230 in the up-down direction of the inner plate 230.

A first distance D1 from the center line CL of the inner plate 230 to an outermost column on one side of the plurality of holes H1 and H2 may be smaller than a second distance D2 from a side of the inner plate 230 to an outermost column on another side of the plurality of holes H1 and H2.

The inner plate 230 may include: a flat plate part 231 facing a rear surface of the display panel 110; a side part covering the side bracket 220; and a receiving part 234 disposed on one side of the flat plate part 231 and the side part 232 and 233 and forming a step with respect to the flat plate part 231 as the flat plate part 231 is pressed, wherein the plurality of holes H1 and H2 may be formed in the flat plate part 231.

The plurality of holes H1, H2, H3, and H4 may include: the holes H1 and H2 having a circular shape and formed in the flat plate part 231; and the holes H3 and H4 having an elliptical shape and formed in the step between the flat plate part 231 and the receiving part 234.

The inner plate 230 may further include cable holes SH1 and SH2 formed in the receiving part 234, wherein the cable holes SH1 and SH2 may be provided in plurality and may be symmetric to each other with respect to the center line CL of the inner plate 230.

The display device may further include: sliding mounts 151 and 152 fixed to the rear covers 120 and 200; a slide bracket 160 coupled to the second end of the wing 140; and a guide cover into which the slide bracket 160 is inserted, guides movement of the slide bracket 160 in a longitudinal direction of the wing 140, and is fixed to the sliding mounts 151 and 152.

The slide bracket 160 may include: a front protrusion 163 protruding from the wing 140 toward the rear covers 120 and 200; and a rear protrusion 162 protruding from the rear covers 120 and 200 toward the wing 140, wherein the front protrusion 163 or the rear protrusion 162 may make point contact with the guide cover 170.

In addition, a display device includes: a flexible display panel 110; bottom covers 120 and 200 disposed at a rear of the display panel 110 and coupled to the display panel 110; a driving module 130 disposed at a rear of the bottom covers 120 and 200 and including a moving block 134 that makes a reciprocal movement; wing brackets 131 and 132 fixed to the rear of the bottom covers 120 and 200 at a position adjacent to the driving module 130; and wings 141 and 142 each elongated with a first end fixed to the moving block 134 and a second end coupled to the bottom covers 120 and 200, the wings 141 and 142 pivotally connected to the wing brackets 131 and 132 at a position between the first end and the second end, wherein the bottom covers 120 and 200 include: an inner plate 230 coupled to the display panel 110; a flexible main frame 210 coupled to sides of the inner plate 230; an outer plate 240 disposed opposite the display panel 110 with respect to the inner plate 230; and a side bracket 220 disposed between the inner plate 230 and the outer plate 240 and coupled to the main frame 210, wherein the main frame 210 is fixed to the side bracket 220, and the side bracket 220 is coupled to the inner plate 230 in a manner that allows slip to occur therebetween.

The main frame 210 may include: a horizontal part 210H disposed between the side bracket 220 and the inner plate 230 and having a through-hole 2101; and a vertical part 210V covering a side surface of the outer plate 240 and the inner plate 230 and connected to the horizontal part 210H, wherein the side bracket 220 may include a front fastening part 221a extending by protruding toward the display panel 110 and inserted into the through-hole 2101, and may be fixed to the main frame 210.

The inner plate 230 may include a long hole 232H formed in the inner plate 230 to correspond to the through hole 2101, wherein the front fastening part 221a of the side bracket 220 may be inserted into the long hole 232H of the inner plate 230.

The front fastening part 221a may be formed in a cylindrical shape, wherein a diameter of the through-hole 2101 may be substantially equal to a diameter of the front fastening part 221a, a length of the long hole 232H may be greater than the diameter of the front fastening part 221a, and a width of the long hole 232H may be substantially equal to the diameter of the front fastening part 221a.

The outer plate 240 may include a slip hole 242 disposed adjacent to the side bracket 220 and formed by passing through the outer plate 240, wherein the main frame 210 may include a horizontal part 210H disposed between the side bracket 220 and the inner plate 230, and a vertical part 210V covering a side surface of the outer plate 240 and the inner plate 230 and connected to the horizontal part 210H, wherein the side bracket 220 may include a rear fastening part 221b extending by protruding toward the outer plate 240 and inserted into the slip hole 242.

The display device may further include sliding mounts 151 and 152 to which the second end of the wings 141 and 142 are slidably coupled, wherein the rear fastening part 221b of the side bracket 220 may pass through the slip hole 242 to be fixed to the sliding mounts 151 and 152.

The rear fastening part 221b may be formed in a cylindrical shape, wherein a length of the slip hole 242 may be greater than a diameter of the rear fastening part 221b, and a width of the slip hole 242 may be substantially equal to a width of the rear fastening part 221b.

The sliding mounts 151 and 152 may be fixed to a rear surface of the outer plate 240.

The display device may further include magnets 225 and 226 disposed between the side bracket 220 and the outer plate 240 and fixed to the side bracket 220, wherein the outer plate 240 may include metal.

The display panel 110 may be coupled to the inner plate 230 by an adhesive member AD, wherein the inner plate 230 may be coupled to the side bracket 220 by the adhesive member AD.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible display panel including a printed circuit board (PCB);
   a flexible rear cover disposed at a rear of the display panel and coupled to the display panel;
   a driving module disposed at a rear of the rear cover and including a moving block with a reciprocal movement;
   a wing bracket fixed to the rear of the rear cover adjacent to the driving module; and
   a wing elongated with a first end fixed to the moving block and a second end coupled to the rear cover, the wing pivotally connected to the wing bracket between the first end and the second end,
   wherein the flexible rear cover comprises:
   a main frame extending along sides of the display panel;
   an inner plate facing a rear surface of the display panel and coupled to the main frame; and
   a side bracket disposed adjacent to one side of the display panel and coupled to the main frame;
   wherein the inner plate comprises:
      a flat plate part facing the rear surface of the display panel;
      a receiving part disposed on one side of the flat plate part and forming a step with respect to the flat plate part as the flat plate part is pressed, wherein the PCB of the flexible display panel is disposed in the receiving part; and
      a plurality of holes passing through the inner plate and forming a plurality of columns and rows, wherein the plurality of holes comprises:
         holes formed in the flat plate part; and
         holes formed in the step between the flat plate part and the receiving part.

2. The display device of claim 1, wherein the display panel comprises:
   a first long side;
   a second long side opposite the first long side;
   a first short side connecting one end of the first long side with one end of the second long side; and
   a second short side opposite the first short side and connecting the other end of the first long side with the other end of the second long side,
   wherein the side bracket is elongated along the first short side and is fixed to the first long side, the second long side, and the first short side.

3. The display device of claim 2, wherein the inner plate is disposed between the display panel and the side bracket and is coupled to the main frame.

4. The display device of claim 1, wherein the flexible rear cover further comprises an outer plate disposed opposite the inner plate with respect to the main frame and the side bracket,
   wherein the outer plate is coupled to at least one of the main frame or the side bracket.

5. The display device of claim 4, wherein the flexible rear cover further comprises a rear plate disposed between the outer plate and the inner plate and coupled to the outer plate or the inner plate,
   wherein a size of the rear plate is smaller than a size of the outer plate.

6. The display device of claim 5, wherein the outer plate comprises:
   a first long side;
   a second long side opposite the first long side;
   a first short side connecting one end of the first long side with one end of the second long side; and
   a second short side opposite the first short side and connecting the other end of the first long side with the other end of the second long side,
   wherein the rear plate has a length parallel to the first short side and the second short side and a width parallel to the first long side and the second long side,
   wherein the width of the rear plate is smaller than a length of the first long side or the second long side of the outer plate.

7. The display device of claim 1, wherein the plurality of holes is symmetric to each other with respect to a center line of the inner plate in the up-down direction of the inner plate.

8. The display device of claim 7, wherein a first distance from the center line of the inner plate to an outermost column on one side of the plurality of holes is smaller than a second distance from a side of the inner plate to an outermost column on another side of the plurality of holes.

9. The display device of claim 1, wherein the inner plate further comprises:
   a flat plate part facing a rear surface of the display panel;
   a side part covering the side bracket; and,
   wherein the receiving part is disposed on one side of the flat plate part and the side part and forming a step with respect to the flat plate part as the flat plate part is pressed,
   wherein the plurality of holes are formed in the flat plate part.

10. The display device of claim 1, wherein the plurality of holes comprises: holes having a circular shape and formed in the flat plate part; and holes having an elliptical shape and formed in the step between the flat plate part and the receiving part.

11. The display device of claim 1, wherein the inner plate further comprises cable holes formed in the receiving part, wherein the cable holes are provided in plurality and are symmetric to each other with respect to a center line of the inner plate.

12. The display device of claim 1, further comprising:
   a sliding mount fixed to the rear cover;
   a slide bracket coupled to the second end of the wing; and
   a guide cover into which the slide bracket is inserted, the guide cover guiding movement of the slide bracket in a longitudinal direction of the wing, and the guide cover fixed to the sliding mount.

13. The display device of claim 12, wherein the slide bracket comprises:
   a front protrusion protruding from the wing toward the rear cover; and
   a rear protrusion protruding from the rear cover toward the wing,
   wherein the front protrusion or the rear protrusion is in point contact with the guide cover.

* * * * *